United States Patent [19]

Saito et al.

[11] Patent Number: 5,401,330
[45] Date of Patent: Mar. 28, 1995

[54] PHOTOVOLTAIC ELEMENT

[75] Inventors: Keishi Saito, Soraku; Toshimitsu Kariya; Koichi Matsuda, both of Nara; Naoto Okada, Tsuzuki; Yutaka Nishio, Tsuzuki; Tomonori Nishimoto, Tsuzuki; Takaharu Kondo, Tsuzuki, all of Japan

[73] Assignee: Canon Kabushiki Kaisha, Tokyo, Japan

[21] Appl. No.: 275,274

[22] Filed: Jul. 15, 1994

Related U.S. Application Data

[63] Continuation of Ser. No. 109,441, Aug. 20, 1993, abandoned.

[30] Foreign Application Priority Data

Aug. 24, 1992 [JP] Japan .................. 4-223805

[51] Int. Cl.⁶ ............... H01L 31/052; H01L 31/075
[52] U.S. Cl. ..................... 136/259; 136/249; 136/258; 257/436; 257/458
[58] Field of Search ............ 136/249 TJ, 258 AM, 136/259; 257/436, 458

[56] References Cited

FOREIGN PATENT DOCUMENTS

| | | | |
|---|---|---|---|
| 61-201479 | 9/1986 | Japan | 136/259 |
| 2-105582 | 4/1990 | Japan | 136/259 |
| 3-99476 | 4/1991 | Japan | 136/259 |

OTHER PUBLICATIONS

A. Madan et al. "The Physics and Applications of Amorphous Semiconductors", pp. 245–248, published by Academic Press, Inc., 1988.

Y. Inoue et al., "Optical Confinement in a SiGe Solar Cells on Stainless Steel Substrates", 51st Academic Lecture Meeting, Japan Soc. of Appl. Phys., 1990.

*Solar Energy Materials*, vol. 20, pp. 99–110, 1990 by Hirasaka et al., "Design of Textured of Al Electrode for a Hydrogenated Amorphous Silicon SOlar Cell."

*Primary Examiner*—Aaron Weisstuch
*Attorney, Agent, or Firm*—Fitzpatrick, Cella, Harper & Scinto

[57] ABSTRACT

The present invention aims to provide a photovoltaic element which can maintain high initial characteristics over long term usage even under severe environments, and can be mass-produced with high yield.

A photovoltaic element in which a light reflecting layer, a light reflection multiplying layer, an n-type layer, an i-type layer, and a p-type layer composed of a non-single crystal semiconductor material comprising at least silicon, and a transparent electrode are successively formed on a conductive substrate, characterized in that said light reflecting layer comprises silver or copper atoms as the main constituent and further contains at least one of oxygen, nitrogen, and carbon.

Also, in another embodiment, this photovoltaic element is characterized in that said light reflecting layer comprises silver as the main constituent, and further contains lead, lead and gold, or lead, gold, and a first transition group metal in an amount of 2 to 100 ppm.

48 Claims, 14 Drawing Sheets

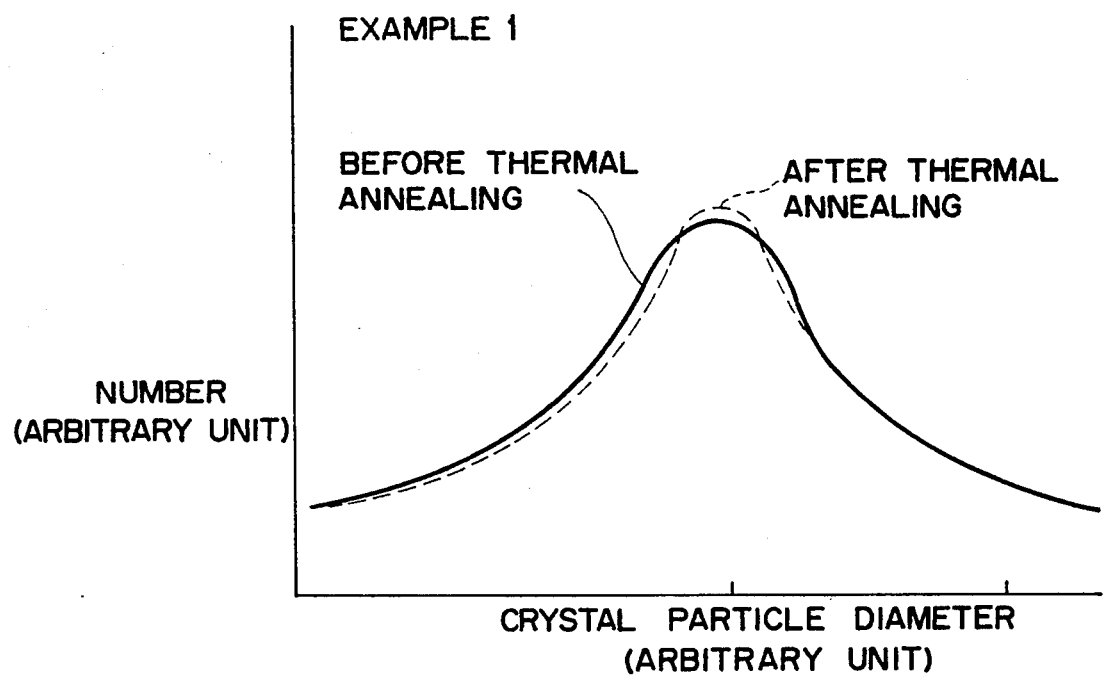
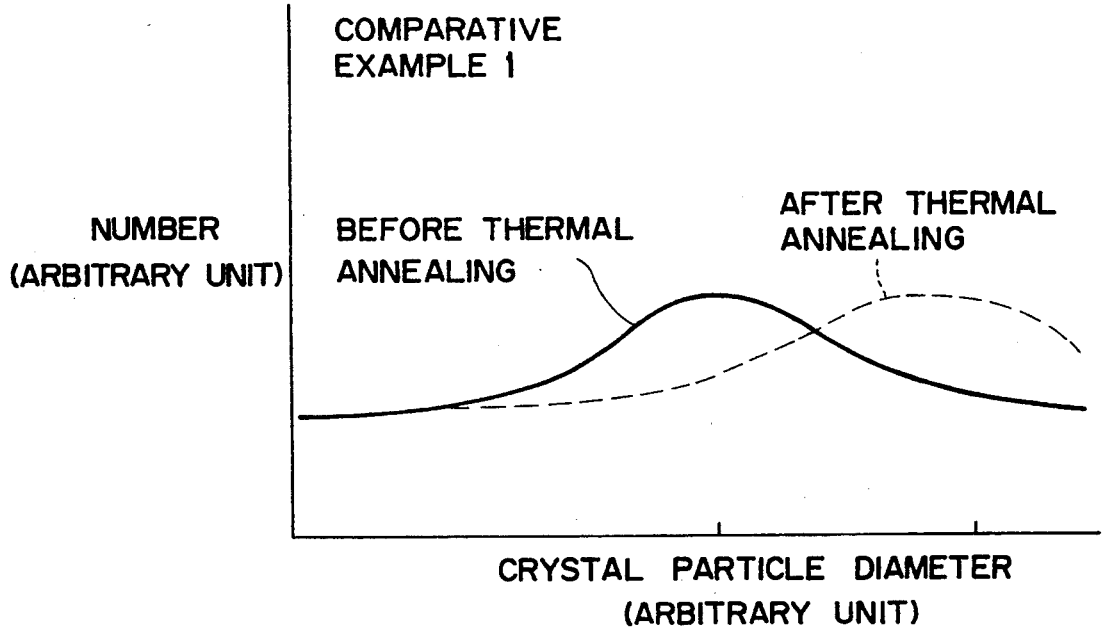

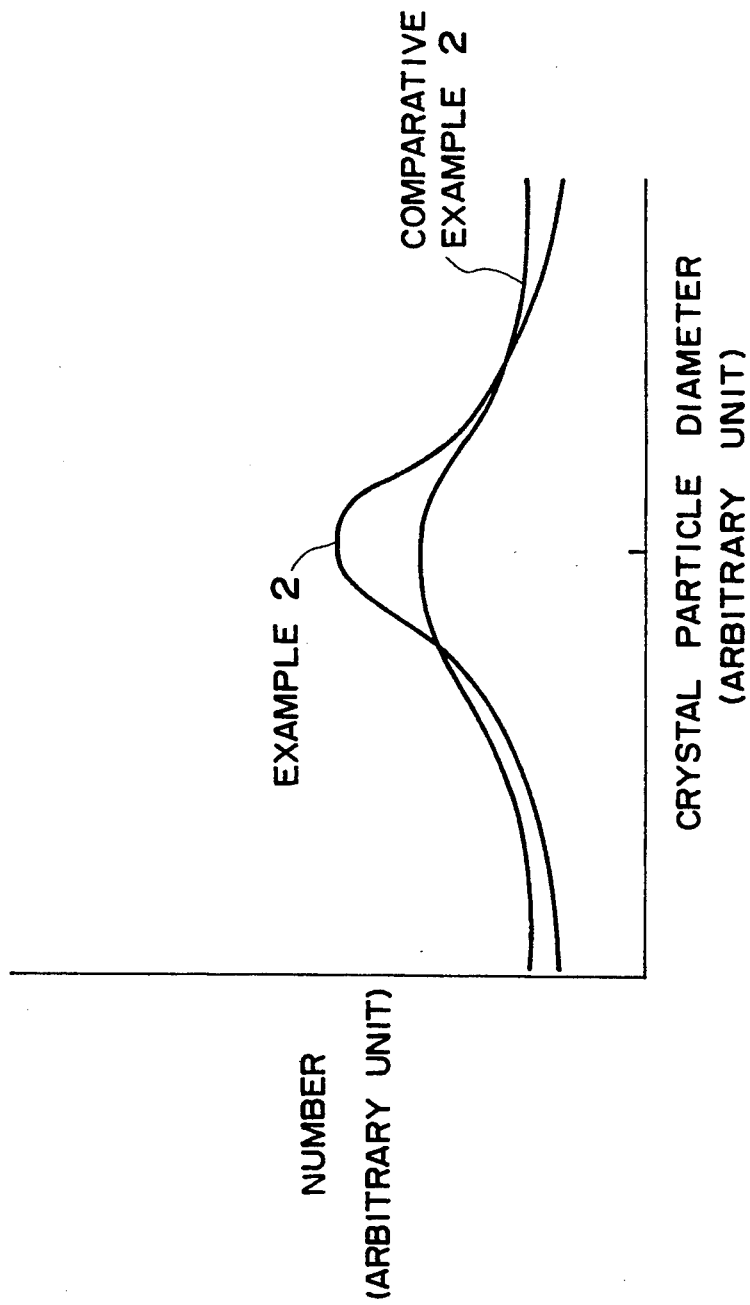

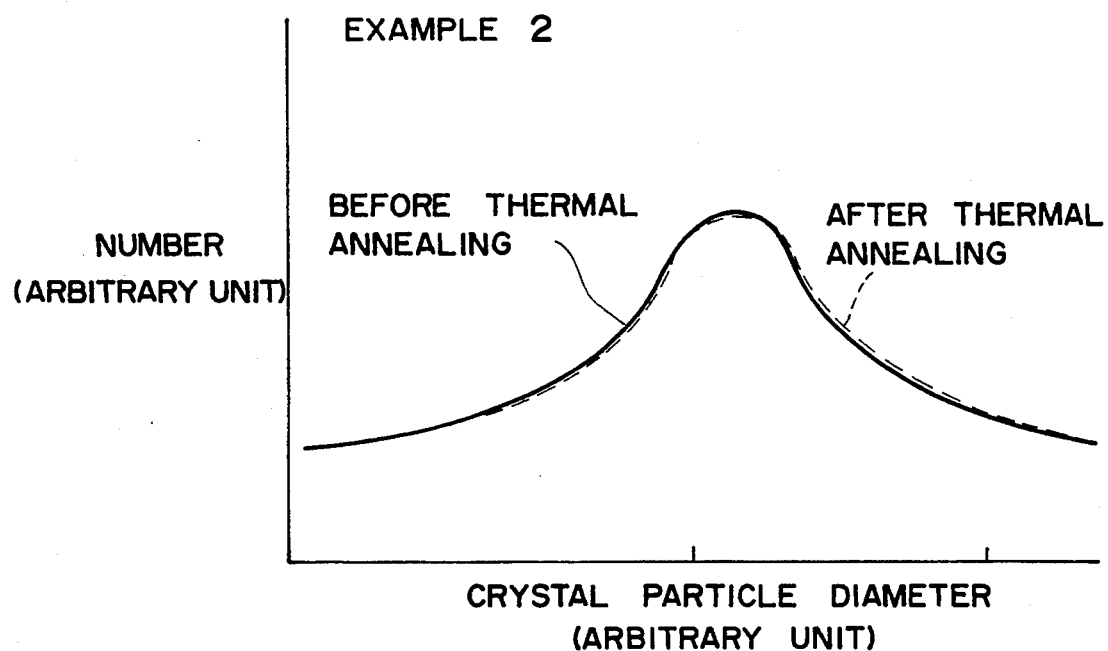
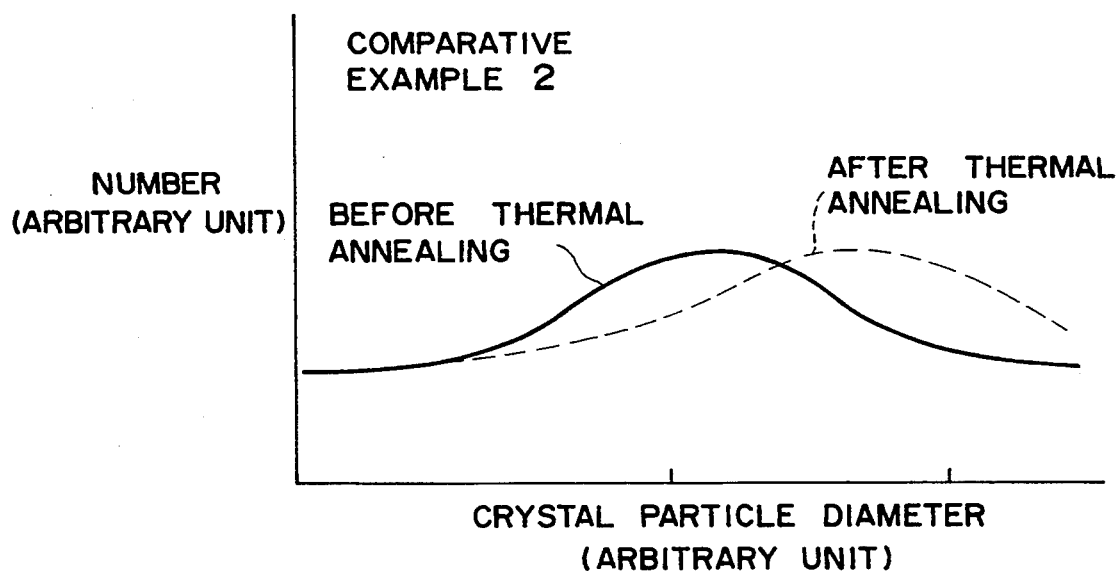

PHOTOVOLTAIC ELEMENT

This application is a continuation of application Ser. No. 08/109,441 filed Aug. 20, 1993, now abandoned.

BACKGROUND OF THE INVENTION

1. Field of the Invention

The present invention relates to a photovoltaic element, and more particularly to a photovoltaic element having a light reflecting layer and made of a non-single crystal semiconductor material containing silicon atoms, for example, amorphous silicon hydride, amorphous silicon germanium hydride, amorphous silicon carbide hydride, crystalline silicon, or polycrystalline silicon. The photovoltaic element of the present invention is suitably applied to a solar cell, a sensor, or an image pick-up device.

2. Related Background Art

Numerous studies on photovoltaic elements have been made from the viewpoints of the material and surface properties of the light reflecting layer.

For example, from the solar cell viewpoint, the reflectivity between amorphous silicon semiconductor hydride (a-Si:H) and metal (Ag, Al, Cu, Cr, Fe, Mo, Ni) has been investigated (A. Madan, M. P. Shaw, The Physics and Applications of Amorphous Semiconductors, Academic Press, 1988). Also a light reflecting layer composed of silver has been examined regarding the relation between reflectivity and texture structure (for example, see "29p-MF-2 Light Confinement Effects On a-SiGe Solar Cell On Stainless Substrate" the 51st Academic Lecture Meeting For The Japan Society of Applied Physics in Autumn 1990, proceedings Vol. 2; "a-SiC/a-Si/a-SiGe Multi-Bandgap Stacked Solar Cells With Bandgap Profiling", Technical Digest of the International PVSEC-5, Kyoto, Japan, 1990, P-IA-15).

Also, textured substrates composed of e.g., Al, SUS-/Al/polymer and Ti/Ag/Ti/Al have been examined (M. Hirasaka et. al., "Design Of Textured Al Electrode For A Hydrogenated Amorphous Silicon Solar Cell", in Solar Energy Materials, Vol. 20 (1990) pp. 99–110, North-Holland).

The above-cited conventional photovoltaic elements have excellent photoelectric conversion characteristics, but little examination from the viewpoints of service environment and durability has been made up to now. Hence, from the practical viewpoint, photovoltaic elements having excellent durability and superior characteristics are strongly desired.

SUMMARY OF THE INVENTION

In view of the above situation, an object of the present invention is to provide a photovoltaic element which is capable of maintaining its high initial characteristics for the long term even under severe environments.

Also, it is another object of the present invention to provide a photovoltaic element which can be mass-produced with high yield.

The present inventors have achieved this invention as a result of careful research to resolve the conventional problems and accomplish the objects of the invention.

The first feature of the present invention resides in a photovoltaic element comprising a light reflecting layer, a light reflection multiplying layer, a first conductivity type layer composed of non-single crystal semiconductor material containing at least silicon atoms, an i-type layer, a second conductivity type layer opposite to the first conductivity type, and a transparent electrode, characterized in that said light reflecting layer contains silver as the main constituent, and contains at least one of oxygen, nitrogen, and carbon.

The second feature of the present invention resides in a photovoltaic element comprising a light reflecting layer, a light reflection multiplying layer, a first conductivity type layer composed of non-single crystal semiconductor material containing at least silicon, an i-type layer, a second conductivity type layer opposite to the first conductivity type, and a transparent electrode, characterized in that said light reflecting layer contains copper as the main constituent, and contains at least one of oxygen, nitrogen, and carbon.

In the first and second features, the total amount of oxygen, nitrogen, and carbon is preferably from 0.1 to 1000 ppm.

The third feature of the present invention resides in a photovoltaic element comprising a light reflecting layer, a light reflection multiplying layer, a first conductivity type layer composed of non-single crystal semiconductor material containing at least silicon, an i-type layer, a second conductivity type layer opposite to the first conductivity type, and a transparent electrode, characterized in that said light reflecting layer contains silver as the main constituent, and contains lead, lead and gold, or lead, gold, and a first transition group metal in an amount of 2 to 100 ppm.

BRIEF DESCRIPTION OF THE DRAWINGS

FIGS. 7A and 7B are graphs showing variations in the silver crystal particle diameter distribution before and after annealing, for the light reflecting layer fabricated in Experiment Examples 1-1 to 1-5 and Comparative Experiment Example 1, respectively.

FIG. 10 is a graph showing the silver crystal particle diameter distribution for the light reflecting layer fabricated in Experiment Example 2 and Comparative Experiment Example 2.

FIGS. 11A and 11B are graphs showing variations in the silver crystal particle diameter distribution before and after annealing, for the light reflecting layer fabricated in Experiment Example 2 and Comparative Experiment Example 2, respectively.

DETAILED DESCRIPTION OF THE PREFERRED EMBODIMENTS

Figure 1:
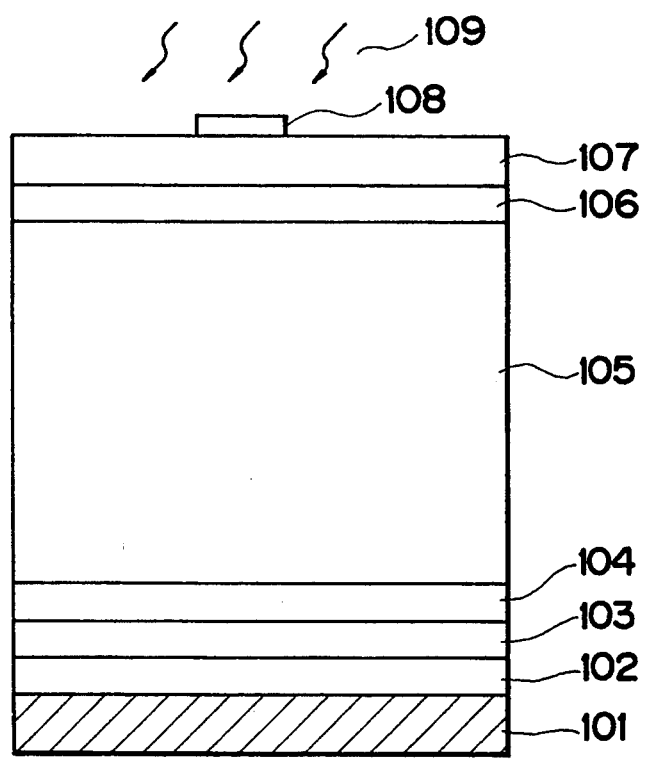
FIG. 1 is a typical view showing a first embodiment of a photovoltaic element.

A light reflecting layer containing silver as the main constituent is well known as having a high reflectance with respect to visible light. The light reflecting layer in the photovoltaic element of the invention contains silver atoms as the main constituent, and also contains at least one of oxygen, nitrogen, and carbon, whereby the photovoltaic characteristics are greatly improved.

The detailed mechanism for the above effect of a photovoltaic element having a light reflecting layer containing silver as the main constituent and also containing oxygen, nitrogen, or carbon has not been yet clarified, but it may be due to (1) decreased structural distortion in depositing the light reflecting layer as the strain is localized around oxygen atoms, nitrogen atoms, or carbon atoms due to the high ionicity of the oxygen, nitrogen, or carbon contained in the film and shorter bond distance between oxygen, nitrogen, or carbon atoms and silver atoms than that between silver atoms, (2) reduced diffusion of silver atoms caused by the crystal grain boundaries of silver because oxygen atoms, nitrogen atoms, or carbon atoms tend to accumulate around grain boundaries of silver, (3) decreased dispersion in the crystal particle diameters of silver, and (4) decreased abnormal growth of silver caused by the crystal grain boundaries of silver.

A light reflecting layer containing copper as the main constituent is also well known as having a high reflectance with respect to visible light, particularly in the longer wavelength range. The light reflecting layer for the photovoltaic element of the invention contains copper as the main constituent and contains at least one of oxygen, nitrogen, and carbon, whereby the photovoltaic element characteristics are greatly improved.

The detailed mechanism for the above effect of a photovoltaic element having a light reflecting layer containing copper as the main constituent and also containing oxygen, nitrogen, or carbon has not yet been clarified, but it is believed that, in forming a layer having copper as the main constituent, the lattice spacing in the initial process of forming the film is greater due to island formation than that of the bulk, so that tensile stress may arise. However, it is believed that if impurities such as oxygen or nitrogen atoms are included, compressive stress may arise in the film so that the residual stress in the light reflecting layer is relieved. Also, it is believed that if carbon atoms are included, the strain is localized around the carbon atoms because the minimum interatomic distance of copper atoms (2.55 Å) is greater than that of carbon atoms (1.54 Å), so that the structural distortion in depositing the light reflecting layer decreases. Further, it is believed that abnormal growth of copper atoms caused by the crystal grain boundaries of copper can be suppressed, because carbon atoms, oxygen atoms, and nitrogen atoms tend to accumulate on the crystal grain boundaries of copper.

The light reflecting layer for the photovoltaic element of the invention contains silver as the main constituent and also contains lead, lead and gold, or lead, gold, and a first transition group metal in an amount of 2 to 100 ppm, whereby the photovoltaic element characteristic is greatly improved.

The detailed mechanism for the effect of a photovoltaic element having a light reflecting layer containing silver as the main constituent and containing lead, lead and gold, or lead, gold, and a first transition group metal has not yet been clarified, but it is believed that, if the light reflecting layer is composed of a layer containing silver as the main constituent and also containing lead, lead and gold, or lead, gold and a first transition group metal, compressive stress may arise in the film by virtue of the lead, gold, or first transition group metal atoms contained therein, offsetting the tensile stress inherent in the silver film, so that the structural distortion in the light reflecting layer decreases, and lead, gold, and first transition group metal atoms tend to accumulate around the crystal grain boundaries of silver, resulting in reduced diffusion of silver atoms caused by the crystal grain boundaries of silver, decreased dispersion of silver crystal particle diameters, and decreased abnormal growth of silver caused by the silver crystal grain boundaries. Further, it is believed that light absorption changes may occur due to ligand field absorption of the first transition group metal atoms, so that the initial characteristic can be improved due to changes in the light reflection dispersion. Among the first transition group metal atoms, iron, nickel, and chromium atoms are particularly preferable.

As a result, the adhesion between the conductive substrate and the light reflecting layer and between the light reflecting layer and the reflection multiplying layer are improved, with the environmental resistance and durability of the photovoltaic element enhanced.

Further, the metal in the light reflecting layer is prevented from diffusing through the light reflection multiplying layer and the non-single crystal semiconductor layer, so that the durability of the photovoltaic element is improved. In addition, crystal growth caused by use of the photovoltaic element under environments subjected to substrate temperature changes or repetitive high temperatures and humidities can be suppressed, by depositing the light reflection multiplying layer and the non-single crystal semiconductor layer after the deposition of the light reflecting layer, so that the characteristics of the photovoltaic element are prevented from changing with the elapse of time. Further, the photovoltaic elements can be mass-produced with improved yield due to the above-described reasons.

The present invention will be now described with reference to the drawings.

Figure 2:
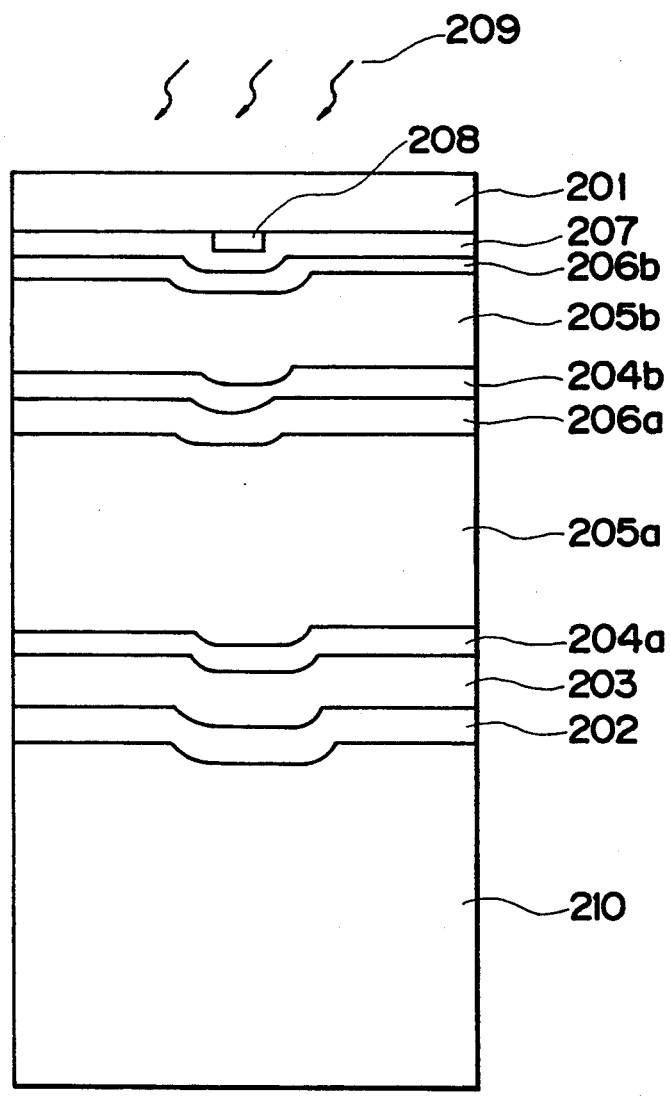
FIG. 2 is a typical view showing another embodiment of a photovoltaic element.
Figure 3:
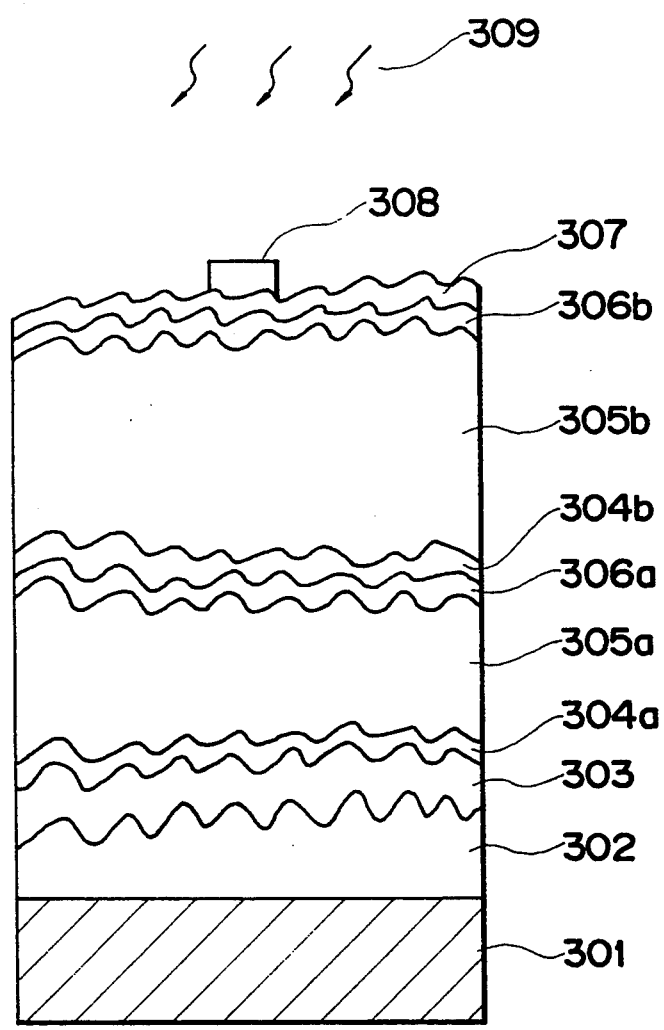
FIG. 3 is a typical view showing yet another embodiment of a photovoltaic element.

FIGS. 1, 2, and 3 are conceptual views showing the typical construction of photovoltaic elements of the present invention.

The photovoltaic element of FIG. 1 is constituted of an opaque conductive substrate 101, a light reflecting layer 102, a light reflection multiplying layer 103, a n-type (or p-type) non-single crystal silicon type semiconductor layer 104, an i-type (substantially intrinsic) non-single crystal silicon type semiconductor layer 105, a p-type (or n-type) non-single crystal silicon type semiconductor layer 106, a transparent electrode 107, and a collector electrode 108. The light reflecting layer 102 contains silver or copper as the main constituent, and also contains at least one of oxygen, nitrogen, and carbon, or contains silver as the main constituent and further contains lead, lead and gold, or lead, gold, and a first transition group metal in an amount of 2 to 100 ppm. Light 109 is incident on the photovoltaic element from the transparent electrode 107 side.

The photovoltaic element of FIG. 2 is an example of a tandem structure constituted of a transparent superstrate 201, a collector electrode 208, a transparent electrode 207, a p-type (or n-type) non-single crystal silicon type semiconductor layer 206b, an i-type (substantially intrinsic) non-single crystal silicon type semiconductor layer 205b, an n-type (or p-type) non-single crystal silicon type semiconductor layer 204b, a p-type (or n-type) non-single crystal silicon type semiconductor layer 206a, an i-type (substantially intrinsic) non-single crystal silicon type semiconductor layer 205a, an n-type (or p-type) non-single crystal silicon type semiconductor 204a, a light reflection multiplying layer 203, a light reflection layer 202, and a conduction layer (or/and protection layer) 210. The light reflecting layer 202 contains silver or copper as the main constituent and contains at least one of oxygen, nitrogen, and carbon, or contains silver as the main constituent and contains lead, lead and gold, or lead, gold, and a first transition group metal in an amount of 2 to 100 ppm.

A triple cell photovoltaic element having three layers of the pin unit cell laminated together (not shown) is also effective with the present invention.

The photovoltaic element of FIG. 3 is an example of a tandem cell having a textured (concave and convex) structure, which is constituted of an opaque conductive substrate 301, a light reflecting layer 302 of textured structure, a light reflection multiplying layer 303, an n-type (or p-type) non-single crystal silicon type semiconductor layer 304a, an i-type (substantially intrinsic) non-single crystal silicon type semiconductor layer 305a, a p-type (or n-type) non-single crystal silicon type semiconductor layer 306a, an n-type (or p-type) non-single crystal silicon type semiconductor layer 304b, an i-type (substantially intrinsic) non-single crystal silicon type semiconductor layer 305b, a p-type (or n-type) non-single crystal silicon type semiconductor layer 306b, a transparent electrode 307, and a collector electrode 308. The light reflecting layer 302 of textured structure contains silver or copper as the main constituent, and also contains at least one of oxygen, nitrogen, and carbon, or contains silver as the main constituent and also contains lead, lead and gold, or lead, gold and a first transition group metal in an amount of 2 to 100 ppm. Light 309 is incident on the photovoltaic element from the transparent electrode 307 side.

In the example of FIG. 3, the textured structure is formed in the light reflecting layer, but may be also formed in the substrate 301 or the light reflection multiplying layer 303.

The components of the photovoltaic elements will be now described in detail.

Light Reflecting Layer

The light reflecting layer in the photovoltaic elements of the present invention is a layer influencing the environmental resistance or durability of the photovoltaic element.

The light reflecting layer suitable for the photovoltaic element of the present invention contains silver or copper as the main constituent and also contains at least one of oxygen, nitrogen and carbon, the preferable content of oxygen, nitrogen, or carbon being in a range from 0.1 to 1000 ppm. Within the range of 0.1 to 1000 ppm, the photoelectric conversion efficiency, durability, and environmental resistance of the element can be improved.

Another light reflecting layer suitable for the photovoltaic element of the present invention contains copper as the main constituent and also contains lead, lead and gold, or lead, gold, and a first transition group metal in an amount of 2 to 100 ppm.

The methods suitable for depositing the light reflecting layer of the photovoltaic elements of the present invention include a sputtering method and a vapor deposition method.

Figure 4:
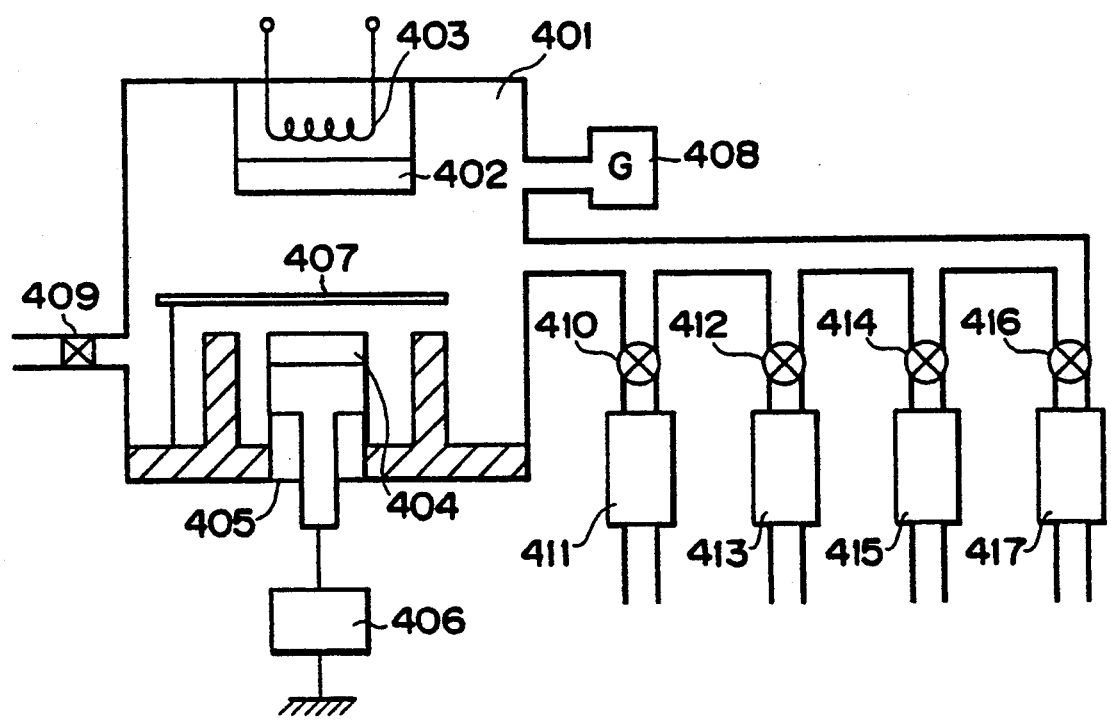
FIG. 4 is a schematic view of a DC magnetron sputtering apparatus for fabricating a transparent electrode constituting the photovoltaic element of the invention.

FIG. 4 is a schematic view showing a DC magnetron sputtering apparatus suitable for the deposition of the light reflecting layer of the photovoltaic elements of the present invention. The apparatus is comprised of a deposition chamber 401, a substrate 402, a heater 403, a target 404, an insulating support member 405, a DC power source 406, a shutter 407, a vacuum gauge 408, a conductance valve 409, gas inlet valves 410, 412, 414, 416, and mass flow controllers 411, 413, 415, 417.

When the light reflecting layer is deposited by the DC magnetron sputtering apparatus, a target of silver or copper with the addition of a predetermined amount of oxygen, nitrogen, carbon, lead, gold and first transition group metal is prepared and mounted on the target 404 within the deposition-chamber 401, and a substrate on which the light reflecting layer is to be deposited is mounted on the substrate 402.

The preferred amount of oxygen, nitrogen, or carbon contained in a silver target for use with the formation of a light reflecting layer of silver containing oxygen, carbon, or nitrogen is from 0.1 to 1500 ppm. Also, the preferred amount of oxygen, nitrogen, or carbon contained in a copper target for use with the formation of a light reflecting layer of copper containing oxygen, carbon, or nitrogen is from 0.1 to 1500 ppm. Further, the preferred total amount of lead, gold, or first transition group metal contained in a silver target for use with the formation of a light reflecting layer of silver containing lead, lead and gold, or lead, gold, and first transition group metal is in the range from 2 to 200 ppm.

The deposition chamber 401 is exhausted below $5 \times 10^{-5}$ Torr via the conductance valve 409 by an exhaust system, not shown, comprised of an oil diffusion pump and a rotary pump. Also, the temperature of the substrate 402 is preferably set in the range from room temperature to 400° C. by the heater 403.

When heating the substrate, it is preferred that the deposition chamber 401 is purged by flowing a gas less reactive with the silver target, such as hydrogen, helium, neon, argon, or krypton, into the deposition chamber 401. Examples of inert gas for sputtering may include helium, neon, argon, and krypton. The pressure in the deposition chamber 401 is preferably in the range from $5 \times 10^{-4}$ to $10^{-2}$ Torr, and the amount of gas introduced is preferably in the range from 1 to 200 sccm.

The DC voltage, when using the target, is preferably in the range from 10 to 500 V, and the deposition rate of the light reflecting layer is preferably in the range from 0.1 to 100 Å/sec.

Likewise, instead of the DC magnetron sputtering method, an RF sputtering method can be used. In the RF sputtering method, an RF power source, instead of the DC power source, is used with the previously described conditions, the frequency is preferably near 13.56 MHz, and the RF power input to the deposition chamber 401 is preferably in the range from 0.001 to 10 W/cm².

On the other hand, the light reflecting layer containing oxygen, nitrogen, or carbon may be formed by a reactive sputtering method. In this case, the silver or copper target containing oxygen, nitrogen, or carbon is replaced with a silver or copper target containing less or no oxygen, nitrogen, or carbon, and further, instead of the inert gas, an inert gas with added oxygen containing gas, nitrogen containing gas, or carbon containing gas is used as a sputtering gas to deposit the light reflecting layer. In the reactive sputtering method, the amount of oxygen, nitrogen, or carbon to be added to the inert gas is preferably in the range from 1 to 2000 ppm.

Figure 8:
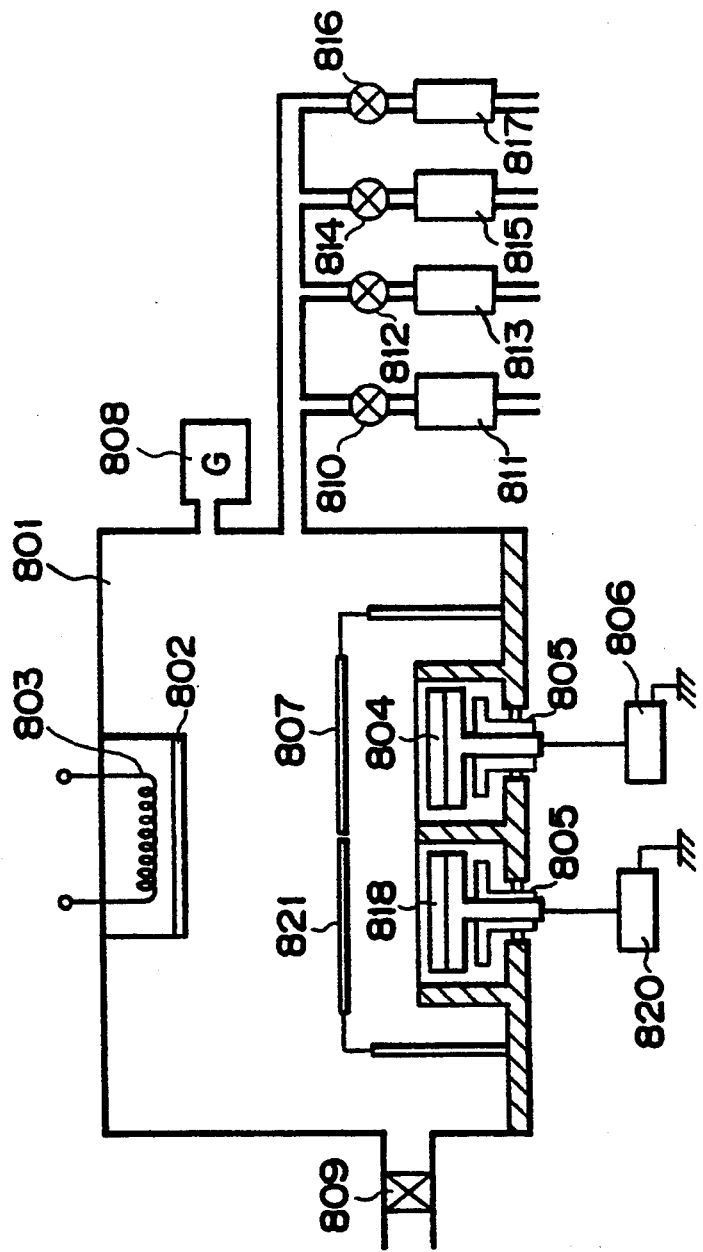
FIG. 8 is a schematic view of a manufacturing apparatus for use with a DC magnetron sputtering method for fabricating the light reflecting layer and the light reflection multiplying layer constituting the photovoltaic element of the invention.

FIG. 8 shows a sputtering apparatus which is capable of continuously depositing the light reflecting layer and the light reflection multiplying layer without breaking the vacuum of the deposition chamber. The apparatus is comprised of a deposition chamber 801, a substrate 802, a heater 803, a target 804 for the deposition of the light reflecting layer, and a target 818 for the deposition of the light reflection multiplying layer. The deposition conditions of the light reflecting layer are the same as those with the deposition apparatus of FIG. 4.

Figure 9:
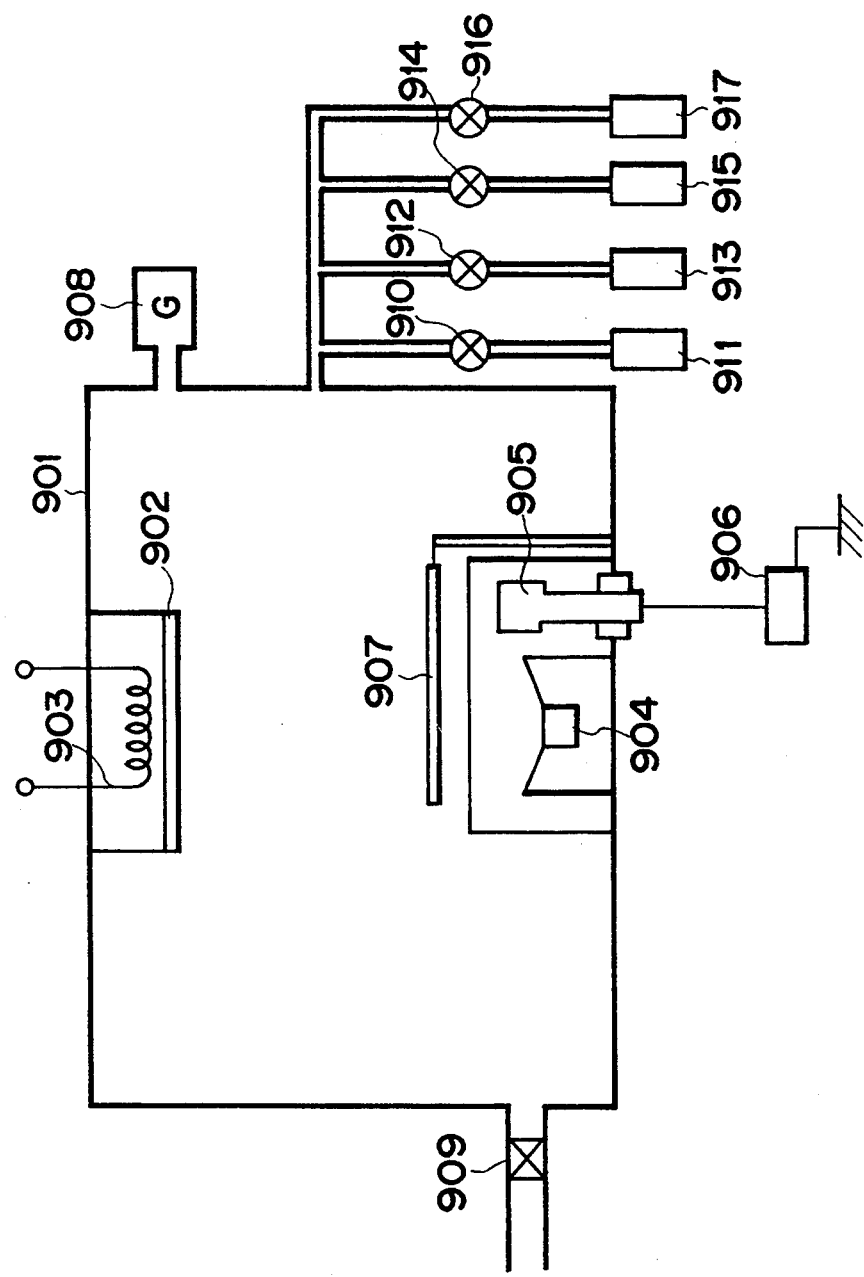
FIG. 9 is a schematic view of a manufacturing apparatus for use with a vacuum vapor deposition method for fabricating the light reflecting layer constituting the photovoltaic element of the present invention.

FIG. 9 is an apparatus for forming the light reflecting layer by vacuum vapor deposition. The vacuum vapor deposition apparatus is comprised of a deposition chamber 901, a substrate 902, a heater 903, a vapor deposition source 904, an electron beam (EB) gun 905, a high voltage power source 906, a shutter 907, a vacuum gauge 908, a conductance valve 909, gas inlet valves 910, 912, 914, 916, mass flow controllers 911, 913, 915, 917, and an exhaust unit, not shown.

In forming the light reflecting layer of silver containing oxygen, nitrogen, or carbon, the vapor deposition source may be silver containing oxygen, nitrogen, or carbon. The preferred content of oxygen, nitrogen, or carbon in the silver of the vapor deposition source is in the range from 1 to 2000 ppm.

In forming the light reflecting layer of copper containing oxygen, nitrogen, or carbon, the vapor deposition source may be copper containing oxygen, nitrogen, or carbon atoms. The preferred content of oxygen, nitrogen, or carbon in the copper vapor deposition source is in the range from 1 to 2000 ppm.

Further, in forming the light reflecting layer of silver containing lead, lead and gold, or lead, gold, and a first transition group metal, the vapor deposition source may be silver containing lead, lead and gold, or lead, gold, and a first transition group metal. The preferred total content of lead, gold, and first transition group metal contained in the silver vapor deposition source is in the range from 2 to 200 ppm.

The deposition chamber is exhausted below $5 \times 10^{-5}$ Torr, and the substrate temperature is set in the range from room temperature to 400° C. When the substrate temperature reaches a predetermined temperature, an electron beam is directed from the EB gun toward the vapor deposition source. The pressure within the deposition chamber is preferably in the range from $10^{-5}$ to $5 \times 10^{-4}$ Torr, and the deposition rate of the light reflecting layer is preferably in a range from 0.1 to 100 Å/sec.

In depositting the light reflecting layer of silver or copper containing oxygen, carbon, or nitrogen by reactive vapor deposition, an oxygen containing gas, a nitrogen containing gas or a carbon containing gas is introduced in an amount of $10^{-4}$ to $5 \times 10^{-3}$ Torr by using a vapor deposition source of silver containing less or no additions as above cited, instead of silver containing oxygen, nitrogen, or carbon. Under such pressures, silver or copper is deposited by electron beam deposition to form the light reflecting layer.

Figure 12:
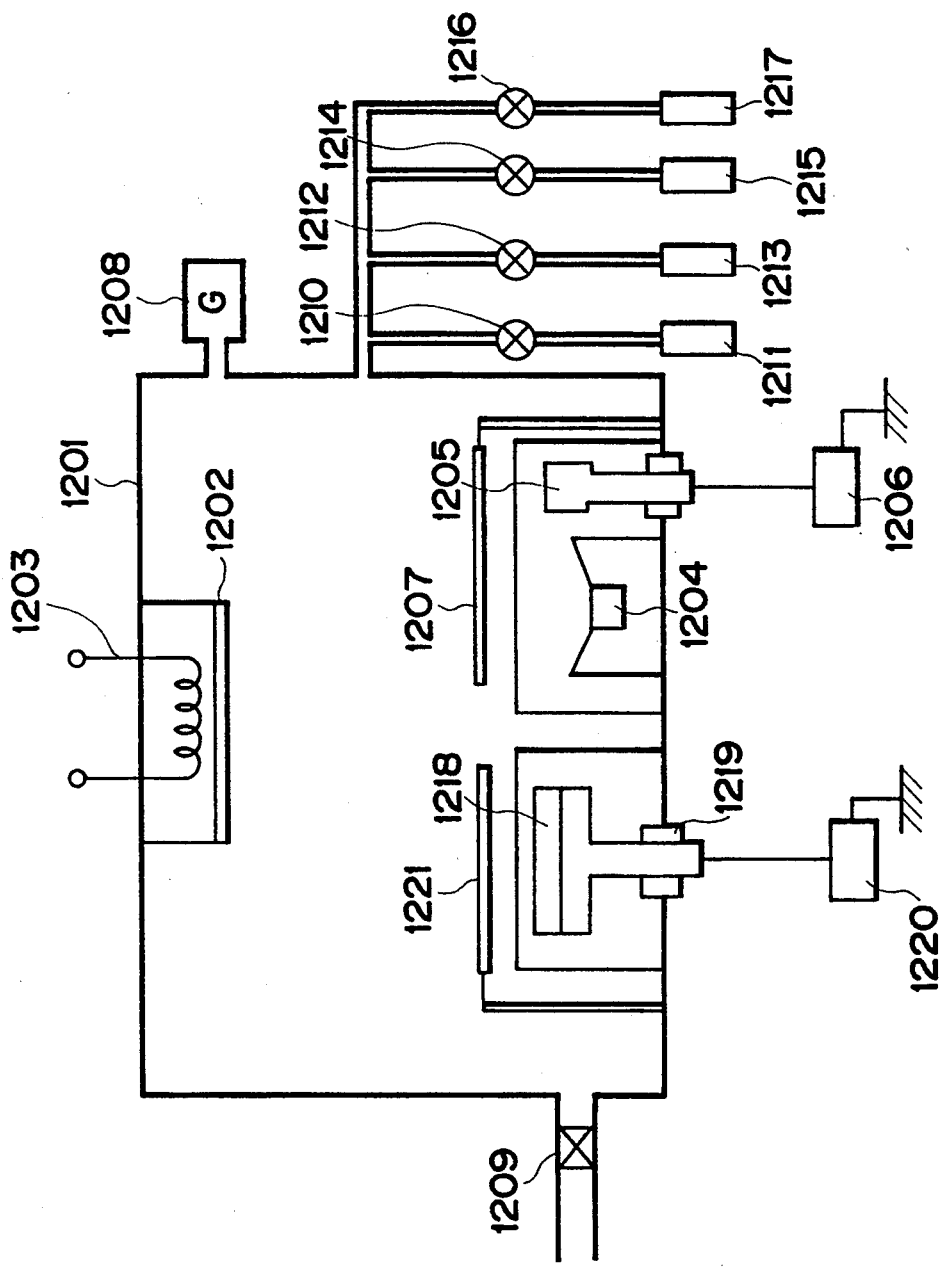
FIG. 12 is a schematic view of a manufacturing apparatus for use with DC magnetron sputtering and vacuum vapor deposition methods for continuously fabricating the light reflecting layer and the light reflection multiplying layer constituting the photovoltaic element of the present invention.

FIG. 12 shows a deposition apparatus incorporating therein both a means for depositing the light reflecting layer by electron beam deposition and a means for depositing the light reflection multiplying layer by sputtering. The deposition conditions of the light reflecting layer are the same as those for the FIG. 9 electron beam vapor deposition apparatus.

In depositing the light reflecting layer of the present invention by reactive sputtering or reactive vapor deposition, the oxygen containing gas, the carbon containing gas, and the nitrogen containing gas may be, for example, $O_2$, $CO_2$, and $N_2$ gases, respectively.

To give the light reflecting layer of the present invention a textured structure, the substrate temperature for the deposition may be set at a relatively higher value (above 300° C.), for example.

The crystal particle diameters of silver or copper suitable for the photovoltaic element of the present invention are preferably in a range from 100 Å to 10 µm, and most preferably in a range from 500 Å to 2 µm. Also, the film thickness of the light reflecting layer suitable for the photovoltaic element of the present invention is in a range from 500 Å to 3 µm.

Light Reflection Multiplying Layer

The light reflection multiplying layer of the photovoltaic element of the present invention is an important layer in contact with the light reflecting layer and closely related to the characteristics of the photovoltaic element, preferable examples of which include ZnO, $In_2O_3$, ITO, $TiO_2$, CdO, $Cd_2$, $SnO_4$, $Bi_2O_3$, $MoO_3$, and $Na_xWO_3$ (x=2 to 3).

The deposition methods of the reflection multiplying layer preferably include a vacuum vapor deposition method, a sputtering method, a CVD method, a spray method, a spin on method, and a dip method.

The optimal layer thickness depends on the refractive index, and the preferable film thickness is in the range from 500 Å to 10 µm.

In forming the textured structure in the light reflection multiplying layer, the substrate temperature for the deposition of the light reflection multiplying layer is set above 300° C., and the light reflection multiplying layer is deposited 2 µm thick or greater.

p-type Layer or n-type Layer

In the photovoltaic element of the present invention, the p-type or n-type layer is an important layer governing the characteristics of the photovoltaic element.

The amorphous material (denoted as "a-"), crystalline material (denoted as "µc-") or polycrystalline material (denoted as "poly-") for the p-type layer or n-type layer of the photovoltaic element of the present invention contains a p-type valence control agent (e.g., group III atoms in the periodic table such as B, Al, Ga, In, Tl) or n-type valence control agent (e.g., group V atoms in the periodic table such as P, As, Sb, Bi) of high density.

Examples of the amorphous material may include a-Si:H, a-Si:HX, a-SiC:H, a-SiC:HX, a-SiGe:H, a-SiGeC:H, a-SiO:H, a-SiN:H, a-SiON:HX, a-SiOCN:HX, and μc-Si:H; examples of the crystalline material may include μc-SiC:H, μc-Si:HX, μc-SiC:HX, μc-SiGe:H, μc-SiO:H, μc-SiGeC:H, μc-SiN:H, μc-SiON:HX, and μc-SiOCN:HX; and examples of the polycrystalline material may include poly-Si:H, poly-Si:HX, poly-SiC:H, poly-SiC:HX, poly-SiGe:H, poly-Si, poly-SiC, and poly-SiGe.

In particular, for the p-type layer or n-type layer on the light incident side, a crystalline semiconductor layer with less light absorption or an amorphous semiconductor layer having a wider band gap are suitable.

The amount of group III atoms added to the p-type layer or the amount of group V atoms added to the n-type layer is preferably in a range from 0.1 to 50 at %.

Hydrogen atoms (H,D) or halogen atoms (X) contained in the p-type or n-type layer act to compensate for dangling bonds of the p-type or n-type layer to improve the doping efficiency of the p-type or n-type layer. The preferred amount of hydrogen atoms or halogen atoms added to the p-type or n-type layer is in the range from 0.1 to 40 at %. In particular, when the p-type or n-type layer is crystalline, the preferred content of hydrogen atoms or halogen atoms is from 0.1 to 8 at %.

Further, it is preferable that a greater amount of hydrogen atoms and/or halogen atoms is contained at each p-type layer/i-type layer interface and n-type layer/i-type layer interface, the content of hydrogen atoms and/or halogen atoms near the interface being preferably 1.1 to 2 times that within the bulk. In this way, if the greater content of hydrogen atoms or halogen atoms is provided near each interface of p-type layer/i-type layer and n-type layer/i-type layer, it is possible to decrease the defect level or mechanical distortion near the interface, and thereby increase the photovoltaic power or photocurrent of the photovoltaic element of the present invention.

Further, it is preferable that a greater amount of hydrogen atoms and/or halogen atoms is contained at each transparent electrode/p-type layer interface or transparent electrode/n-type layer interface, the content of hydrogen atoms and/or halogen atoms near the interface being preferably 1.1 to 2 times that within the bulk. In this way, if the greater content of hydrogen atoms or halogen atoms is provided near each interface of transparent electrode/p-type layer or transparent electrode/n-type layer, it is possible to decrease the defect level or mechanical distortion near the interface, and thereby increase the photovoltaic power or photocurrent of the photovoltaic element of the present invention.

Of the electrical characteristics of the p-type or n-type layer in the photovoltaic element of the present invention, the activation energy is preferably 0.2 eV or less, and more preferably 0.1 eV or less. The specific resistance is preferably 100 Ωcm or less and more preferably 10 Ωcm or less. Further, the layer thickness of the p-type or n-type layer is preferably from 10 to 500 Å, and more preferably from 30 to 100 Å.

The source gases suitable for the deposition of the p-type or n-type layer in the photovoltaic element of the present invention may include, for example, a gasifiable compound containing silicon, a gasifiable compound containing germanium, a gasifiable compound containing nitrogen and mixed gases thereof.

Specifically, the gasifiable compounds containing silicon may include, for example, $SiH_4$, $SiH_6$, $SiF_4$, $SiFH_3$, $SiF_2H_2$, $SiF_3H$, $Si_3H_8$, $SiD_4$, $SiHD_3$, $SiH_2D_2$, $SiH_3D$, $SiFD_3$, $SiF_2D_2$, $SiD_3H$, and $Si_2D_3H_3$. Also, the gasifiable compounds containing germanium may include, for example, $GeH_4$, $GeD_4$, $GeF_4$, $GeFH_3$, $GeF_2H_2$, $GeF_3H$, $GeHD_3$, $GeH_2D_2$, $GeH_3D$, $Ge_2H_6$, and $Ge_2D_6$. The gasifiable compounds containing carbon may include, for example, $CH_4$, $CD_4$, $C_nH_{2n+2}$ (n is an integer), $C_nH_{2n}$ (n is an integer), $C_2H_2$, $C_6H_6$, $CO_2$, and CO. The nitrogen containing gases may include, for example, $N_2$, $NH_3$, $ND_3$, $NO$, $NO_2$, and $N_2O$. Also, the oxygen containing gases may include, for example, $O_2$, CO, $CO_2$, NO, $NO_2$, $N_2O$, $CH_3CH_2$, OH, and $CH_3OH$.

The substances introduced into the p-type or n-type layer for the valence control in the present invention may include group III and group V atoms in the periodic table. The starting materials effectively used for the introduction of group III atoms include boron hydrides such as $B_2H_6$, $B_4H_{10}$, $B_5H_9$, $B_5H_{11}$, $B_6H_{10}$, $B_6H_{12}$, $B_6H_{14}$, and boron halides such as $BF_3$, $BCl_3$, for the introduction of boron atoms. Besides these, $AlCl_3$, $GaCl_3$, $InCl_3$, and $TlCl_3$ may be included, but $B_2H_6$ and $BF_3$ are particularly suitable. Also, the starting materials effectively used for the introduction of group V atoms include, for example, phosphorus hydrides such as $PH_3$, $P_2H_4$, and phosphorus halides such as $PH_4I$, $PF_3$, $PF_5$, $PCl_3$, $PCl_5$, $PBr_3$, $PBr_5$, $PI_3$, for the introduction of phosphorus atoms. Besides these, $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, and $BiBr_3$ may be included. Among them, $PH_3$ and $PF_5$ are particularly suitable.

The deposition methods of the p-type or n-type layer include RF plasma CVD methods and μW plasma CVD methods. Of the RF plasma CVD methods for the deposition, an RF plasma CVD method of the capacitive coupling type is particularly suitable.

In depositing the p-type or n-type layer by RF plasma CVD, the preferred conditions are such that the substrate temperature is from 100° to 350° C., with the internal pressure from 0.1 to 10 Torr, the RF power from 0.05 to 1.0 W/cm², and the deposition rate from 0.1 to 30 Å/sec.

Also, the gasifiable compound as previously noted may be introduced into the deposition chamber by appropriately diluting it with a gas such as $H_2$, He, Ne, Ar, Xe, or Kr. In particular, in depositing the layer having less light absorption and wide band gap such as a crystalline semiconductor or a-SiC:H, it is preferable that the source gas is diluted 2 to 100 times by the introduction of hydrogen gas, with the RF power made relatively higher. The RF frequency is preferably in a range from 1 MHz to 100 MHz, and a frequency near 13.56 MHz is particularly preferred.

Also, in depositing the p-type or n-type layer by μW plasma CVD, a μW plasma CVD apparatus is used in which microwaves are introduced through a waveguide via a dielectric window (made of alumina ceramics) into the deposition chamber. In depositing the p-type or n-type layer by μW plasma CVD, it is preferable that the substrate temperature within the deposition chamber is from 100° to 450° C., with the internal pressure from 0.5 to 30 mTorr, the μW power from 0.01 to 1 W/cm³, and the μW frequency from 0.5 to 10 GHz.

At this point, the gasifiable compound as previously cited may be introduced into the deposition chamber by appropriately diluting it with a gas such as $H_2$, He, Ne, Ar, Xe, or Kr. In particular, in depositing the layer having less light absorption or wide band gap such as a crystalline semiconductor or a-SiC:H, it is preferable that the source gas is diluted 2 to 100 times by hydrogen gas and a relatively higher $\mu W$ power is introduced.

i-type Layer

The i-type layer in the photovoltaic element of the present invention is an important layer for generating and transporting carriers by illumination of light.

The i-type layer in the photovoltaic element of the present invention may be slightly p-type or n-type. When the i-type layer used is a semiconductor layer in which the product of the hole mobility and the lifetime is smaller than that of the electron mobility and the lifetime, it is preferably slightly p-type. Conversely, when the i-type layer is a semiconductor layer in which the product of the electron mobility and the lifetime is smaller than that of the hole mobility and the lifetime, it is preferably slightly n-type.

The materials for the i-type layer may include, for example, amorphous materials such as a-Si:H, a-Si:HX, a-SiC:H, a-SiC:HX, a-SiGe:H, a-SiGe:HX, and a-SiGeC:HX. In particular, the i-type layer is suitably composed of a material made intrinsic by adding group III atoms and/or group V atoms in the periodic table as the valence control agent to the amorphous material as above cited.

Hydrogen atoms, (H,D) or halogen atoms (X) contained in the i-type layer act to compensate the dangling bonds of the i-type layer to enhance the product of the carrier mobility and the lifetime in the i-type layer. Also, these atoms act to compensate for the interfacial levels at each interface of p-type layer/i-type layer and n-type layer/i-type layer, with the effect of enhancing the photovoltaic power, photocurrent, and light response of the photovoltaic element. The content of hydrogen atoms and/or halogen atoms in the i-type layer is preferably in a range from 1 to 40 at %. In particular, it is preferable that a greater content of hydrogen atoms and/or halogen atoms is distributed at each interface of p-type layer/i-type layer and n-type layer/i-type layer, the content of hydrogen atoms and/or halogen atoms near the interface being preferably 1.1 to 2 times that within the bulk.

The layer thickness of the i-type layer is preferably from 0.1 to 1.0 $\mu m$, although it may greatly depend on the structure of the photovoltaic element (e.g., single cell, tandem cell, triple cell) and the band gap of the i-type layer.

To accomplish the objects of the present invention effectively, the basic properties of the material for the i-type layer are electron mobility of 0.01 $cm^2/V/sec$ or more, hole mobility of 0.0001 $cm^2 V/sec$ or more, band gap of from 1.1 to 2.2 eV, density of localized states at the center of the forbidden band of $10^{18}/cm^3/eV$ or less, and the slope of Urbach tail on the valence electron side of 65 meV. Further, it is desirable that the current-voltage characteristic for the photovoltaic element of the present invention is measured under AM1.5 and 100 $mW/cm^2$, and by curve fitting it by Hecht method, the product of the mobility obtained by this curve fitting and the lifetime is $10^{-10}$ $cm^2/V$ or greater.

Also, it is preferable that the band cap of the i-type layer is wider at each interface of p-type layer/i-type layer and n-type layer/i-type layer. Such design allows for an increase in the photovoltaic power and photocurrent of the photovoltaic element and further allows for the prevention of the optical deterioration due to use for a long time.

The source gases suitable for the deposition of the i-type layer in the photovoltaic element of the present invention may include, for example, a gasifiable compound containing silicon, a gasifiable compound containing germanium, a gasifiable compound containing carbon, and mixed gases thereof.

Specifically, the gasifiable compounds containing silicon may include, for example, $SiH_4$, $SiH_6$, $SiF_4$, $SiFH_3$, $SiF_2H_2$, $SiF_3H$, $Si_3H_8$, $SiD_4$, $SiHD_3$, $SiH_2D_2$, $SiH_3D$, $SiFD_3$, $SiF_2D_2$, $SiD_3H$, and $Si_2D_3H_3$. Also, the gasifiable compounds containing germanium may include, for example, $GeH_4$, $GeD_4$, $GeF_4$, $GeFH_3$, $GeF_2H_2$, $GeF_3H$, $GeHD_3$, $GeH_2D_2$, $GeH_3D$, $Ge_2H_6$, and $Ge_2D_6$. The gasifiable compounds containing carbon atoms may include, for example $CH_4$, $CD_4$, $C_nH_{2n+2}$ (n is an integer), $C_nH_{2n}$ (n is an integer), $C_2H_2$, and $C_6H_6$.

The substances introduced into the i-type layer for the valence control of i-type layer in the present invention may include group III and group V atoms in the periodic table. The starting materials effectively used for the introduction of group III atoms include boron hydrides such as $B_2H_6$, $B_4H_{10}$, $B_5H_9$, $B_5H_{11}$, $B_6H_{10}$, $B_6H_{12}$, $B_6H_{14}$, and boron halides such as $BF_3$, $BCl_3$, for the introduction of boron atoms. Besides these, $AlCl_3$, $GaCl_3$, $InCl_3$, and $TlCl_3$ may be included. Also, the starting materials effectively used for the introduction of group V atoms include phosphorus hydrides such as $PH_3$, $P_2H_4$, and phosphorus halides such as $PH_4I$, $PF_3$, $PF_5$, $PCl_3$, $PCl_5$, $PBr_3$, $PBr_5$, $PI_3$, for example, for the introduction of phosphorus atoms. Besides these, $AsH_3$, $AsF_3$, $AsCl_3$, $AsBr_3$, $AsF_5$, $SbH_3$, $SbF_3$, $SbF_5$, $SbCl_3$, $SbCl_5$, $BiHi_3$, $BiCl_3$, and $BiBr_3$ may be included.

The amount of group III or group V atoms in the periodic table introduced for the control of conductivity type into the i-type layer is preferably 1000 ppm or less.

The deposition methods of the i-type layer suitable for the present invention include the RF plasma CVD method and the $\mu W$ plasma CVD method. Of the RF plasma CVD methods for the deposition, an RF plasma CVD method of the capacitive coupling type is particularly suitable.

In depositing the i-type layer by RF plasma CVD, the preferred conditions are substrate temperature from 100° to 350° C., internal pressure from 0.1 to 10 Torr, RF power from 0.05 to 1.0 $W/cm^2$, and deposition rate from 0.1 to 30 Å/sec.

Also, the gasifiable compound as previously noted may be introduced into the deposition chamber by appropriately diluting it was a gas such as $H_2$, He, Ne, Ar, Xe, or Kr. In particular, in depositing the layer having a wide band gap such as a-SiC:H, it is preferred that the source gas is diluted 2 to 100 times by hydrogen gas and a relatively higher RF power is introduced. The RF frequency is preferably in a range from 1 MHz to 100 MHz, and the frequency near 13.56 MHz is particularly preferable.

Also, in depositing the i-type layer by $\mu W$ plasma CVD, a method is suitable in which microwaves are introduced through a waveguide via a dielectric window (alumina ceramics) into the deposition chamber. Herein, it is preferable that the substrate temperature within the deposition chamber is from 100° to 450° C., with the internal pressure from 0.5 to 30 mnTorr, the $\mu W$ power from 0.01 to 1 $W/cm^3$, and the $\mu W$ frequency from 0.5 to 10 GHz. Further, it the plasma voltage is controlled by installing a bias rod (plate or ring-like) therein, the characteristics can be further improved. In particular, in the region where the deposition rate is not saturated for a given μW power, control of the plasma voltage with the bias rod can be effectively made. Then, it is most effective to positively bias the bias rod relative to the substrate voltage. When the applied voltage to the bias rod is a DC bias, it is preferably from 10 to 500 V, while if it is an AC bias, the applied voltage is preferably from 10 at minimum to 500 V at maximum. Further, when an RF bias is applied to the bias rod, the RF power is preferably from 10 W to 3 KW. With such RF bias, the characteristics can be improved, particularly by introducing an RF power greater than the μW power. In either case of AC bias and RF bias, it is preferable that the substrate is at a negative voltage relative to the bias rod, like the DC bias.

It is believed that the reason for the improvement in the characteristics of the deposited film with the bias is that positive ions play an important role in the μW plasma CVD method. Further, since the characteristics are improved by a specific combination of the μW power and the bias, the combination of active species and ion species in the plasma is believed to be important.

Also, the gasifiable compound as previously cited may be introduced into the deposition chamber by appropriately diluting it with a gas such as $H_2$, He, Ne, Ar, Xe, or Kr. In particular, in depositing the layer having a wide band gap such as a-SiC:H, it is preferable that the source gas be diluted 2 to 100 times by hydrogen gas and a relatively higher μW power is introduced.

Figure 13:
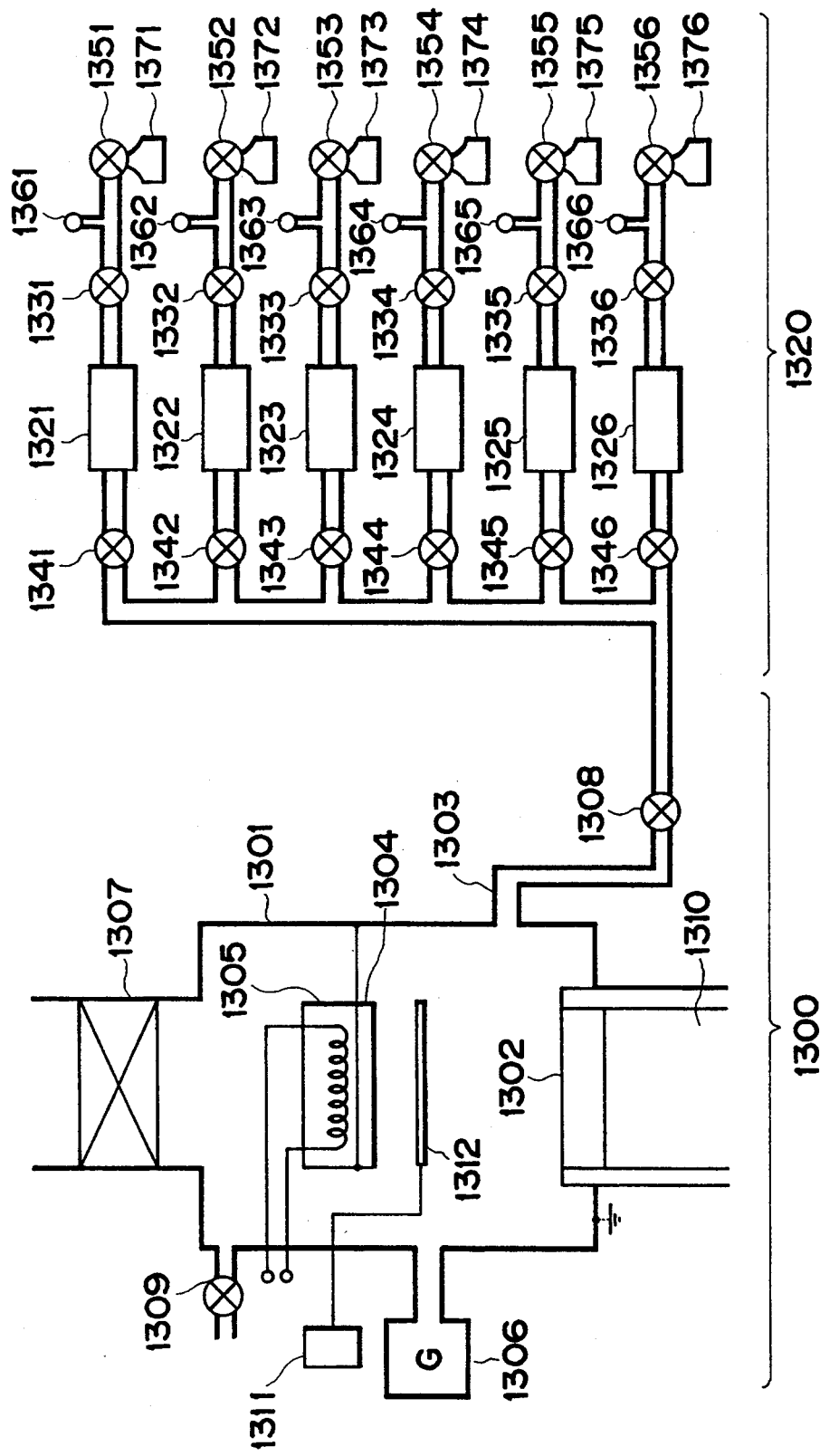
FIG. 13 is a schematic view of a manufacturing apparatus for use with a microwave glow discharge method for fabricating the non-single crystal silicon type semiconductor layer constituting the photovoltaic element of the present invention.
Figure 14:
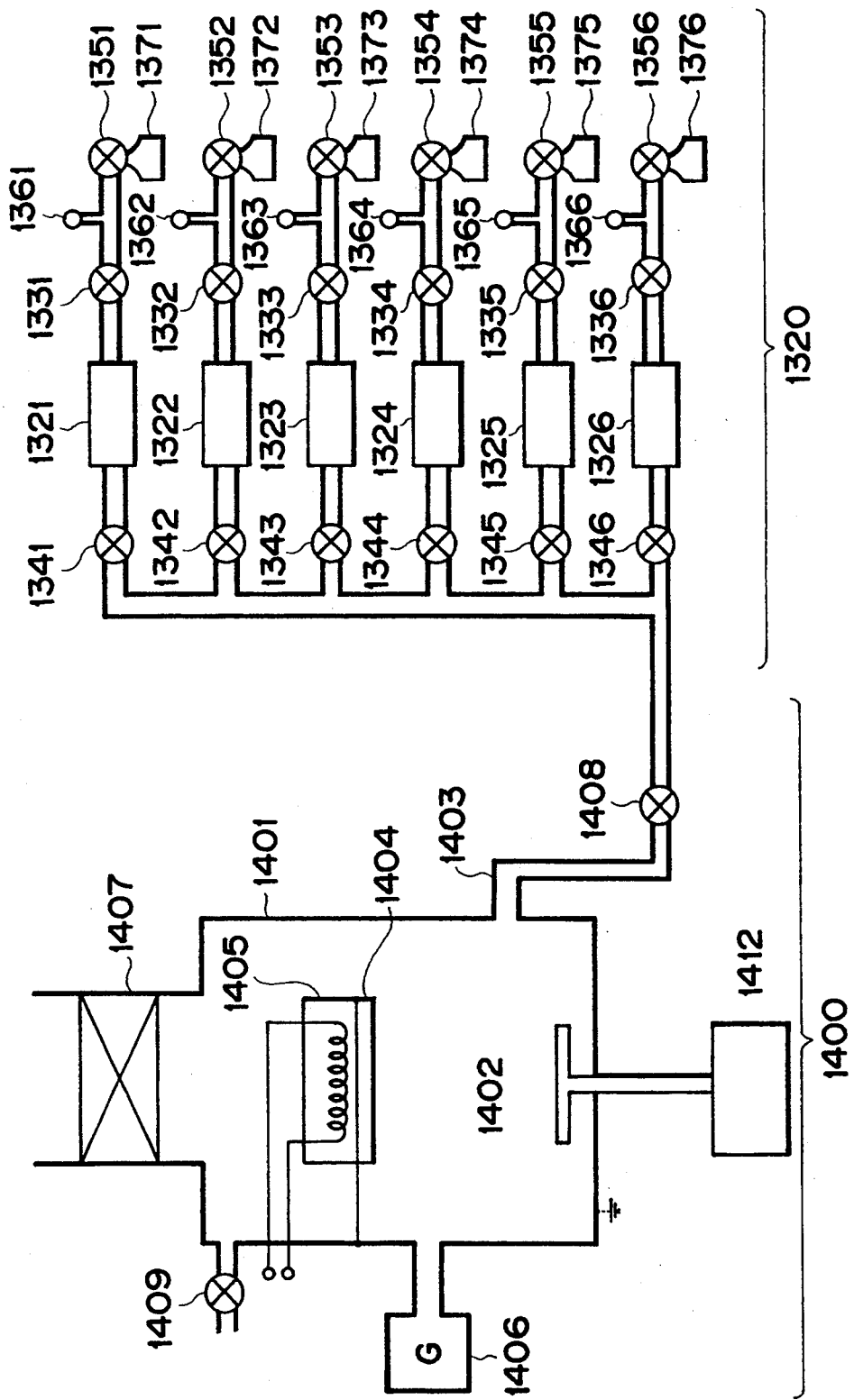
FIG. 14 is a schematic view of a manufacturing apparatus for use with an RF flow discharge method for fabricating the non-single crystal silicon type semiconductor layer constituting the photovoltaic element of the present invention.

FIGS. 13 and 14 are explanatory views of a μW plasma CVD apparatus and an RF plasma CVD apparatus suitable for the deposition of the p-type layer, n-type layer, and i-type layer of the present invention.

The μW plasma CVD apparatus as shown in FIG. 13 is comprised of a μW portion 1300 composed of a deposition chamber 1301, a microwave introducing dielectric window 1302, a gas introducing tube 1303, a substrate 1304, a heater 1305, a vacuum gauge 1306, a conductance valve 1307, an auxiliary valve 1308, a leak valve 1309, a waveguide 1310, a bias power source 1311, a bias rod 1312, a source gas supply unit 1320, mass flow controllers 1321 to 1326, gas inlet valves 1331 to 1336, gas outlet valves 1341 to 1346, source gas cylinder valves 1351 to 1356, pressure regulators 1361 to 1366, and source gas cylinders 1371 to 1376.

The RF plasma CVD apparatus as shown in FIG. 14 is comprised of an RF portion 1400 composed of a deposition chamber 1401, a cathode 1402, a gas introducing tube 1403, a substrate 1404, a heater 1405, a vacuum gauge 1406, a conductance valve 1407, an auxiliary valve 1408, a leak valve 1409, and an RF matching box 1412. Source gas supply unit 1320 is as described above.

The deposition apparatuses as shown in FIGS. 13 and 14 suitable for the deposition of the photovoltaic elements of the present invention are preferably made of stainless or aluminum material. Particularly, when stainless material is used, optimal stainless materials are those having excellent properties of corrosion resistance, pore corrosion resistance, grain boundary corrosion resistance, and heat resistance, such as SUS304, SUS304N2, SUS304L, SUS304LN, SUS321, SUS347, SUS316, and SUS316L. Also, in making the deposition apparatus of aluminum, the optimal materials are Al-Mg type materials of JIS 5000s.

The materials for the dielectric window for microwave introduction in the μW plasma CVD apparatus as shown in FIG. 13 are those containing 95% or more of alumina ceramics ($Al_2O_3$).

Transparent Electrode

The transparent electrode for use with the photovoltaic element of the present invention is preferably composed of, for example, tin oxide, indium oxide or indium-tin oxide, and in particular, a transparent electrode of an oxide having nitrogen atoms and/or carbon atoms contained therein is preferred.

If nitrogen is contained in tin oxide, indium oxide or indium-tin oxide, the crystal particle diameter of the oxide composing the transparent electrode increases, with the dispersion of the crystal particle diameters being reduced. Further, the distortion of the transparent electrode can be reduced. As a result, the specific resistance of the transparent electrode can be reduced, with the transmittance of the transparent electrode being improved.

In addition, if nitrogen is contained in the transparent electrode, the shape of the crystals of the oxide composing the transparent electrode can be relatively smoother, with the surface property of the transparent electrode being improved. Particularly, in depositing the transparent electrode on the semiconductor layer, the adhesion between the semiconductor layer and the transparent electrode is remarkably improved. Also, in depositing a non-single crystal silicon type semiconductor layer on the transparent electrode, the amount of abnormal deposition of the non-single crystal silicon type semiconductor layer can be decreased. Accordingly, the deposition of the thin p-type layer (or n-type layer) still allows for reduction of current leakage. Consequently, the electrical characteristics of the photovoltaic element can be improved.

Also, it is believed that nitrogen atoms affect the crystal growth of the oxide, although the details are unknown, whereby the introduction of nitrogen can provide for the transparent electrode having excellent characteristics even at relatively low deposition temperatures.

The transparent electrode containing nitrogen of the present invention can be deposited as follows.

The preferred deposition methods for the transparent electrode include a sputtering method and a vacuum vapor deposition method. For example, when a transparent electrode composed of tin oxide containing nitrogen is deposited on the substrate using the DC magnetron sputtering apparatus, the target may be made of metallic tin (Sn) or tin oxide ($SnO_2$) containing nitrogen therein.

Also, when a transparent electrode composed of indium oxide containing nitrogen is deposited, the target may be made of metallic indium (In) or indium oxide ($In_2O_3$) containing nitrogen therein. Also, when the transparent electrode composed of indium-tin oxide containing nitrogen is deposited, the target may be an appropriate combination of metallic tin, metallic indium, an alloy of metallic tin and metallic indium, tin oxide, indium oxide, or indium-tin oxide, each containing nitrogen therein.

Also, when the transparent electrode of the present invention is deposited by reactive sputtering, a combination of targets and/or a target not containing nitrogen may be used for sputtering and a source gas containing nitrogen introduced into the deposition chamber so as to introduce nitrogen into the transparent electrode by the use of plasma energy.

The source gases containing nitrogen suitable for the reactive sputtering include, for example, $N_2$, $NH_3$, $ND_3$, $NO$, $NO_2$, $N_2O$.

The amount of nitrogen contained in the transparent electrode of the present invention is preferably 100 ppm or less. Also, for 100 ppm or less nitrogen to be contained in the transparent electrode, the amount of nitrogen contained in the target would be approximately 100 ppm, although it greatly depends on the sputtering conditions.

Also, for 100 ppm or less nitrogen to be contained in the transparent electrode by reactive sputtering, the mixing ratio of nitrogen atom containing gas to sputtering gas is preferably 200 ppm or less.

In depositing the transparent electrode containing nitrogen of the present invention by sputtering, the substrate temperature is an important factor, and is preferably from 25° to 600° C. At low temperatures from 25° to 250° C., transparent electrodes exhibiting better characteristics as compared with that of the conventional art can be obtained. Also, the sputtering gases may included inert gases such as argon (Ar), neon (Ne), xenon (Xe), and helium (He), among which Ar gas is particularly preferable. Also, it is preferable to add oxygen gas ($O_2$) to the inert gas as necessary, and particularly when a metal is used as the target, oxygen gas ($O_2$) is requisite.

In conducting the sputtering, the pressure of the discharge space is preferably from 0.1 to 50 mTorr for effective sputtering. The electric power sources include a DC power source and an RF power source. The electric power during the sputtering is preferably in a range from 10 to 1000 W. Also, the deposition rate, though dependent on the pressure of the discharge space or the discharge power, preferably is in a range from 0.1 to 100 Å/sec.

The layer thickness of the transparent electrode containing nitrogen of the present invention is preferably in a range which meets the conditions for an antireflection film. The specific layer thickness is from 500 to 3000 Å.

The second method suitable for depositing the transparent electrode containing nitrogen of the present invention is a vacuum vapor deposition method. The vapor deposition source is metallic tin, metallic indium, or indium-tin alloy containing nitrogen. The amount of nitrogen is preferably in a range of approximately 100 ppm or less.

As for the deposition conditions, the substrate temperature is in the range from 25° to 600° C., the pressure is reduced to $10^{-6}$ Torr or less, and oxygen gas ($O_2$) is introduced into the deposition chamber in a range from $5 \times 10^{-5}$ to $9 \times 10^{-4}$ Torr.

By introducing oxygen in this range, metal vaporized from the vapor deposition source will react with oxygen in the gas phase to deposit an excellent transparent electrode.

Also, in depositing the transparent electrode containing nitrogen by reactive vapor deposition, the vapor deposition source and/or a vapor deposition source not containing nitrogen are vaporized under conditions where a nitrogen containing gas of $5 \times 10^{-4}$ Torr or less is introduced into the deposition chamber to deposit the transparent electrode. In addition, RF power may also be introduced in a degree of vacuum as above noted to produce a plasma, from which the vapor deposition is made.

The preferred deposition rate of the transparent electrode under the above conditions is from 0.1 to 100 Å/sec. If the deposition rate is below 0.1 Å/sec, the productivity is decreased, while if it is greater than 100 Å/sec, a coarse film may be produced, resulting in degraded transmittance, conductivity, or adhesion.

If carbon atoms are also included in the transparent electrode containing nitrogen atoms of the present invention, the characteristics of the photovoltaic element can be further improved. That is, if both nitrogen and carbon are contained in the transparent electrode, the durability of photovoltaic element against heat cycling is further improved, and the transparent electrode is provided with greater flexibility, offering greater prevention of cracking of the photovoltaic element. The preferred additive amount of carbon in the present invention is 100 ppm or less.

The method of introducing carbon into the transparent electrode may be the same as that of nitrogen atoms as previously described.

For example, if the sputtering or vacuum vapor deposition is performed using a target or vapor source containing carbon atoms, carbon can be contained in the transparent electrode. In this case, the starting materials for carbon contained in the target or vapor deposition source preferably include graphitic carbon and diamond carbon.

Also, in depositing the transparent electrode containing nitrogen and carbon by reactive sputtering, a combination of the target and/or the a target not containing carbon is used and a carbon containing source gas is introduced into the deposition chamber, in addition to a nitrogen containing source gas, and plasma energy may also be applied during deposition.

The carbon containing source gases suitable for the reactive sputtering include $CH_4$, $CD_4$, $C_nH_{2n+2}$ (n is an integer), $C_2H_2$, $C_6H_6$, and $CO_2CO$.

Also, in depositing the transparent electrode containing carbon in addition to nitrogen atoms by reactive vapor deposition, the vapor deposition source and/or the vapor deposition source not containing carbon may be vaporized in the presence of a carbon containing gas at a pressure of $5 \times 10^{-4}$ Torr or less introduced into the deposition chamber. In addition, RF power may be introduced in a degree of vacuum as above noted to produce a plasma during the vapor deposition.

On the other hand, to form a transparent electrode not containing nitrogen and/or carbon, the transparent electrode may be deposited by conventional methods.

Conductive Substrate

The conductive substrate may be directly composed of a conductive material itself, or may comprise a support member made of an insulating material or conductive material and subjected to a conductive surface treatment. Examples of the conductive support member include metals such as NiCr, stainless, Al, Cr, Mo, Au, Nb, Ta, V, Ti, Pt, Pb, Sn, and their alloys. Examples of the electrical insulating support member include synthetic resin films such as polyester, polyethylene, polycarbonate, cellulose acetate, polypropylene, polyvinylchloride, polyvinylidene chloride, polystyrene, and polyamide, glass, ceramics, and paper. Such electrical insulating support member has at least one surface thereof subjected to conductive treatment, and is provided with a photovoltaic layer on the surface subjected to the conductive treatment.

For example, if glass is used, the conductivity is provided by forming a thin film of NiCr, Al, Cr, Mo, Au, Nb, Ta, V, Ti, Pt, $In_2O_3$ or ITO ($In_2O_3+SnO_2$) on the surface thereof; or if a synthetic resin film such as polyester film is used, the conductivity is provided on the surface by a metallic thin film of NiCr, Al, Ag, Pb, Zn, Ni, Au, Cr, Mo, Ir, Nb, Ta, V, Ti, Pt formed on the surface thereof by vacuum vapor deposition, electron beam vapor deposition or sputtering, or by laminating its surface with any of the above metals. The shape of support member may be sheet-like with its surface smooth or irregular. The thickness thereof is appropriately determined to form a photovoltaic element as desired, but if flexibility is required, the thickness should be as thin as possible as long as the requisite features of the support member are sufficiently exhibited. However, for the convenience of manufacturing or processing the support member, the thickness is usually 10 $\mu$m or greater from the point of mechanical strength.

Conductive Layer (and Protective Layer)

The conductive layer may be of a conductive material itself, or of a conductive material on which an insulating material is formed. Examples of the conductive material include metals such as NiCr, stainless, Al, Cr, Mo, Au, Nb, Ta, V, Ti, Pt, Pb, Sn, and their alloys. The metal may be formed as a thin film by vacuum vapor deposition or sputtering. Examples of the electrical insulating material include synthetic resin films such as polyester, polyethylene, polycarbonate, cellulose acetate, polypropylene, polyvinylchloride, polyvinylidene chloride, polystyrene, and polyamide, glass, ceramics, and paper. Such electrical insulating material has at least one surface thereof applied with an adhesive, and is bonded to the metallic thin film layer.

The electrical insulating material should be as thin as possible as long as the requisite features of the protective layer are sufficiently exhibited. However, for the convenience of manufacturing or processing, the thickness is usually 10 $\mu$m or greater from the point of mechanical strength.

EXPERIMENT EXAMPLES

The effects of the present invention will be described in detail using experiment examples performed in the course of achieving the present invention.

EXPERIMENT EXAMPLE 1-1

First, using a DC magnetron sputtering apparatus as shown in FIG. 4, a light reflecting layer of Ag containing oxygen was fabricated on a stainless substrate.

In the figure, 402 is a stainless (SUS430) substrate, 50 mm square and 0.2 mm thick, having its surface subjected to specular reflection treatment, then ultrasonically washed with acetone ($CH_3OCH_3$) for ten minutes and isopropanol ($CH_3CHOHCH_3$) for ten minutes, and then dried in hot air at 80° C. for thirty minutes.

In the figure, 404 is a target of silver (Ag) having a purity of 99.999%, which is insulated from the deposition chamber 401 by the insulating support member 405. In the figure, 410, 412, 414, and 416 are gas introducing valves, which are respectively connected to a cylinder of argon (Ar) gas (purity 99.9999%), a cylinder of nitrogen ($N_2$/Ar) gas diluted to 50 ppm by argon (Ar) gas, a cylinder of methane ($CH_4$/Ar) gas diluted to 50 ppm by argon (Ar) gas, and a cylinder of oxygen ($O_2$/Ar) gas diluted to 50 ppm by argon (Ar) gas.

First, the deposition chamber 401 was exhausted by a vacuum pump, not shown, in such a manner that when the reading of vacuum gauge 408 reached $1 \times 10^{-5}$ Torr, the gas introducing valves 410, 416 were gradually opened and regulated by respective mass flow controllers 411, 417 so that the flow of $O_2$/Ar was 2 sccm and the Ar flow was 10 sccm, and the opening of conductance valve 409 (butterfly type) was adjusted by observing the vacuum gauge 408 so that the pressure of the deposition chamber 401 was 6 mTorr. Thereafter, the DC power source 406 was set at a voltage of -400 V, and DC power was applied to the target 404 to excite a DC glow discharge. After the elapse of five minutes, the shutter 407 was opened to start fabrication of the light reflecting layer of Ag on the substrate 402, and upon fabricating the light reflecting layer having a layer thickness of 450 nm, the shutter 407 was closed, and the output of DC power source 406 was shut off to stop the DC glow discharge. Next, the inflow of $O_2$/Ar gas into the deposition chamber 401 was stopped by closing the gas introducing valve 416, and the mass flow controller 411 was adjusted so that the Ar gas flow was 100 sccm.

Next, by opening the conductance valve 409, the deposition chamber 401 was gradually leaked, whereby the fabrication of a light reflecting layer of Ag containing oxygen was complete.

EXPERIMENT EXAMPLE 1-2

A light reflecting layer containing nitrogen was fabricated in the same way as in Experiment Example 1-1, except that instead of the oxygen gas diluted by Ar gas, $N_2$ gas diluted to 50 ppm with Ar gas was introduced.

EXPERIMENT EXAMPLE 1-3

A light reflecting layer containing carbon was fabricated in the same way as in Experiment Example 1-1, except that instead of the oxygen gas diluted by Ar gas, $CH_4$ gas diluted to 50 ppm by Ar gas was introduced.

EXPERIMENT EXAMPLE 1-4

A light reflecting layer containing nitrogen and oxygen was fabricated, with an Ar gas flow of 20 sccm, an NO/Ar gas flow of 20 sccm and a pressure of 5 mTorr, in the same way as in Experiment Example 1-1, except that instead of the oxygen gas diluted by Ar gas, NO gas (NO/Ar gas) diluted to 50 ppm with Ar gas was introduced.

EXPERIMENT EXAMPLE 1-5

A light reflecting layer containing nitrogen, oxygen, and carbon was fabricated, with a Ar gas flow of 10 sccm, a $CH_4$/Ar gas flow of 10 sccm, and $O_2$/Ar gas flow of 5 sccm, an $N_2$ gas flow of 10 sccm, and a pressure of 8 mTorr, in the same way as in Experiment Example 1-1.

COMPARATIVE EXPERIMENT EXAMPLE 1

A conventional light reflecting layer of Ag was fabricated in the same way as in Experiment Example 1-1, except that $O_2$ gas was not flowed into the deposition chamber 401 during its fabrication.

TABLE 1

| | Film exfoliation area (%) | |
|---|---|---|
| | (A) | (B) |
| Experiment example 1-1 | 0.3 | 0.4 |
| Experiment example 1-2 | 0.12 | 0.25 |
| Experiment example 1-3 | 0.13 | 0.27 |
| Experiment example 1-4 | 0.1 | 0.18 |
| Experiment example 1-5 | 0.1 | 0.2 |
| Comparative experiment example 1 | 1.0 | 1.5 |

TABLE 2

|  | Film exfoliation area (%) | |
|---|---|---|
|  | (A) | (B) |
| Experiment example 1-1 | 0.4 | 0.5 |
| Experiment example 1-2 | 0.09 | 0.2 |
| Experiment example 1-3 | 0.1 | 0.15 |
| Experiment example 1-4 | 0.1 | 0.2 |
| Experiment example 1-5 | 0.2 | 0.3 |
| Comparative experiment example 1 | 2.0 | 2.5 |

Figure 5:
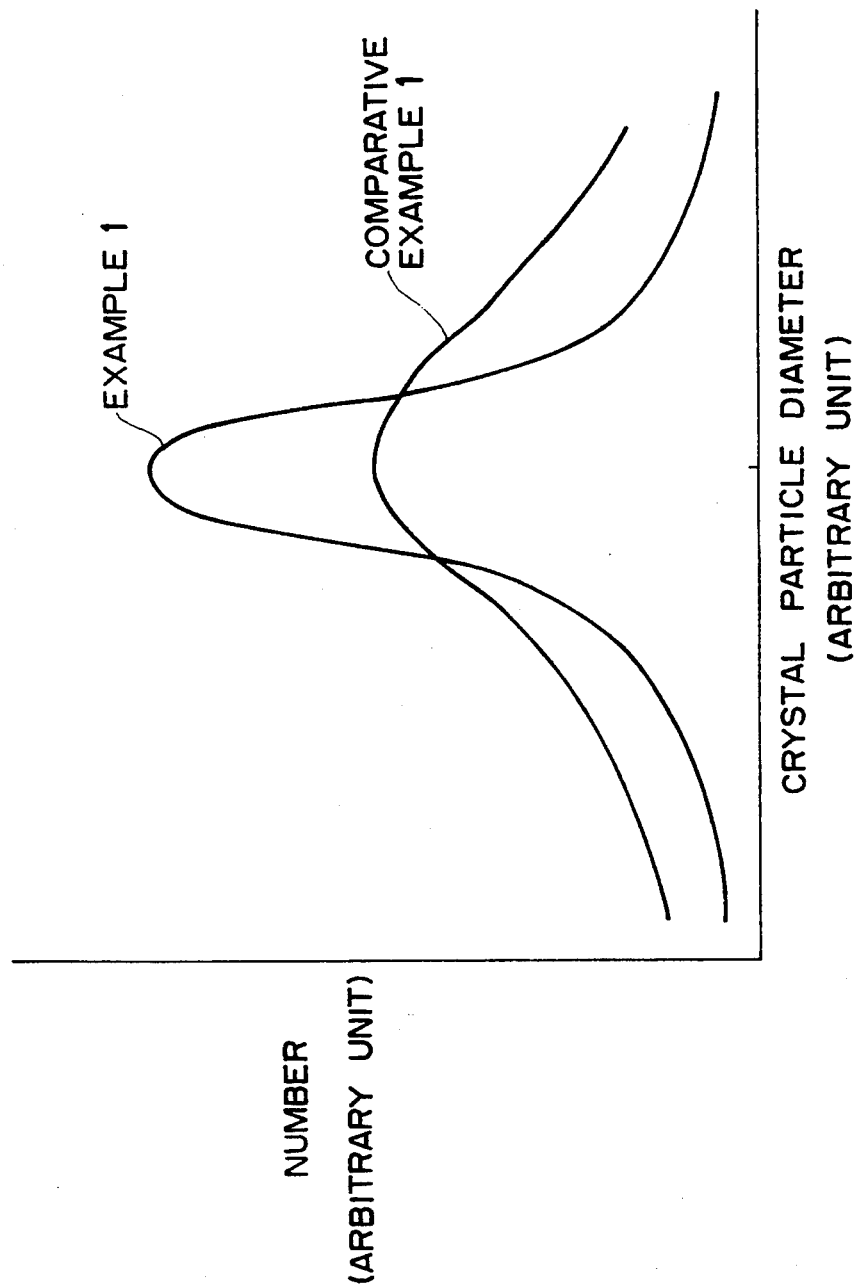
FIG. 5 is a graph showing the crystal particle diameter distributions of silver in the light reflecting layer fabricated in Experiment Examples 1-1 to 1-5 and Comparative Experiment Example 1.

In order to demonstrate the effects of the present invention on the light reflecting layers fabricated as above, the following four evaluation tests were conducted.
1. (Evaluation a) dispersion of crystal particle diameters
2. (Evaluation b) Adherence
3. (Evaluation c) Temperature dependency of crystal particle diameters
4. (Evaluation d) Adherence in the laminated structure 1. (Evaluation a) Dispersion of Crystal Particle Diameters To investigate the dispersion of crystal particle diameters of Ag in the light reflecting layer, its surface was observed using a scanning type electron microscope (SEM) S-530 made by Hitachi, Ltd. to measure the particle diameters of all crystals within a square of 100 $\mu m \times 100$ $\mu m$. The particle diameter distribution of the sample is as shown in FIG. 5, from which it has been seen that the dispersion of crystal particle diameters is much smaller in Experiment Examples 1-1 to 1-5 than in Comparative Experiment Example 1. Also, there was almost no difference between samples in Experiment Examples 1-1 to 1-5.

2. (Evaluation b) Adherence

Figure 6:
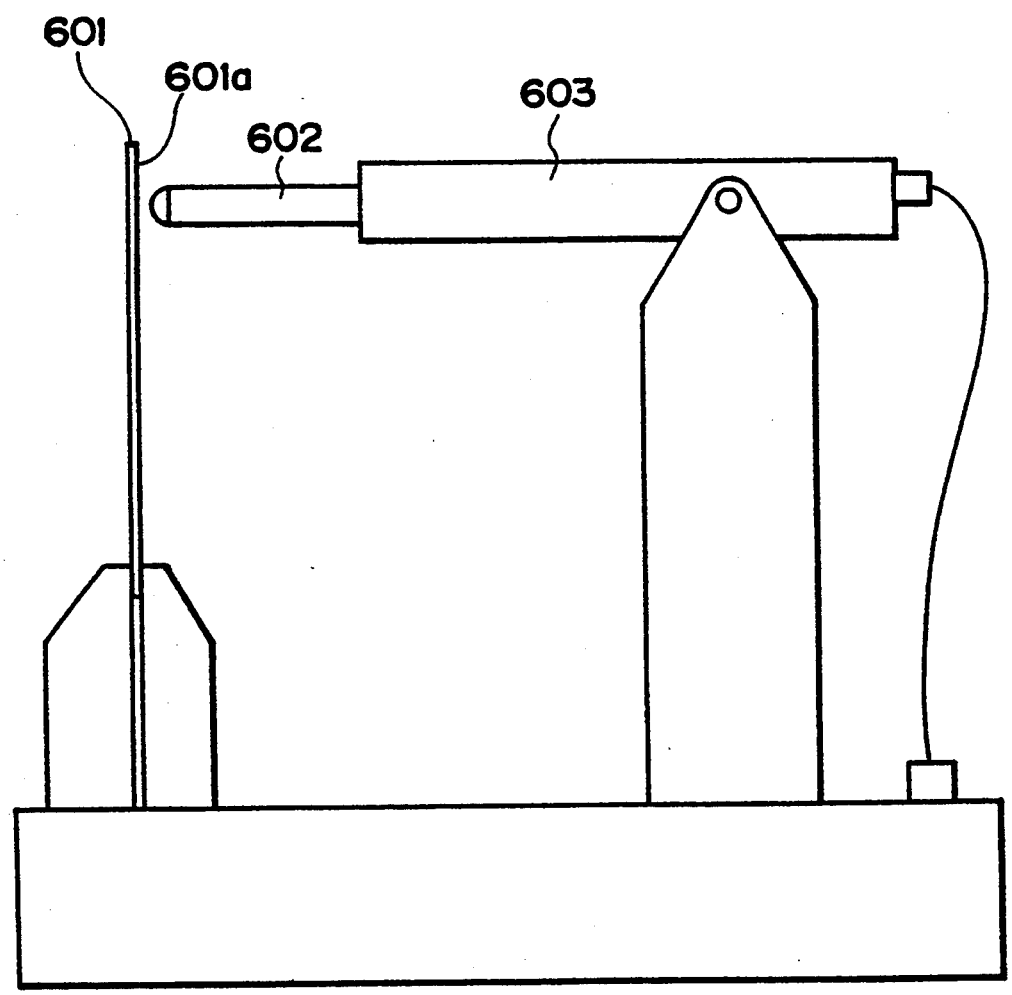
FIG. 6 is a schematic view showing an instrument for performing the bending test.

To investigate the adherence of the light reflecting layer, a bend test for the stainless substrate 601 with the light reflecting layer formed thereon was conducted using a bending tester as shown in FIG. 6. (Condition A) In the figure, the stainless substrate 601 was rigidly secured at the end portion thereof, with a face 601a having the light reflecting layer formed thereon directed to the right, so as to be slightly in contact with the top end of a piston rod 602. Next, compressed air was introduced into air cylinder 603, and adjusted to a pressure such that the extension rate of the piston rod was 1 m/s and the retracting rate was about 1 m/s, with a stroke of 3.0 cm. The bend test was conducted 10,000 times under the normal atmosphere to determine the exfoliation area of the light reflecting layer by using a standard optical microscope. (Condition B) Further, with the face 601a having the light reflecting layer thereon directed to the left, the same bend test was conducted. The results are shown in Table 1.

As will be apparent from the Table, it is seen that the adherence of the light reflecting layer in Experiment Examples 1-1 to 1-5 was remarkably improved over that for Comparative Experiment Example 1.

3. (Evaluation c) Temperature Dependency of Crystal Particle

To investigate the relation between the growth of Ag crystals in the light reflecting layer and the temperature, the stainless substrate with the light reflecting layer formed thereon was annealed by heating, using the apparatus of FIG. 4. First, the stainless substrate with the light reflecting layer formed was mounted on the heater 403, with the light reflecting layer side facing downward, and the deposition chamber 401 was exhausted by a vacuum pump, not shown. Upon the reading of the vacuum gauge 408 reaching approximately $1 \times 10^{-6}$ Torr, the gas introducing valve 412 was gradually opened and adjusted by the mass flow controller 411 so that the Ar gas flow was 100 sccm, and the opening of the conductance valve 409 was adjusted so that the pressure of the deposition chamber 401 was 8 mTorr. Then, electric power was supplied to the heater 403, and adjusted by a temperature controller, not shown, so that the stainless substrate 402 reached 400° C. After annealing for three hours, the supply of electric power to the heater was stopped, the opening of the conductance valve 409 was adjusted so that the pressure of the deposition chamber 401 reached 10 Torr, and the stainless substrate 402 was gradually cooled. When the temperature of the stainless substrate 402 fell to room temperature, the conductance valve was closed, the deposition chamber 401 was leaked, and the stainless substrate was taken out.

The crystal particle diameter of the stainless substrate was then measured using the scanning type electron microscope used in (evaluation a) in the same way. As a result, there was little variation in the crystal particle diameter between samples in Experiment Examples 1-1 to 1-5 by annealing, as shown in FIG. 7A (with average particle diameter of 0.2 $\mu m$). On the other hand, it was found that for the sample of Comparative Experiment Example 1, the crystal particle diameter increased by annealing, as shown in FIG. 7B.

4. (Evaluation d) Adherence in Laminated Structure

To evaluate the adherence in the laminated structure, a light reflection multiplying layer of zinc oxide (ZnO) was fabricated on the light reflecting layer.

First, using a DC magnetron sputtering apparatus as shown in FIG. 8, a light reflecting layer equivalent to those of Experiment Examples 1-1 to 1-5 and Comparative Experiment Example 1 was fabricated on the substrate.

In accordance with similar procedures as in Experiment Example 1-1, shutter 807 was opened to start fabrication of the light reflecting layer of Ag on the substrate 802, and when a light reflecting layer having a layer thickness of 450 nm was formed, the shutter 807 was closed, and the output of the DC power source 806 was shut off to stop the DC glow discharge. Then, the gas introducing valve was closed, and the deposition chamber was sufficiently evacuated again so that the pressure reached $1 \times 10^{-6}$ Torr.

Next, a light reflection multiplying layer of zinc oxide (ZnO) was fabricated on the light reflecting layer of Ag. In the FIG. 818 is a target of zinc oxide (ZnO) having a purity of 99.99%, which was insulated from the deposition chamber 801 by the insulating support member 805. First, the gas introducing valve 810 was gradually opened, and regulated by the mass flow controller 811 so that the Ar gas flow was 30 sccm, and the opening of conductance valve 809 was adjusted so that the pressure of the deposition chamber 801 was 6 mTorr. Thereafter, the DC power source 820 was set at a voltage of −400 V to apply DC power to the target 818 of ZnO to excite a DC glow discharge. After the elapse of five minutes, the shutter 821 was opened to start fabrication of the light reflection multiplying layer of ZnO on the light reflecting layer of Ag, and upon fabricating the light reflection multiplying layer having a layer thickness of 1.0 $\mu m$, the shutter 821 was closed, and the output of DC power source 820 was shut off to stop the DC glow discharge. Next, the mass flow controller 811 was adjusted so that the Ar gas flow reached 100 sccm, the conductance valve 809 was closed, and the deposition chamber 801 was gradually leaked, whereby the fabrication of the light reflection multiplying layer of ZnO was completed.

For the above sample, the adherence was evaluated in the same manner as in (evaluation b). The results are shown in Table 2.

As indicated in Table 2, Experiment Examples 1-1 to 1-5 have less exfoliation than Comparative Experiment Example 1, and exhibit higher adherence in the laminated structure.

EXPERIMENT EXAMPLE 2

A light reflecting layer of Ag of the present invention was fabricated by electron beam (EB) vacuum vapor deposition.

First, using an apparatus for performing the electron beam (EB) vacuum vapor deposition method as shown in FIG. 9, a light reflecting layer of Ag containing oxygen atoms was formed on a substrate.

In the figure, 902 is a stainless substrate used in Experiment Example 1-1, and 904 is a vapor deposition source of Ag having a purity of 99.999%. In the figure 910, 912, 914, and 916 are gas introducing valves, which are respectively connected to a cylinder of argon (Ar) gas (purity 99.9999%), a cylinder of nitrogen ($N_2$/Ar) gas diluted to 50 ppm by argon (Ar) gas, a cylinder of methane ($CH_4$/Ar) gas diluted to 50 ppm by argon (Ar) gas, and a cylinder of oxygen ($O_2$/Ar) gas diluted to 50 ppm by argon (Ar) gas, which are not shown.

First, the deposition chamber 901 was exhausted by a vacuum pump, not shown, and upon the reading of vacuum gauge 908 reaching $1 \times 10^{-6}$ Torr, the gas introducing valve 916 was gradually opened, and regulated by a mass flow controller 917 so that the flow of $O_2$/Ar was 2 sccm, and the opening of conductance valve 909 (butterfly type) was adjusted by observing the vacuum gauge 908 so that the pressure within the deposition chamber 901 was $1 \times 10^{-4}$ Torr. Thereafter, the voltage of a high voltage source 906 connected to an electron gun 905 was adjusted so that the film formation rate reached 2.5 Å/sec. After the elapse of five minutes, the shutter 907 was opened to start fabrication of the light reflecting layer of Ag on the substrate 902, and upon forming the light reflecting layer having a layer thickness of 450 nm, the shutter 907 was closed, and the output of the high voltage source 906 was shut off to stop the EB vacuum vapor deposition. Next, the inflow of $O_2$/Ar gas into the deposition chamber 901 was stopped by closing the gas introducing valve 916, and then the gas introducing valve 910 was opened and regulated by the mass flow controller 911 so that the Ar flow was 100 sccm.

Next, by closing the conductance valve 909, the deposition chamber 901 was gradually leaked, whereby the fabrication of the light reflecting layer of Ag containing oxygen atoms was completed.

COMPARATIVE EXPERIMENT EXAMPLE 2

A conventional light reflecting layer was fabricated in the same way as in Experiment Example 2, except that $O_2$/Ar gas was not flowed into the deposition chamber 901 during the fabrication of light reflecting layer.

In order to demonstrate the effects with the present invention for two light reflecting layers of Ag as above fabricated by vacuum vapor deposition, the same evaluation tests as in Experiment Examples 1-1 to 1-5 were conducted.

Evaluation a

FIG. 10 shows the dispersion of crystal particle diameters of Ag in the light reflecting layer. As will be apparent from the figure, the dispersion of crystal particle diameters (with the average particle diameter of 0.1 μm) is much smaller in the sample of Experiment Example 2 than in the sample of Comparative Experiment Example 2.

Evaluation b

As a result of evaluating the adherence of light reflecting layer, in condition A, it was found that the sample of Experiment Example 2 had only 0.3% of its surface area exfoliated but the sample of Comparative Experiment Example 2 had 2% exfoliation.

Also, in condition B, the sample of Experiment Example 2 had 0.4% of its surface area exfoliated but the sample of Comparative Experiment Example had 2% exfoliation.

Evaluation c

FIGS. 11A and 11B show the temperature dependency measurement result for the crystal particle diameters of Ag in the light reflecting layer. As will be apparent from the figure, the sample of Experiment Example 2 had almost no variation in the crystal particle diameters by annealing, but the sample of Comparative Experiment Example 2 had some increase in the crystal particle diameter.

Evaluation d

To evaluate the adherence in the laminated structure, a light reflection multiplying layer of zinc oxide (ZnO) was fabricated on the light reflecting layer.

First, using an apparatus including both EB vacuum vapor deposition means and DC magnetron sputtering means as shown in FIG. 12, a light reflecting layer of Ag containing oxygen was fabricated on a stainless substrate by EB vacuum vapor deposition. In the figure, 1202 is a stainless substrate, and 1204 is a vapor deposition source of Ag having a purity of 99.999%.

In the figure 1210, 1212, 1214, and 1216 are gas introducing valves, to which the same gas cylinders (not shown) as in FIG. 9 are connected via mass flow controllers 1211, 1213, 1215, and 1217. In accordance with the same procedures as in Experiment Example 2, the deposition chamber 1201 was exhausted by a vacuum pump, not shown, and upon the reading of vacuum gauge 1208 reaching about $1 \times 10^{-6}$ Torr, the gas introducing valve 1216 was gradually opened, and regulated by a mass flow controller 1217 so that the flow of $O_2$/Ar gas was 1 sccm, and the opening of conductance valve 1209 (butterfly type) was adjusted by observing the vacuum gauge 1208 so that the pressure within the deposition chamber 1201 was $1 \times 10^{-4}$ Torr. Thereafter, the voltage of a high voltage source 1206 applied to electron gun 1205 was adjusted so that the film formation rate became 2.5 Å/sec. After the elapse of five minutes, the shutter 1207 was opened to start fabrication of the light reflecting layer on the substrate 1202, and upon fabricating a light reflecting layer having thickness of 450 nm, the shutter 1207 was closed, and the output of high voltage source 1206 was shut off to stop the EB vacuum vapor deposition. Next, the inflow of $O_2$/Ar gas into the deposition chamber 1201 was stopped by closing the gas introducing valve 1216, and the deposition chamber 1201 was evacuated sufficiently so that the pressure thereof was $1\times10^{-6}$ Torr, whereby the fabrication of the light reflecting layer of Ag containing oxygen was completed.

Next, the light reflection multiplying layer of zinc oxide (ZnO) was fabricated on the light reflecting layer of Ag.

In the figure, 1218 is a target of zinc oxide (ZnO) having a purity of 99.99%, which is insulated from the deposition chamber 1201 by the insulating support member 1219. First, the substrate having a light reflecting layer of Ag formed thereon was held at a temperature of 350° C. by heater 1203, then the gas introducing valve 1210 was gradually opened and regulated by a mass flow controller 1211 so that the Ar flow was 20 sccm, and the opening of conductance valve 1209 was adjusted so that the pressure of the deposition chamber 1201 was 5 mTorr. Thereafter, the DC power source 1220 was set at a voltage of −400 V to apply DC power to the target 1218 of ZnO to excite a DC glow discharge.

After five minutes, the shutter 1221 was opened to start fabrication of the light reflection multiplying layer of ZnO on the light reflecting layer of Ag, and upon fabricating a light reflection multiplying layer having a thickness of 1.0 $\mu$m, the shutter 1221 was closed, and the output of DC power source 1220 was shut off to stop the DC glow discharge. Next, the mass flow controller 1211 was adjusted so that the Ar gas flow reached 100 sccm, the conductance valve 1209 was closed, and the deposition chamber 1201 was gradually leaked, whereby the fabrication of the light reflection multiplying layer of ZnO was completed.

Likewise, a light reflection multiplying layer of ZnO equivalent to that as above formed was fabricated on a light reflecting layer of Ag as above formed, without flowing $O_2$/Ar gas into the deposition chamber.

For the laminated structure fabricated as above, the adherence was evaluated by the previously described method. As a result, in condition A, the example of Experiment Example 2 had 0.4% of its surface area exfoliated, but the sample of Comparative Experiment Example 2 had 1.55. Further, in condition B, the sample of Experiment Example 2 had an exfoliation area of 0.5%, but the sample of Comparative Experiment Example 2 had 2.3%.

EXPERIMENT EXAMPLE 3-1

A light reflecting layer of copper containing oxygen was fabricated by the DC magnetron sputtering apparatus as shown in FIG. 4, as in Experiment Example 1-1.

The 300 nm thick light reflecting layer of copper containing oxygen was formed under the same conditions as in Experiment Example 1-1, except that the target was replaced by copper (99.999%), and the flow of $O_2$/Ar gas was changed to 5 sccm with a pressure of 8 mTorr.

EXPERIMENT EXAMPLE 3-1

A light reflecting layer of copper containing nitrogen was fabricated by the DC magnetron sputtering apparatus as shown in FIG. 4, as in Experiment Example 1-1.

The 300 nm thick light reflecting layer of copper containing nitrogen was formed under the same conditions as in Experiment Example 1-1, except that the target was replaced by copper (99.999%), and the flow of $N_2$/Ar gas was changed to 10 sccm with a pressure of 8 mTorr.

EXPERIMENT EXAMPLE 3-3

A light reflecting layer of copper containing carbon was fabricated by the DC magnetron sputtering apparatus as shown in FIG. 4, as in Experiment Example 1-1.

The 300 nm thick light reflecting layer of copper containing carbon was formed under the same conditions as in Experiment Example 1-1, except that the target was replaced by copper (99.999%), and the flow of $CH_4$/Ar gas changed to 10 sccm with a pressure of 8 mTorr.

COMPARATIVE EXPERIMENT EXAMPLE 3

A conventional light reflecting layer was fabricated in the same way as in the Experiment Example 3-1, except that $O_2$/Ar gas was not flowed into the deposition chamber 401 during its fabrication but Ar gas was flowed therein at 35 sccm.

In order to demonstrate the effects of the present invention on the light reflecting layers of Experiment Examples 3-1 to 3-3 and Comparative Experiment Example 3 as fabricated by sputtering, the same evaluation tests as in Experiment Example 1 were conducted.

1. Evaluation a

From the examination of the dispersion in crystal particle diameters of Cu in the light reflecting layer as in Experiment Example 1, it was found that the dispersion in crystal particle diameters is much smaller in the samples of Experiment Examples 3-1 to 3-3 than in the sample of Comparative Experiment Example 3, as shown in FIG. 5.

2. Evaluation b

As a result of evaluation of the adherence of the light reflecting layer, it was found that the film exfoliation area in Experiment Example 3-1 is one-quarter (condition A) or one-fifth (condition B) that of Comparative Experiment Example 3. Also, it was found that the sample of Experiment Example 3-2 had one sixth (conditions A, B), while the sample of Experiment Example 3-3 had one-fifth (condition A) and one-sixth (condition B), that of Comparative Experiment Example 3 and the light reflecting layer of Experiment Example 3 has a higher adherence than the conventional reflecting layers.

3. Evaluation c

The measurement of the temperature dependency of crystal particle diameters of Cu in the light reflecting layer as in Experiment Example 1 showed the same results as in FIGS. 7A and 7B whereby it was found that the samples of Experiment Examples 3-1 to 3-3 have almost no variations in the crystal particle diameters by annealing, but the sample of Comparative Experiment Example 3 has some increase in the crystal particle diameter.

4. Evaluation d

To evaluate the adherence in the laminated structure, a light reflection multiplying layer of zinc oxide (ZnO) was fabricated on the light reflecting layer of Cu.

Using the DC magnetron sputtering apparatus as shown in FIG. 8, a 300 nm thick light reflecting layer of copper was fabricated under the same conditions as in Experiment Examples 3-1 to 3-3 and Comparative Experiment Example 3, with the exception that the substrate temperature was set at 350° C., and the respective light reflection multiplying layers were formed 1.0 $\mu$m thick.

The light reflection multiplying layer was formed using a target 818 of ZnO having a purity of 99.99% and a DC power of −400 V was applied to the target 818 of ZnO at a substrate temperature of 350° C., with an Ar gas flow of 25 sccm and under a pressure of deposition chamber 801 of 5 mTorr, to excite a DC glow discharge.

The evaluation of the adherence of the above sample by the same method as in (evaluation b) showed that the film exfoliation area of the sample in Experiment Examples 3-1 was 1/5 that of the sample in Comparative Experiment Example 3 in both conditions A and B. Also, for Experiment Example 3-2 it was 1/6 (condition A), 1/7 (condition B), while for the sample of Experiment Example 3-3 it was 1/6 (conditions A, B). Consequently, the light reflecting layer of this experiment example has a higher adherence than the conventional reflecting layers, even in the laminated structure.

EXPERIMENT EXAMPLE 4-1

A light reflecting layer of Cu of the present invention was fabricated by electron beam (EB) vacuum vapor deposition.

Using a manufacturing apparatus with the electron beam (EB) a vacuum vapor deposition means as shown in FIG. 9, a light reflecting layer of copper (Cu) containing oxygen was fabricated on a stainless substrate.

The 300 nm thick light reflecting layer containing oxygen was fabricated as in Experiment Example 2 with the exception that copper (Cu) having a purity of 99.999% was used, and the $O_2/Ar$ gas flow was 1 sccm.

EXPERIMENT EXAMPLE 4-2

Using a manufacturing apparatus with the electron beam (EB) vacuum vapor deposition means as shown in FIG. 9, a light reflecting layer of copper (Cu) containing nitrogen was fabricated on a stainless substrate.

The 300 nm thick light reflecting layer containing nitrogen was fabricated as in Experiment Example 4-1 with the exception that copper (Cu) having a purity of 99.999% was used, and the $N_2/Ar$ gas flow was 2 sccm.

EXPERIMENT EXAMPLE 4-3

Using a manufacturing apparatus with the electron beam (EB) vacuum vapor deposition means as shown in FIG. 9, a light reflecting layer of copper (Cu) containing carbon was fabricated on the stainless substrate.

The 300 nm thick light reflecting layer containing carbon was fabricated as in Experiment Example 4-1 with the exception that copper (Cu) having a purity of 99.999% was used, and the $CH_4/Ar$ gas flow was 2 sccm.

COMPARATIVE EXPERIMENT EXAMPLE 4

A conventional light reflecting layer was fabricated as in Experiment Example 4-1, except that $O_2/Ar$ gas was not flowed into the deposition chamber 901.

In order to demonstrate the effects with the present invention for light reflecting layers of Cu as above fabricated by vacuum vapor deposition, the same evaluation tests as in Experiment Example 1 were conducted.

1. Evaluation a

The examination of the dispersion of crystal particle diameters of Cu in the light reflecting layer showed the same results as shown in FIG. 10, from which it is seen that the dispersion in crystal particle diameters is much smaller in the samples of Experiment Examples 4-1 to 4-3 than in the sample of Comparative Experiment Example 4.

2. Evaluation b

As a result of evaluation of the adherence of the light reflecting layer, it was found that the film exfoliation area of the sample in Experiment Example 4-1 is one-quarter (condition A, B) that of Comparative Experiment Example 4. Also, it was found that for the sample of Experiment Example 4-2 it was 1/6 (condition A), and 1/7 (condition B), while for the sample of Experiment Example 4-3 it was 1/5 (condition A, B), and the light reflecting layer of this experiment example has a superior adherence.

3. Evaluation c

The measurement of the temperature dependency on crystal particle diameters of Cu in the light reflecting layer showed the same results as shown in FIG. 11, whereby it was found that the samples of Experiment Examples 4-1 to 4-3 have almost no changes in the crystal particle diameters by annealing, but the sample of Comparative Experiment Example 4 has an increase in the crystal particle diameters.

4. Evaluation d

To evaluate the adherence of light reflecting film in the laminated structure, a light reflection multiplying layer of zinc oxide (ZnO) was fabricated on the light reflecting layer of Cu.

For the fabrication of the laminate, an apparatus with the combination of the EB vacuum vapor deposition means and the DC magnetron sputtering means as shown in FIG. 12 was used. First, the 300 nm thick light reflecting layer of Cu containing oxygen, nitrogen, or carbon was fabricated under the same conditions as those for the light reflecting film in Experiment Examples 4-1 to 4-3, and subsequently the 1 μm thick light reflection multiplying layer was fabricated under the same conditions as those for ZnO formed in Experiment Example 3 (evaluation d).

The evaluation of the adherence of the laminated structure as fabricated in the above way was then made. As a result, it was found that Experiment Example 4-1 involves ¼ the film exfoliation area of the sample (conditions A, B) compared to that of Comparative Experiment Example 4, for Experiment Example 4-2 it was 1/7 (condition A) and ⅛ (condition B) and for Experiment Example 4-3 it was 1/6 (conditions A, B). Thus, the light reflecting film of this experiment example has a higher adherence even in the laminated structure.

EXPERIMENT EXAMPLE 5

Using the DC magnetron sputtering apparatus of FIG. 4, a light reflecting layer of silver containing lead, lead and gold, or lead and a first transition group metal was fabricated.

Targets of silver with a purity of 99.999% were used containing 20 ppm of lead (Experiment Example 5-1), 20 ppm of lead and gold (Experiment Example 5-2), and 20 ppm of lead, gold, and a first transition group metal (iron, chromium or nickel) (Experiment Examples 5-3-1 to 5-3-3), and the 300 cm thick light reflecting film was fabricated under the same conditions as in Experiment Example 1 with the exception that a sputtering gas of Ar was flowed at 40 sccm with a pressure of 5 mTorr.

COMPARATIVE EXPERIMENT EXAMPLE 5

For comparison, a conventional light reflecting layer was fabricated as in Experiment Example 5-1, except that a target of Ag with a purity of 99.999% not containing added element(s) was employed.

For an obtained sample, the same evaluations as in Experiment Example 1 were made. The results are listed in Table 3.

1. Evaluation a

The examination of the dispersion of crystal particle diameters of Ag in the light reflecting layer as in Experiment Example 1 showed the same results as shown in FIG. 5, and from the half-value width of the particle diameter distribution as listed in Table 3, it was found that the dispersion in crystal particle diameters is much smaller in the sample of this experiment example than in the sample of Comparative Experiment Example 5.

2. Evaluation b

As a result of evaluation of the adherence of the light reflecting layer in condition A as listed in Table 3, it was found that the film exfoliation area of the sample in this experiment example is much smaller than that in Comparative Experiment Example 5. Thus, the light reflecting layer of this experiment example has a higher adherence than the conventional reflecting layers.

3. Evaluation c

The measurement of the temperature dependency of crystal particle diameters of Ag in the light reflecting layer as in Experiment Example 1 showed that the sample of Comparative Experiment Example 3 had an increase in crystal particle diameters by annealing, while the sample of this experiment example had almost no change in the crystal particle diameters, as shown in Table 3.

4. Evaluation d

To evaluate the adherence in the laminated structure, a light reflection multiplying layer of zinc oxide (ZnO) was fabricated on the light reflecting layer of Ag, and the same test as in evaluation b was conducted.

For preparing the sample, using the DC sputtering apparatus of FIG. 8, the 300 nm thick light reflecting layer was fabricated under the same conditions as in Experiment Examples 5-1 to 5-3-3 and Comparative Experiment Example 5, and subsequently the 2 μm thick light reflecting multiplying layer of ZnO was fabricated. In this experiment example, an $O_2$ cylinder was attached instead of the $O_2$/Ar gas cylinder.

The fabrication of the light reflection multiplying layer was performed using a target 818 of ZnO with a purity of 99.99%, and a DC power of −450 V was applied to the target 818 of ZnO at a substrate temperature of 350° C., with an Ar gas flow of 25 sccm and an $O_2$ gas flow of 0.2 sccm, and under a pressure within the deposition chamber 801 of 5 mTorr, to excite a DC glow discharge.

The evaluation results listed in Table 3 indicated that the light reflecting film of this experiment example had a significantly high adherence in the laminated structure.

TABLE 3

| Sample | Contained atom | Evaluation a Half value width | Evaluation b Film exfoliation | Evaluation c Change in half value width | Evaluation d Film exfoliation area |
|---|---|---|---|---|---|
| Experiment example 5-1 | Pb | 0.82 | 0.1% | 0.51 | 0.1% |
| Experiment example 5-2 | Pb, Au | 0.83 | 0.08% | 0.52 | 0.08% |
| Experiment example 5-3-1 | Pb, Au, Ni | 0.72 | 0.05% | 0.29 | 0.04% |
| Experiment example 5-3-2 | Pb, Au, Cr | 0.79 | 0.05% | 0.38 | 0.05% |
| Experiment example 5-3-3 | Pb, Au, Fe | 0.85 | 0.07% | 0.49 | 0.06% |
| Comparative Experiment example 5 | None | 1.00 | 1.00% | 1.00 | 1.00% |

EXPERIMENT EXAMPLE 6

Using the EB heating vacuum vapor deposition apparatus of FIG. 9, light reflecting layers of silver containing lead, lead and gold, and lead, gold, and a first transition group metal were fabricated.

A vapor deposition source of silver with a purity of 99.999% was used containing 20 ppm of lead (Experiment Example 6-1), containing 20 ppm of lead and gold (Experiment Example 6-2), and containing 20 ppm of lead, gold, and a first transition group metal (iron, chromium or nickel) (Experiment Examples 6-3-1 to 6-3-3). The 300 cm thick light reflecting film was fabricated at a film formation rate of 2.5 Å/sec.

COMPARATIVE EXPERIMENT EXAMPLE 6

For comparison, a light reflecting layer was fabricated as in the experiment example 6, except that a vapor deposition source with a purity of 99.999% not containing added element(s) was fabricated.

For the obtained sample, the same evaluation as in Experiment Example 1 was made. The results are listed in Table 4.

TABLE 4

| Sample | Contained atom | Evaluation a Half value width | Evaluation b Film exfoliation | Evaluation c Change in half value width | Evaluation d Film exfoliation area |
|---|---|---|---|---|---|
| Experiment example 6-1 | Pb | 0.89 | 0.1% | 0.46 | 0.2% |
| Experiment example 6-2 | Pb, Au | 0.88 | 0.08% | 0.45 | 0.17% |
| Experiment example 6-3-1 | Pb, Au, Ni | 0.75 | 0.04% | 0.27 | 0.09% |
| Experiment example 6-3-2 | Pb, Au, Cr | 0.78 | 0.06% | 0.34 | 0.13% |
| Experiment example 6-3-3 | Pb, Au, Fe | 0.83 | 0.07% | 0.41 | 0.15% |
| Comparative Experiment example 6 | None | 1.00 | 2.00% | 1.00 | 2.30% |

1. Evaluation a

The examination of the dispersion in crystal particle diameters of Ag in the light reflecting layer as in Experiment Example 1 showed the same results as in FIG. 10, and from the half-value width of the particle diameter distribution as listed in Table 4, it was found that the dispersion in crystal particle diameters is much smaller in the sample of this experiment example than in the sample of Comparative Experiment Example 6.

2. Evaluation b

As a result of evaluation of the adherence of the light reflecting layer in condition A as listed in Table 4, it was found that the film exfoliation area of the sample in this experiment example is much smaller than that in Comparative Experiment Example 6, and the light reflecting layer of this experiment example has a higher adherence than the conventional reflecting layers.

3. Evaluation c

The measurement of the temperature dependency of crystal particle diameters of Ag in the light reflecting layer as in Experiment Example 1 showed that all samples of this experiment example had almost no changes in the crystal particle diameters by annealing, while the sample of the Comparative Experiment Example 6 had an increase in the crystal particle diameter, as shown in Table 4.

4. Evaluation d

To evaluate the adherence in the laminated structure, a light reflection multiplying layer of zinc oxide (ZnO) was fabricated on the light reflecting layer of Ag, and the same test as in evaluation b was conducted.

For fabricating the sample, using the apparatus of FIG. 12, the 300 nm thick light reflecting layer was first fabricated by EB vacuum vapor deposition under the same conditions as in Experiment Examples 6-1 to 6-3-3 and Comparative Experiment Example 6, and subsequently the 1 $\mu$m thick light reflecting layer of ZnO was fabricated by sputtering.

The fabrication of light reflection multiplying layer was performed in using a target 1218 of ZnO with a purity of 99.99% with a DC power of $-450$ V applied to the target 1218 at a substrate temperature of 350° C., with an Ar gas flow of 25 sccm, and under a pressure within the deposition chamber 1201 of 5 mTorr, to excite a DC glow discharge.

The evaluation results indicated that the light reflecting film of this experiment example had a significantly higher adherence in the laminated structure as listed in Table 4.

EXAMPLES OF EMBODIMENTS

The present invention will be described in more detail by way of example, but is not limited to such examples.

Embodiment 1

By means of the DC magnetron sputtering method and the microwave ($\mu$W) glow discharge decomposition method, a photovoltaic element having the construction shown in FIG. 1 was fabricated.

Using the DC magnetron sputtering apparatus as shown in FIG. 8, a 450 nm thick light reflecting layer of Ag containing oxygen and a 1 $\mu$m thick light reflection multiplying layer were fabricated on a substrate made of stainless (SUS430), with its surface polished specularly, 50 mm square and 0.2 mm thick, in the same way as in Experiment Example 1-1.

Subsequently, using the $\mu$W glow discharge decomposition apparatus comprised of a source gas supply unit 1320 and a deposition unit 1300 as shown in FIG. 13, a non-single crystal silicon type semiconductor layer was fabricated on the light reflection multiplying layer.

Gas cylinders 1371 to 1376 in the figure were filled with source gases for creating the non-single crystal silicon type semiconductor layer of the present invention, wherein 1371 is a cylinder of $SiH_4$ gas (purity 99.999%), 1372 is a cylinder of $H_2$ gas (purity 99.999%), 1373 is cylinder of $PH_3$ gas (purity 99.99%, hereinafter abbreviated as "$PH_3/H_2$") diluted to 10% by $H_2$ gas, 1374 is a cylinder of $B_2H_6$ gas (purity 99.99%, hereinafter abbreviated as "$B_2H_6/H_2$") diluted to 10% by $H_2$ gas, 1375 is a cylinder of $CH_4$ gas (purity 99.9999%), and 1376 is a cylinder of $GeH_4$ gas (purity 99.99%). Also, by attaching gas cylinders 1371 to 1376, the gases were introduced through respective gas pipes leading from the valves 1351 to 1356 to the inflow valves 1331 to 1336.

In the figure, 1304 is a substrate on which the light reflecting layer and the light reflection multiplying layer are fabricated by the previously described method.

First, $SiH_4$ gas from the gas cylinder 1371, $H_2$ gas from the gas cylinder 1372, $PH_3/H_2$ gas from the gas cylinder 1373, $B_2H_6/H_2$ gas from the gas cylinder 1374, $CH_4$ gas from the gas cylinder 1375, and $GeH_4$ gas from the gas cylinder 1376 were introduced by opening the valves 1351 to 1356, and regulated by pressure regulators 1361 to 1366 so that each gas pressure was about 2 $Kg/cm^2$.

Next, after confirming that the inflow valves 1331 to 1336 and leak valve 1309 within the deposition chamber 1301 were closed, and that the outflow valves 1341 to 1346 and an auxiliary valve 1308 were open, a conductance (butterfly type) valve 1307 was fully opened to evacuate the deposition chamber 1301 and the gas pipe by a vacuum pump, not shown, and the outflow valves 1341 to 1346 were closed when the reading of the vacuum gauge 1306 reached about $1 \times 10^{-4}$ Torr.

Next, the inflow valves 1331 to 1336 were gradually opened to feed the respective gases into the mass flow controllers 1321 to 1326.

After the above preparation for the film formation was completed, an n-type layer, an i-type layer, and a p-type layer were formed on the substrate 1304.

To create the n-type layer, the substrate 1304 was heated to 350° C. by heater 1305, the outflow valves 1341 to 1343 were gradually opened and regulated by respective mass flow controllers 1321 to 1323 so that the $SiH_4$ gas flow, the $H_2$ gas flow, and the $PH_3/H_2$ gas flow were 30 sccm, 100 sccm, and 6 sccm, respectively. The opening of conductance valve 1307 was adjusted by observing the vacuum gauge 1306 so that the pressure within the deposition chamber 1301 was 10 mTorr. Thereafter, with $\mu$W power source, not shown, set at 50 $mW/cm^3$, $\mu$W electric power was introduced through the waveguide, not shown, the waveguide portion 1310 and the dielectric window 1302 into the deposition chamber 1301 to excite a $\mu$W glow discharge, and start formation of the n-type layer on the light reflection multiplying layer. Upon depositing an n-type layer having a thickness of 10 nm, the $\mu$W glow discharge was stopped, and the outflow valves 1341 to 1343 and the auxiliary valve 1308 were closed to stop the gas inflow into the deposition chamber 1301, whereby the formation of the n-type layer was completed.

Next, to form the i-type layer, the substrate 1304 was heated to 350° C. by the heater 1305, and the outflow valves 1341, 1342 were gradually opened to flow $SiH_4$ gas and $H_2$ gas respectively through the gas introducing tube 1303 into the deposition chamber 1301. Then, they were regulated by respective mass flow controllers 1321, 1322 so that the $SiH_4$ gas flow and the $H_2$ gas flow were 100 sccm and 200 sccm, respectively. The opening of conductance valve 1307 was adjusted by observing the vacuum gauge 1306 so that the pressure within the deposition chamber 1301 was 5 mTorr. Next, the RF bias of bias power source was set at 100 $mW/cm^3$ and the DC bias was set at 75 V with respect to the substrate 1304 for the application to the bias rod 1312. Thereafter, with the μW power source, not shown, set at 100 mW/cm³, μW electric power was introduced through the waveguide, not shown, the waveguide portion 1310, and the dielectric window 1302 into the deposition chamber 1301 to excite a μW glow discharge, and start formation of an i-type layer on the n-type layer. Upon depositing an i-type layer having a thickness of 400 nm, the μW low discharge was stopped, and the output of bias power source 1311 was shut off, whereby the formation of the i-type layer was completed.

To form the p-type layer, the substrate 1304 was heated to 300° C. by the heater 1305, the outflow valves 1341, 1342, 1344 were gradually opened to flow SH₄ gas, H₂ gas, and B₂H₆/H₂ gas, respectively, through the gas introducing tube 1303 into the deposition chamber 1301. Then, they were regulated by respective mass flow controllers 1321, 1322, 1324 so that the SiH₄ gas flow, the H₂ gas flow and the B₂H₆/H₂ gas flow were 10 sccm, 100 sccm, and 5 sccm, respectively. The opening of conductance valve 1307 was adjusted by observing the vacuum gauge 1306 so that the pressure within the deposition chamber 1301 was 20 mTorr. Thereafter with the μW power source set at 400 mW/cm³, μW electric power was introduced through the waveguide, not shown, the waveguide portion 1310, and the dielectric window 1302 into the deposition chamber 1301 to excite a μW glow discharge, and start formation of a p-type layer on the i-type layer. Upon depositing a p-type layer having a thickness of 5 nm, the μW glow discharge was stopped, and the outflow valves 1341, 1342, 1344 and the auxiliary valve 1308 were closed to stop the gas inflow into the deposition chamber 1301, whereby the formation of the p-type layer was completed.

The outflow valves 1341 to 1346, except for the times of introducing necessary gases, are fully closed during the forming of the respective layers, and in order to avoid gases remaining within the deposition chamber 1301 and the pipes leading form the outflow valves 1341 to 1346 to the deposition chamber 1301, the system may be kept under a high vacuum, as required, by closing the outflow valves 1341 to 1346, opening the auxiliary valve 1308, and further fully opening the conductance valve 1307.

Next, an 80 nm thick transparent electrode of ITO (In₂O₃+SnO₂) was vapor deposited on the p-type layer, and a 1 μm thick collector electrode of Cr was vapor deposited in a vacuum to fabricate a photovoltaic element (Element Example 1). The fabrication conditions for the photovoltaic element are listed in Table 5.

TABLE 5

| Substrate | SUS430BA, 50 mm square, 0.33 mm thick |
|---|---|
| Light reflecting layer | |
| Target | Ag (99.999%) |
| Fabrication conditions | O₂/Ar gas flow: 2 sccm |
| | Ar gas flow: 10 sccm |
| | Internal pressure: 6 mTorr |
| | Substrate temperature: RT |
| | DC voltage: 400 V |
| | Layer thickness: 450 nm |
| Light reflection multiplying layer | |
| Target | ZnO (99.99%) |
| Fabrication conditions | Ar gas flow: 30 sccm |
| | Internal pressure: 6 mTorr |
| | Substrate temperature: 350° C. |

TABLE 5-continued

DC voltage: 400 V
Layer thickness: 1 μm

| Layer | Gases used (sccm) bias, V | μW power (mW/cm³) | Pressure (mTorr) | Substrate temperature (°C.) | Layer thickness (nm) |
|---|---|---|---|---|---|
| Semiconductor layer fabrication conditions | | | | | |
| n-type | SiH₄: 30 H₂: 100 PH₃/H₂ (10%): 6 | 50 | 10 | 350 | 10 |
| i-type | SiH₄: 100 H₂: 200 RF: 100 mW/cm³ DC: 75 V | 100 | 5 | 350 | 400 |
| p-type | SiH₄: 10 H₂: 100 B₂H₆ (10%): 5 | 400 | 20 | 300 | 5 |
| Transparent electrode | ITO 80 nm | | | | |
| Collector electrode | Cr 1 μm | | | | |

COMPARATIVE EXAMPLE 1

A conventional photovoltaic element was fabricated by the same method as in Example 1.

First, using a DC magnetron sputtering apparatus as shown in FIG. 8, a 450 nm thick light reflecting layer of Ag not containing oxygen was formed on the substrate as in Comparative Experiment Example 1.

Next, a light reflection multiplying layer, an n-type layer, an i-type layer, a p-type layer, a transparent electrode, and a collector electrode were formed on the light reflecting layer under the same formation conditions as in Example 1 to fabricate a photovoltaic element (Element Comparative Example 1).

To demonstrate the effects of the present invention on the photovoltaic elements as above fabricated in Example 1 and Comparative Example 1, the following three evaluations were conducted.

1. (A) Initial characteristics
2. (B) Adherence dependency of the characteristics
3. (C) Environmental variation dependency of the characteristics 1. (A) Initial Characteristics To investigate the initial characteristics of the photovoltaic elements as a solar cells the photovoltaic element was subjected to illumination of AM-1.5 (100 mW/cm²) light to measure the V-I characteristics and thus evaluate the photoelectric conversion efficiency. The results are shown in Table 6.

TABLE 6

| | Oxygen in reflective layer | Initial characteristic | After adherence test | After environmental test |
|---|---|---|---|---|
| Element example 1 | Present | 1.04 | 1.05 | 1.08 |
| Element comparative example 1 | None | 1.00 | 1.00 | 1.00 |

As indicated by Table 6, the conversion efficiency of the photovoltaic element in Example 1 was 1.04 times greater than that of the photovoltaic element in Comparative Example 1, whereby it is seen that the photovoltaic element using the light reflecting layer containing oxygen of the present invention has better characteristics than that using the conventional light reflecting layer.

2. (B) Adherence Dependency of the Characteristics

To investigate the adherence dependency of the solar cell characteristics of the photovoltaic element, as in the experiment examples, a bend test for a stainless substrate 601 with the light reflecting layer deposited thereon was conducted using a bending tester as shown in FIG. 6.

For determining the characteristics, the photovoltaic conversion efficiency was measured as previously described. Then, the stainless substrate 601 was tightly secured at the end portion thereof, with the face 601a with the photovoltaic element deposited thereon directed to the right, so as to be slightly in contact with the top end of piston rod 602. Next, compressed air was introduced into an air cylinder 603, and adjusted to have a pressure such that the extension rate of the piston rod was about 1 m/s, and the retracting rate was about 1 m/s, with a stroke of 3.0 cm. The bend test was conducted 10,000 times under normal atmosphere and the photoelectric conversion efficiency under illumination of AM-1.5 light was measured again. The measurement results are summarized in Table 6.

From these results, it is seen that the photovoltaic conversion efficiency of the photovoltaic element in Example 1 is 1.05 times greater than that of the photovoltaic element in Comparative Example 1, whereby it has been determined that the photovoltaic element of the invention using a light reflecting layer containing oxygen provides better durability that the conventional photovoltaic element.

3. (C) Environmental Variation Dependency of the Characteristics

The photovoltaic elements as fabricated in Example 1 and Comparative Example 1 were placed in the dark at a temperature of 85° C. and a relative humidity of 85%, and a heat cycle of a temperature of 85° C. for four hours and a temperature of −40° C. for thirty minutes was repeated 30 times to examine the variation in photoelectric conversion efficiency. The results are listed in Table 6.

As is clear from Table 6, the photovoltaic element in Example 1 has less reduction in photoelectric conversion efficiency in the heat cycle, and is 1.08 times better in the environmental resistance than the photovoltaic element in Comparative Example 1.

From the above evaluation tests, it has been found that the photovoltaic element of the present invention using the light reflecting layer containing oxygen has better environmental resistance characteristics than the conventional photovoltaic element, whereby the beneficial effects of the present invention have been evidenced.

EXAMPLE 2

Using a DC magnetron sputtering apparatus, a photovoltaic element was fabricated in the same way as in Example 1, except that a 0.3 μm thick light reflecting layer containing nitrogen and oxygen was formed on an SUS substrate, as in Experiment Example 1-4. For the obtained photovoltaic element, the same evaluation as in Example 1 was conducted. The results are listed in Table 7.

TABLE 7

| | Additives(s) | Initial characteristic | After adherence test | After environmental test |
| --- | --- | --- | --- | --- |
| Element example 2 | N, O | 1.06 | 1.07 | 1.10 |
| Element example 3 | N, C, O | 1.07 | 1.10 | 1.12 |
| Element comparative example 1 | None | 1.00 | 1.00 | 1.00 |

EXAMPLE 3

Using the DC magetron sputtering apparatus of FIG. 8, a photovoltaic element as fabricated in the same way as in Example 1, except that a 0.3 μm thick light reflecting layer containing oxygen, nitrogen and carbon was formed on an SUS substrate, as in Experiment Example 1-5. For this element, the evaluation results are listed in Table 7.

As is clear from Table 7, the photovoltaic elements of Examples 2 and 3 are better not only in the initial characteristics, but also in the durability and the environmental resistance, than the element of Comparative Example 1. Also, by comparison with Example 1, it has been found that two or more kinds of additives in Ag can offer better characteristics.

EXAMPLE 4

By means of the DC magnetron sputtering method and the RF glow discharge decomposition method, a photovoltaic element of the present invention was fabricated.

First, using the DC magnetron sputtering apparatus of FIG. 8, a 450 nm thick light reflecting layer of Ag containing oxygen and a 1 μm thick light reflection multiplying layer were fabricated on the substrate under the same fabrication conditions as in Example 1.

Subsequently, using the RF glow discharge decomposition apparatus comprised of a source gas supply unit 1320 and a deposition unit 1400 as shown in FIG. 14, a non-single crystal silicon type semiconductor layer was fabricated on the light reflection multiplying layer.

In the figure, 1404 is a substrate with the light reflection multiplying layer and the light reflecting layer as above described formed thereon.

Gas cylinders 1371 to 1376 in the figure were prefilled with the same source gases as in Example 1, and introduced through respective mass flow controllers 1321 to 1326 in accordance with the same operational procedure as in Example 1.

After the preparations for film formation had been completed, an n-type layer, an i-type layer, and a p-type layer were formed on the substrate 1404.

To create the n-type layer, the substrate 1404 was heated to 300° C. by the heater 1405, the outflow valves 1341 to 1343 and the auxiliary valve 1408 were gradually opened to flow $SiH_4$ gas, $H_2$ gas, and $PH_3$ gas through the gas introducing tube 1403 into the deposition chamber 1401. Then, they were regulated by respective mass flow controllers 1321 to 1323 so that $SiH_4$ gas flow, $H_2$ gas flow, and $PH_3/H_2$ gas flow were 2 sccm, 20 sccm, and 1 sccm, respectively. The opening of conductance valve 1407 was adjusted by observing the vacuum gauge 1406 so that the pressure within the deposition chamber 1401 was 1 Torr. Thereafter, with the RF power source, not shown, set at 5 mW/cm$^3$, RF electric power was introduced through RF matching box 1412 into cathode 1402 to excite an RF glow discharge, and start formation of an n-type layer on the light reflection multiplying layer. Upon depositing an n-type layer having a thickness of 10 nm, the RF glow discharge was stopped, and the outflow valves 1341 to 1343 were closed to stop gas inflow into the deposition chamber 1401, whereby the formation of the n-type layer was completed.

Next, to form the i-type layer, the substrate 1404 was heated to 300° C. by the heater 1405, the outflow valves 1341, 1342 were gradually opened to flow SiH$_4$ gas and H$_2$ gas respectively through the gas introducing tube 1403 into the deposition chamber 1401. Then, they were regulated by respective mass flow controllers 1321, 1322 so that the SiH$_4$ gas flow and H$_2$ gas flow were 2 sccm and 20 sccm, respectively. The opening of conductance valve 1407 was adjusted by observing the vacuum gauge 1406 so that the pressure within the deposition chamber 1401 was 1 Torr. Next, with the RF power source, not shown, set at 5 mW/cm$^3$, RF electric power was introduced through the RF matching box 1412 into the cathode 1402 to excite an RF glow discharge, and start formation of an i-type layer on the n-type layer. Upon depositing an i-type layer having a layer thickness of 400 μm, the RF glow discharge was stopped, whereby the formation of the i-type layer was completed.

Then, to form the p-type layer, the substrate 1404 was heated to 250° C. by the heater 1405, the outflow valves were gradually opened to flow SiH$_4$ gas, H$_2$ gas, and B$_2$H$_6$/H$_2$ gas, respectively, through the gas introducing tube 1403 into the deposition chamber 1401. Then, there were regulated by respective mass flow controllers 1321, 1322, 1324 so that SiH$_4$ gas flow, H$_2$ gas flow, and B$_2$H$_6$/H$_2$ gas flow were 2 sccm, 50 sccm and 1 sccm, respectively. The opening of conductance valve 1407 was adjusted by observing the vacuum gauge 1406 so that the pressure within the deposition chamber 1401 was 1 Torr. Thereafter, with the RF power source, not shown, set at 200 mW/cm$^3$, RF electric power was introduced through the RF matching box 1412 into the cathode 1402 to excite an RF glow discharge, and start formation of a p-type layer on the i-type layer. Upon depositing a p-type layer having a layer thickness of 5 nm, the RF glow discharge was stopped, and the outflow valves 1341, 1342, 1344 and the auxiliary valve 1408 were closed to stop gas inflow into the deposition chamber 1401, whereby the formation of the p-type layer was completed.

The outflow valves 1341 to 1346 except for the times of introducing necessary gases are fully closed during forming of the respective layers, and in order to avoid gases remaining within the deposition chamber 1301 and the pipes leading from the outflow valves 1341 to 1346 to the deposition chamber 1301, the system may be kept in a high vacuum as required, by closing the outflow valves 1341 to 1346, opening the auxiliary valve 1408, and further fully opening the conductance valve 1407.

Next, an 80 nm thick transparent electrode of ITO (In$_2$O$_3$+SnO$_2$) was vapor deposited on the p-type layer, and a 1 μm thick collector electrode of Cr was vacuum vapor deposited to fabricate a photovoltaic element (Element Example 4). The fabrication conditions for the photovoltaic element are listed in Table 8.

TABLE 8

| Substrate | SUS430BA, 50 mm square, 0.2 mm thick |
|---|---|
| Light reflecting layer | |
| Target | Ag (99.999%) |
| Fabrication conditions | O$_2$/Ar gas flow: 2 sccm |
| | Ar gas flow: 10 sccm |
| | Internal pressure: 6 mTorr |
| | Substrate temperature: RT |
| | DC voltage: 400 V |
| | Layer thickness: 450 nm |
| Light reflection multiplying layer | |
| Target | ZnO (99.99%) |
| Fabrication conditions | Ar gas flow: 30 sccm |
| | Internal pressure: 6 mTorr |
| | Substrate temperature: 350° C. |
| | DC voltage: 400 V |
| | Layer thickness: 1 μm |

| Layer | Gases used (sccm) | RF power (mW/cm$^3$) | Pressure (mTorr) | Substrate temperature (°C.) | Layer thickness (nm) |
|---|---|---|---|---|---|
| Semiconductor layer fabrication conditions | | | | | |
| n-type | SiH$_4$: 2<br>H$_2$: 20<br>PH$_3$/H$_2$ (10%): 1 | 5 | 1 | 300 | 10 |
| i-type | SiH$_4$: 2<br>H$_2$: 20 | 5 | 1 | 300 | 400 |
| p-type | SiH$_4$: 2<br>H$_2$: 50<br>B$_2$H$_6$ (10%): 1 | 200 | 1 | 250 | 5 |
| Transparent electrode | ITO 80 nm | | | | |
| Collector electrode | Cr 1 μm | | | | |

COMPARATIVE EXAMPLE 2

A conventional photovoltaic element was fabricated by forming a light reflecting layer in the same manner as in Comparative Example 1 and then forming a light reflection multiplying layer, a semiconductor layer, a transparent layer, and a collector layer in the same manner as in Example 4. First, using the DC magnetron sputtering apparatus as shown in FIG. 8, a 450 nm thick light reflecting layer of Ag not containing oxygen was formed on the substrate, as in Comparative Experiment Example 1. Subsequently, the light reflection multiplying layer, the n-type layer, the i-type layer, the p-type layer, the transparent electrode, and the collector electrode were formed on the light reflecting layer under the same fabrication conditions as in Example 5 to thereby fabricate a photovoltaic element (Comparative Element 2).

EXAMPLE 5

A photovoltaic element was fabricated in the same way as in Example 4, except that the light reflecting layer and the light reflection multiplying layer were formed on the SUS substrate as in Example 2.

EXAMPLE 6

A photovoltaic element was fabricated in the same way as in Example 4, except that the light reflecting layer and the light reflection multiplying layer were formed on the SUS substrate as in Example 3.

To demonstrate the effect of the present invention on the solar cell characteristics of the photovoltaic elements as above fabricated in Examples 4 to 6 and Comparative Example 2, the same evaluation tests as in Example 1 were conducted. The results are listed Table 9.

TABLE 9

| | Additive element(s) | Initial characteristic | After adherence test | After environmental test |
|---|---|---|---|---|
| Example 4 | O | 1.03 | 1.06 | 1.09 |
| Example 5 | N, O | 1.05 | 1.08 | 1.11 |
| Example 6 | N, C, O | 1.08 | 1.12 | 1.13 |
| Comparative example 2 | None | 1.00 | 1.00 | 1.00 |

As is clear from Table 9, the photovoltaic elements of Examples 4 to 6 are more greatly improved not only in the initial characteristics, but also in the durability and the environmental resistance than the element of Comparative Example 2.

EXAMPLE 7

As in Example 1, using a manufacturing DC magnetron sputtering apparatus as shown in FIG. 8, a 450 nm thick light reflecting layer of Ag containing different amounts of oxygen was formed on the substrate by varying the flow of $O_2$ gas introduced into the deposition chamber 801 from 1 ppm to 10,000 ppm with respect to the flow of Ar gas in the same way as in Example 1. In this example, the $O_2$/Ar gas cylinders used contained $O_2$ gases diluted to 50 ppm and 1%.

Subsequently, for the substrate with light reflecting layers deposited thereon, secondary ion mass spectrometry (SIMS) was conducted on a part of the substrate to measure the content of oxygen in the light reflecting layer of Ag.

As a result, it was found that the amount of oxygen contained in the light reflecting layers as fabricated was from 0.05 ppm to 1%.

Next, using a DC magnetron sputtering apparatus as shown in FIG. 8, a 1 μm thick light reflection multiplying layer was deposited on each of the light reflecting layers containing respective amounts of oxygen in the same way as in Example 1, and further, using the μW glow discharge decomposition apparatus as shown in FIG. 13, on the light reflection multiplying layer, a non-single crystal silicon type semiconductor layer, a transparent electrode, and a collector electrode were laminated, whereby a plurality of photovoltaic elements were fabricated. For the solar cell characteristics of the photoelectric element, the same evaluation tests as in Example 1 were conducted. The results are listed in Table 10.

TABLE 10

| | Oxygen concentration in light reflecting layer | Initial characteristic | After adherence test | After environmental test |
|---|---|---|---|---|
| Element example 7-1 | not greater than 0.05 ppm | 1.00 | 1.00 | 1.00 |
| Element example 7-2 | not greater than 0.1 ppm | 1.03 | 1.04 | 1.04 |
| Element example 7-3 | not greater than 1.2 ppm | 1.04 | 1.06 | 1.05 |
| Element example 7-4 | not greater than 10 ppm | 1.03 | 1.05 | 1.06 |
| Element example 7-5 | not greater than 120 ppm | 1.05 | 1.06 | 1.05 |
| Element example 7-6 | not greater than 500 ppm | 1.04 | 1.06 | 1.06 |
| Element example 7-7 | not greater than 1000 ppm | 1.04 | 1.05 | 1.05 |
| Element example 7-8 | not greater than 2000 ppm | 0.99 | 1.00 | 1.00 |
| Element example 7-9 | not greater than 1% | 0.99 | 1.00 | 0.98 |

As seen from Table 10, the photovoltaic element wherein the amount of oxygen in the light reflecting layer is in a range from 0.1 ppm to 1000 ppm is 1.03 times better in the initial photovoltaic conversion characteristics and 1.04 times better after the adherence test and environmental test, than the photovoltaic element wherein the amount of oxygen is less than 0.1 ppm or more than 1000 ppm, whereby it is seen that the use of a light reflecting layer containing oxygen from 0.1 ppm to 1000 ppm can provide a further beneficial effect.

EXAMPLE 8

As in example 2, using DC magnetron sputtering apparatus as shown in FIG. 8, a 300 nm thick light reflecting layer of Ag containing different amounts of oxygen and nitrogen was formed on the substrate by varying the flow of NO gas introduced into the deposition chamber 801 from 0.5 to 300 sccm with respect to the flow of Ar gas in the same way as in Example 2. Subsequently, for the substrate with light reflecting layers thus deposited, secondary ion mass spectrometry (SIMS) was conducted on a part of the substrate to measure the amounts of oxygen and nitrogen in the light reflecting layer of Ag.

Further, using a DC magnetron sputtering apparatus as shown in FIG. 8, a 1 μm thick light reflection multiplying layer was deposited on the light reflecting layer containing respective amounts of oxygen and nitrogen in the same way as in Example 2, and further, using the μW glow discharge decomposition apparatus as shown in FIG. 13, a non-single silicon type semiconductor layer, a transparent electrode, and a collector electrode were laminated on the light reflection multiplying layer, whereby a photovoltaic element was fabricated (Element Examples 8-1 to 8-9). The same evaluation tests as in Example 1 were conducted in order to measure the solar cell characteristic of the photovoltaic element. The relation between the total amount of oxygen and nitrogen in the light reflecting layer and the photoelectric conversion efficiency is shown in Table 11.

TABLE 10

| | Additives in light reflecting layer | Initial characteristic | After adherence test | After environmental test |
|---|---|---|---|---|
| Element example 8-1 | not greater than 0.05 ppm | 1.00 | 1.00 | 1.00 |
| Element example 8-2 | not greater than 0.1 ppm | 1.03 | 1.05 | 1.05 |
| Element example 8-3 | not greater than 1 ppm | 1.04 | 1.07 | 1.06 |
| Element example 8-4 | not greater than 70 ppm | 1.03 | 1.06 | 1.07 |
| Element example 8-5 | not greater than 100 ppm | 1.05 | 1.07 | 1.06 |
| Element | not greater | 1.04 | 1.07 | |

TABLE 10-continued

| | Additives in light reflecting layer | Initial characteristic | After adherence test | After environmental test |
| --- | --- | --- | --- | --- |
| Element example 8-6 | than 700 ppm | | | |
| Element example 8-7 | not greater than 1000 ppm | 1.04 | 1.06 | 1.06 |
| Element example 8-8 | not greater than 3000 ppm | 0.99 | 1.02 | 1.01 |
| Element example 8-9 | not greater than 1.5% | 0.99 | 1.01 | 0.99 |

As is seen from Table 11, the photovoltaic element wherein the total amount of oxygen and nitrogen contained in the light reflecting layer is in range from 0.1 ppm to 1000 ppm is 1.03 times greater in the initial characteristic of photovoltaic conversion, and 1.05 times greater after the adherence test and environmental test, than the photovoltaic element wherein the total amount of oxygen and nitrogen is less than 0.1 ppm or more than 1000 ppm, whereby it is found that the use of a light reflecting layer having a total amount of oxygen and nitrogen from 0.1 ppm to 1000 ppm can provide a further beneficial effect.

EXAMPLE 9

As in Example 3, using a DC magnetron sputtering apparatus as shown in FIG. 8, a 300 nm thick light reflecting layer of Ag containing different amounts of carbon, oxygen, and nitrogen was formed on the substrate by varying the flow of methane gas, oxygen gas, and nitrogen gas introduced into the deposition chamber 801, as in Example 3. In this example, methane gas, oxygen gas and nitrogen gas cylinders, diluted to 1 ppm and 1% by Ar gas, were prepared.

Subsequently, for the substrates with the light reflecting layers deposited thereon, secondary ion mass spectrometry (SIMS) was conducted on a part of each substrate to measure the amounts of oxygen, carbon, and nitrogen in the light reflecting layer of Ag.

Further, using a DC magnetron sputtering apparatus as shown in FIG. 8, a 1 μm thick light reflection multiplying layer was deposited on the light reflecting layer containing respective amounts of oxygen, nitrogen, and carbon, as in Example 3, and further, using a μW glow discharge decomposition apparatus as shown in FIG. 13, a non-single crystal silicon type semiconductor layer, a transparent electrode, and a collector electrode were laminated on the light reflection multiplying layer, whereby a photovoltaic element was fabricated (Element Examples 9-1 to 9-7). The same evaluation tests as in Example 1 were conducted for measuring the solar cell characteristics of the photovoltaic element. The relation between the amounts of oxygen, nitrogen, and carbon in the light reflecting layer and the photovoltaic conversion efficiency is listed in Table 12.

TABLE 12

| | Additives in light reflecting layer (ppm) | Initial characteristic | After adherence test | After environmental test |
| --- | --- | --- | --- | --- |
| Element example 9-1 | <0.1 | 1.00 | 1.00 | 1.00 |
| Element example 9-2 | 0.1–10 | 1.13 | 1.12 | 1.12 |
| Element example 9-3 | 10–100 | 1.14 | 1.16 | 1.15 |
| Element example 9-4 | 100–1000 | 1.13 | 1.15 | 1.16 |
| Element example 9-5 | 1000–1% | 0.99 | 0.97 | 0.95 |
| Element example 9-6 | 1–3% | 0.99 | 0.89 | 0.92 |
| Element example 9-7 | 3–10% | 0.80 | 0.81 | 0.79 |

As seen from Table 12, the photovoltaic elements wherein the amount of oxygen in the light reflecting layer is in a range from 0.1 ppm to 1000 ppm is 1.13 times greater in the initial characteristic of photovoltaic conversion, and 1.12 times greater after the adherence test and environmental test, than the photovoltaic element wherein the content of oxygen atoms is less than 0.1 ppm or more than 1000 ppm, whereby it is found that the use of a light reflecting layer containing a total amount of oxygen, carbon, and nitrogen from 0.1 ppm to 1000 ppm can provide a further beneficial effect.

EXAMPLE 10

Using a substrate of barium borosilicate glass (7059 made by Corning), 50 mm square and 1 mm thick, after an 80 mm thick transparent electrode of ITO was formed on the substrate, a first p-type layer, a first i-type layer, a first n-type layer, a second p-type layer, a second i-type layer, and a second n-type layer were formed under the conditions of Table 13, and a light reflection multiplying layer and a light reflecting layer of Ag containing oxygen were formed by the Example 1 method, whereby a photovoltaic element was fabricated (Element Example 10).

TABLE 13

| | $SiH_4$ flow (sccm) | $GeH_4$ flow (sccm) | $H_2$ flow (sccm) | $B_2H_6/H_2$ flow (sccm) | $PH_3/H_2$ flow (sccm) | Internal pressure (Torr) | Temperature (°C.) | μW power (mW/cm$^3$) | DC bias (V) | RF bias (mW/cm$^3$) | Layer thickness (nm) |
| --- | --- | --- | --- | --- | --- | --- | --- | --- | --- | --- | --- |
| 1st p-type layer | 20 | | 200 | 5 | | 20 | 380 | 400 | — | — | 5 |
| 1st i-type layer | 150 | | 300 | | | 5 | 380 | 100 | 100 | 100 | 150 |
| 1st n-type layer | 30 | | 100 | | 8 | 15 | 270 | 75 | — | — | 10 |
| 2nd p-type layer | 10 | | 100 | 8 | | 20 | 270 | 400 | — | — | 5 |
| 2nd i-type layer | 150 | 50 | 200 | | | 5 | 350 | 100 | 50 | 200 | 250 |
| 2nd n-type | 30 | | 100 | | 8 | 15 | 160 | 50 | — | — | 10 |

TABLE 13-continued

| | SiH4 flow (sccm) | GeH4 flow (sccm) | H2 flow (sccm) | B2H6/H2 flow (sccm) | PH3/H2 flow (sccm) | Internal pressure (Torr) | Temperature (°C.) | μW power (mW/cm³) | DC bias (V) | RF bias (mW/cm³) | Layer thickness (nm) |
|---|---|---|---|---|---|---|---|---|---|---|---|
| layer | | | | | | | | | | | |

COMPARATIVE EXAMPLE 3

As in Example 10, after an 80 nm thick transparent electrode of ITO was formed on a substrate, a first p-type layer, a first i-type layer, a first n-type layer, a second p-type layer, a second i-type layer, and a second n-type layer were formed under the conditions of Table 13, and a light reflection multiplying layer and a light reflecting layer containing oxygen were formed as in Comparative Example 1, whereby a photovoltaic element was fabricated (Element Comparative Example 3).

EXAMPLE 11

As in Example 10, on a substrate of barium borosilicate glass, a transparent electrode, a first p-type layer, a first i-type layer, a first n-type layer, a second p-type layer, a second i-type layer, a second n-type layer, a light reflection multiplying layer, and a light reflecting layer of Ag containing oxygen and nitrogen were formed, as in Example 2, whereby a photovoltaic element as shown in FIG. 2 was fabricated (Element Example 11).

EXAMPLE 12

As in Example 10, on a substrate of barium borosilicate glass, a transparent electrode, a first p-type layer, a first i-type layer, a first n-type layer, a second p-type layer, a second i-type layer, a second n-type layer, a light reflection multiplying layer, and a light reflecting layer of Ag containing oxygen, nitrogen, and carbon were formed, as in Example 3, whereby a photovoltaic element as shown in FIG. 2 was fabricated (Element Example 12).

To demonstrate the effect of the present invention on the solar cell characteristic of photovoltaic elements as above fabricated in Examples 10 to 12 and Comparative Example 3, the same evaluation tests as in Example 1 were conducted, the results being listed in Table 14.

TABLE 14

| | Additive element(s) in light reflecting layer (ppm) | Initial characteristic | After adherence test | After environmental test |
|---|---|---|---|---|
| Element example 10 | O | 1.04 | 1.05 | 1.08 |
| Element example 11 | N, O | 1.06 | 1.07 | 1.10 |
| Element example 12 | N, C, O | 1.09 | 1.10 | 1.12 |
| Element comparative example 3 | None | 1.00 | 1.00 | 1.00 |

As is clear from Table 14, the photovoltaic elements in Examples 10 to 12 are greatly improved not only in the initial characteristics but also in the durability and the environmental resistance compared to that of Comparative Example 3.

EXAMPLE 13

A photovoltaic element of the present invention was fabricated by the DC magnetron sputtering method and the μW glow discharge decomposition method.

Using a DC magnetron sputtering apparatus as shown in FIG. 8, a 450 nm thick light reflecting layer of Ag containing oxygen and a light reflection multiplying layer were formed on a stainless substrate, as in Example 1, and then using a μW glow discharge decomposition apparatus, on the light reflecting layer were laminated a non-single crystal silicon type semiconductor layer composed of a first n-type layer, a first i-type layer, a first p-type layer, a second n-type layer, a second i-type layer, a second p-type layer, a third n-type layer, a third i-type layer, and a third p-type layer under the conditions of Table 15. Further, a transparent electrode and a collector electrode were formed thereon, whereby a tandem photovoltaic element of the triple cell type was fabricated (Element Example 13).

TABLE 15

| | SiH4 flow (sccm) | GeH4 flow (sccm) | H2 flow (sccm) | B2H6/H2 flow (sccm) | PH3/H2 flow (sccm) | Internal pressure (Torr) | Temperature (°C.) | μW power (mW/cm³) | DC bias (V) | RF bias (mW/cm³) | Layer thickness (nm) |
|---|---|---|---|---|---|---|---|---|---|---|---|
| 1st n-type layer | 30 | | 100 | | 6 | 10 | 350 | 50 | — | — | 10 |
| 1st i-type layer | 150 | 50 | 100 | | | 5 | 350 | 100 | 75 | 100 | 250 |
| 1st p-type layer | 10 | | 100 | 5 | | 10 | 325 | 400 | — | — | 5 |
| 2nd n-type layer | 30 | | 100 | | 6 | 10 | 300 | 50 | — | — | 10 |
| 2nd i-type layer | 200 | | 100 | | | 5 | 300 | 100 | — | 200 | 400 |
| 2nd p-type layer | 10 | | 100 | 5 | | 10 | 275 | 400 | — | — | 5 |
| 3nd n-type | 30 | | 100 | | 6 | 10 | 250 | 50 | — | — | 10 |

TABLE 15-continued

| | SiH4 flow (sccm) | GeH4 flow (sccm) | H2 flow (sccm) | B2H6/H2 flow (sccm) | PH3/H2 flow (sccm) | Internal pressure (Torr) | Temperature (°C.) | μW power (mW/cm$^3$) | DC bias (V) | RF bias (mW/cm$^3$) | Layer thickness (nm) |
|---|---|---|---|---|---|---|---|---|---|---|---|
| layer 3nd i-type layer | 200 | 100 | | | | 5 | 250 | 100 | — | 200 | 100 |
| 3nd p-type layer | 10 | | 100 | 5 | | 10 | 200 | 400 | — | — | 5 |

EXAMPLE 14

Using a DC magnetron sputtering apparatus as shown in FIG. 8, a 300 nm thick light reflecting layer of Ag containing oxygen and nitrogen and a light reflection multiplying layer were formed on a stainless substrate, as in Example 2, and then as in Example 13, on the light reflecting layer were laminated a non-single crystal silicon type semiconductor layer composed of a first n-type layer, a first i-type layer, a first p-type layer, a second n-type layer, a second i-type layer, a second p-type layer, a third n-type layer, a third i-type layer, a third p-type layer, a transparent electrode, and a collector electrode, whereby a photovoltaic element was fabricated (Element Example 14).

EXAMPLE 15

Using a DC magnetron sputtering apparatus as shown in FIG. 8, a 300 nm thick light reflecting layer of Ag containing oxygen, nitrogen, and carbon and a light reflection multiplying layer were formed on a stainless substrate, as in Example 3, and then as in Example 13, on the light reflecting layer were laminated a non-single crystal silicon type semiconductor layer composed of a first n-type layer, a first i-type layer, a first p-type layer, a second n-type layer, a second i-type layer, a second p-type layer, a third n-type layer, a third i-type layer, a third p-type layer, a transparent electrode, and a collector electrode, whereby a photovoltaic element was fabricated (Element Example 15).

COMPARATIVE EXAMPLE 4

As in Comparative Example 1, a light reflecting layer not containing oxygen and a light reflection multiplying layer were formed on a stainless substrate, and then using a μW glow discharge decomposition apparatus, a non-single crystal silicon type semiconductor layer was laminated on the light reflecting layer, as in Example 13, and further a transparent electrode and a collector electrode were laminated in the same way and under the same conditions as in Example 13, whereby a photovoltaic element was fabricated (Element Comparative Example 4).

To demonstrate the effect of the present invention on the solar cell characteristic of photovoltaic elements as above fabricated in Examples 13 to 15 and Comparative Example 4, the same evaluation tests as in Example 1 were conducted, the results being listed in Table 16.

TABLE 16

| | Additives in light reflecting layer | Initial characteristic | After adherence test | After environmental test |
|---|---|---|---|---|
| Element example 13 | O | 1.03 | 1.05 | 1.07 |
| Element example 14 | N, O | 1.05 | 1.07 | 1.09 |
| Element example 15 | N, C, O | 1.09 | 1.11 | 1.13 |
| Element comparative example 4 | None | 1.00 | 1.00 | 1.00 |

As is clear from Table 16, the photovoltaic elements in Examples 13 to 15 are greatly improved in the initial characteristic, durability and environmental resistance compared to that of Comparative Example 4.

EXAMPLE 16

A photovoltaic element of the present invention was fabricated by electron beam (EB) vacuum vapor deposition, DC magnetron sputtering, and μW glow discharge decomposition.

Using an apparatus as shown in FIG. 12, a 450 nm thick light reflecting layer of Ag containing oxygen was formed on a stainless substrate by electron beam (EB) vacuum vapor deposition, and a light reflection multiplying layer composed of zinc oxide (ZnO) was formed thereon by DC sputtering. Then, as in Example 13, on the light reflection multiplying layer were formed a non-single crystal silicon type semiconductor layer, a transparent electrode, and a collector electrode, whereby a photovoltaic element was fabricated (Element Example 16).

COMPARATIVE EXAMPLE 5

Using an apparatus as shown in FIG. 12, a 450 nm thick light reflecting layer of Ag not containing oxygen was formed on a stainless substrate, and a light reflection multiplying layer composed of zinc oxide (ZnO) was formed thereon. A photovoltaic element was then fabricated in the same way for the other layers as in Example 16 (Element Comparative Example 5).

EXAMPLE 17

Using an apparatus as shown in FIG. 12, a 300 nm thick light reflecting layer of Ag containing oxygen and nitrogen was formed on a stainless substrate by electron beam (EB) vacuum vapor deposition, and a light reflection multiplying layer composed of zinc oxide (ZnO) was formed thereon by DC magnetron sputtering. A photovoltaic element was then fabricated in the same way for the other layers as in Example 16 (Element Example 17).

EXAMPLE 18

Using an apparatus as shown in FIG. 12, a 300 nm thick light reflecting layer of Ag containing oxygen, nitrogen, and carbon was formed on a stainless substrate by electron beam (EB) vacuum vapor deposition, and a light reflection multiplying layer composed of zinc oxide (ZnO) was formed thereon by DC magnetron sputtering. A photovoltaic element was then fabricated in the same way for the other layers as in Example 16.

To demonstrate the effect of the present invention on the solar cell characteristic of photovoltaic elements as above fabricated in Examples 16 to 18 and Comparative Example 5, the same evaluation tests as in Example 1 were conducted, the results being listed in Table 17.

TABLE 17

| | Additive Elements in light reflecting layer | Initial characteristic | After adherence test | After environmental test |
|---|---|---|---|---|
| Element example 16 | O | 1.05 | 1.09 | 1.08 |
| Element example 17 | N, O | 1.10 | 1.12 | 1.14 |
| Element example 18 | N, C, O | 1.15 | 1.16 | 1.17 |
| Element comparative example 5 | None | 1.00 | 1.00 | 1.00 |

As is clear from Table 17, the photovoltaic elements in Examples 16 to 18 are more improved in the initial characteristic, durability, and environmental resistance compared to that of Comparative Example 5.

EXAMPLE 19

A photovoltaic element of the present invention was fabricated by DC magnetron sputtering and μW glow discharge decomposition.

Using a DC magnetron sputtering apparatus of FIG. 8, a 450 nm thick light reflecting layer of textured structure containing oxygen was formed on a substrate 802 under the same conditions as in Example 1, except that the temperature of the substrate 802 was held at 350° C. by the heater 803. Then, as in Example 1, on the light reflecting layer there was deposited a 1 μm thick light reflection multiplying layer (ZnO), on which were further laminated a non-single crystal silicon type semiconductor layer, a transparent electrode, and a collector electrode by using the μW glow discharge decomposition apparatus as shown in FIG. 13, whereby a photovoltaic element was fabricated (Element Example 19).

COMPARATIVE EXAMPLE 6

A 450 nm thick light reflecting layer of textured structure not containing oxygen was formed on a substrate 802 under the same conditions as in Example 19, except that Ar gas was introduced into the deposition chamber 802, instead of O2/Ar gas. Thereafter, a photovoltaic element was fabricated in the same way as in Example 19 (Element Comparative Example 6).

EXAMPLE 20

A 450 nm thick light reflecting layer of textured structure containing oxygen and nitrogen was formed on a substrate 802 under the same conditions as in Example 2, except that the temperature of the substrate 802 was held at 350° C. by the heater 803. Further, as in Example 19, a 1 μm thick light reflection multiplying layer, a non-single crystal silicon type semiconductor layer, a transparent electrode, and a collector electrode were laminated, whereby a photovoltaic element was fabricated (Element Example 20).

EXAMPLE 21

A 450 nm thick light reflecting layer of textured structure containing oxygen, nitrogen, and carbon was formed on a substrate 802 under the same conditions as in Example 3, except that the temperature of the substrate 802 was held at 350° C. by the heater 803. Further, as in Example 19, a light reflection multiplying layer, a non-single crystal silicon type semiconductor layer, a transparent electrode, and a collector electrode were laminated, whereby a photovoltaic element was fabricated (Element Example 21).

To demonstrate the effect of the present invention on the solar cell characteristics of photovoltaic elements as above fabricated in Examples 19 to 21 and Comparative Example 6, the same evaluation tests as in Example 1 were conducted, the results being listed in Table 18.

TABLE 18

| | Additive Elements in light reflecting layer | Initial characteristic | After adherence test | After environmental test |
|---|---|---|---|---|
| Element example 19 | O | 1.05 | 1.06 | 1.09 |
| Element example 20 | N, O | 1.04 | 1.06 | 1.09 |
| Element example 21 | N, C, O | 1.10 | 1.12 | 1.14 |
| Element comparative example 6 | None | 1.00 | 1.00 | 1.00 |

As is clear from Table 18, the photovoltaic elements of Examples 19 to 21 are more improved in the initial characteristics, the durability and the environmental resistance than that of Comparative Example 6.

Using the DC magnetron sputtering method and the microwave (μW) glow discharge decomposition method, a photovoltaic element having the constitution of FIG. 1 was fabricated.

Using a DC magnetron sputtering apparatus as shown in FIG. 8, a 300 nm thick light reflecting layer of Cu containing oxygen and a 1 μm thick light reflection multiplying layer were fabricated on a substrate 50 mm square and 0.2 mm thick made of stainless (SUS430) and having a specularly polished surface, in the same way as in Experiment Example 3-1.

Subsequently, using a μW glow discharge decomposition apparatus comprised of a source gas supply unit 1320 and a deposition unit 1300 as shown is FIG. 13, a non-single crystal silicon type semiconductor layer composed of n-type layer, i-type layer, and p-type layer was fabricated on the light reflection multiplying layer.

Next, an 80 nm thick transparent electrode of ITO (In2O3+SnO2) was vapor deposited, and a 1 μm thick collector electrode of Cr was vapor deposited in a vacuum to fabricate a photovoltaic element (Element Example 22). The fabrication conditions for the photovoltaic element are listed in Table 19.

TABLE 19

| Substrate | | SUS430BA, 50 mm square, 0.2 mm thick |
|---|---|---|
| Light reflecting layer | Target | Cu (99.999%) |
| | Fabrication conditions | $O_2$/Ar gas flow: 5sccm<br>Ar gas flow: 10sccm<br>Internal pressure: 8 mTorr<br>Substrate temperature: RT<br>DC voltage: 400V<br>Layer thickness: 300 nm |
| Light reflection multiplying layer | Target | ZnO (99.99%) |
| | Fabrication conditions | Ar gas flow: 25sccm<br>Internal pressure: 5 mTorr<br>Substrate temperature: 350° C.<br>DC voltage: 400V<br>Layer thickness: 1 μm |

| | Layer | Gases used (sccm) bias | μW power (mW/cm$^3$) | Pressure (mTorr) | Substrate temperature (°C.) | Layer thickness (nm) |
|---|---|---|---|---|---|---|
| Semiconductor layer fabrication conditions | n-type | $SiH_4$: 30<br>$H_2$: 100<br>$PH_3/H_2$ (10%): 6 | 50 | 10 | 350 | 10 |
| | i-type | $SiH_4$: 100<br>$H_2$: 200<br>RF: 200 mW/cm$^3$<br>DC: 75V | 100 | 5 | 350 | 400 |
| | p-type | $SiH_4$: 10<br>$H_2$: 100<br>$B_2H_6$ (10%): 5 | 400 | 20 | 300 | 5 |
| Transparent electrode | | ITO 80 nm | | | | |
| Collector electrode | | Cr 1 μm | | | | |

EXAMPLE 23

A 300 nm thick light reflecting layer of Cu containing nitrogen and a 1 μm thick light reflection multiplying layer were formed on a stainless substrate, as in Example 3-2. Subsequently, as in Example 22, an n-type layer, an i-type layer, a p-type layer, a transparent electrode, and a collector electrode were formed, whereby a photovoltaic element of FIG. 1 type was fabricated (Element Example 23).

EXAMPLE 24

A 300 nm thick light reflecting layer of Cu containing carbon and a 1 μm thick light reflection multiplying layer were formed on a stainless substrate in the same way as in Example 3-3. Subsequently, as in Example 22, an n-type layer, an i-type layer, a p-type layer, a transparent electrode, and a collector electrode were formed, whereby a photovoltaic element of FIG. 1 type was fabricated (Element Example 24).

COMPARATIVE EXAMPLE 7

A conventional Cu light reflecting layer was formed 300 nm thick, as in Comparative Example 3, and then a light reflection multiplying layer, an n-type layer, an i-type layer, a p-type layer, a transparent electrode, and a collector electrode were formed thereon under the same forming conditions as in Example 22, whereby a photovoltaic element was fabricated (Element Comparative Example 7).

To demonstrate the effects of the present invention on the photovoltaic elements as above fabricated in Examples 22 to 24 and Comparative Example 7, the same evaluation tests as in Example 1 were conducted.
(A) Initial Characteristics To investigate the initial characteristics of the photovoltaic elements as solar cells, the photovoltaic element was subjected to illumination of AM-1.5 (100 mW/cm$^2$ light to measure the V-I characteristics and thus evaluate the photoelectric conversion efficiency. The results are shown in Table 20.

As indicated in Table 20, the photovoltaic conversion efficiencies of the photovoltaic elements of Examples 22 to 24 are greater than that of the photovoltaic element of Comparative Example 7, and the photovoltaic elements having a Cu light reflecting layer containing oxygen, carbon, or nitrogen of the present invention provides better characteristics than that using the conventional light reflecting layer.

TABLE 20

| | Additive element | Initial characteristic | After adherence test | After environmental test |
|---|---|---|---|---|
| Element example 22 | O | 1.04 | 1.04 | 1.05 |
| Element example 23 | N | 1.07 | 1.07 | 1.08 |
| Element example 24 | C | 1.05 | 1.05 | 1.07 |
| Element comparative example 7 | None | 1.00 | 1.00 | 1.00 |

(B) Adherence Dependency of Characteristics

To investigate the adherence dependency of the solar cell characteristics of the photovoltaic element, a bend test for the stainless substrates 601 with the photovoltaic elements deposited thereon was conducted using the bending tester of FIG. 6. Thereafter, the photovoltaic conversion efficiency was measured under illumination of AM-1.5 light. The measurement results are listed in Table 20.

From these results, it is seen that the photovoltaic conversion efficiency of the photovoltaic elements in Examples 22 to 24 is greater than that of the photovoltaic element of Comparative Example 7, whereby the photovoltaic elements having a Cu light reflecting layer containing oxygen, carbon, or nitrogen of the present invention provides better durability than the conventional photovoltaic element.

(C) Environmental Variation Dependency of Characteristic

The photovoltaic element was placed in the dark at a temperature of 85° C. and a relative humidity of 85%, and a heat cycle between a temperature of 85° C. for four hours and a temperature of −40° C. for forty minutes was repeated 30 times to examine the photoelectric conversion efficiency. The results are listed in Table 20.

As is clear from the Table, the photovoltaic element in Examples 22 to 24 has less reduction in photoelectric conversion efficiency with the heat cycling. Thus the environmental resistance thereof is better than the photovoltaic element of Comparative Example 7.

From the above evaluation test, it is found that the photovoltaic elements having a Cu light reflecting layer containing oxygen, carbon, or nitrogen of the present invention have better environmental resistance than the conventional photovoltaic element.

EXAMPLE 25

With the DC magnetron sputtering method and the RF glow discharge decomposition method, a photovoltaic element of the present invention was fabricated.

Using the DC magnetron sputtering apparatus of FIG. 8, a 300 nm thick light reflecting layer of Cu containing oxygen and a 1 μm thick light reflection multiplying layer were fabricated on a substrate under the same fabrication conditions as in Experiment Example 3-1.

Subsequently, using an RF glow discharge decomposition apparatus comprised of a source gas supply unit 1320 and a deposition unit 1400 as shown in FIG. 14, a non-single crystal silicon type semiconductor layer composed of an n-type layer, i-type layer, and p-type layer was fabricated on the light reflection multiplying layer under the fabrication conditions shown in Table 8.

Finally, an 80 nm thick transparent electrode of ITO ($In_2O_3 + SnO_2$) was vacuum vapor deposited, and a 1 μm thick collector electrode of Cr was vacuum vapor deposited to fabricate a photovoltaic element (Element Example 25).

EXAMPLE 26

A light reflecting layer of Cu containing nitrogen was formed on a stainless substrate, as in Example 3-2, and a light reflection multiplying layer, an n-type layer, an i-type layer, a p-type layer, a transparent electrode and a collector electrode were formed thereon, as in Example 25, whereby a photovoltaic element was fabricated (Element Example 26).

EXAMPLE 27

A light reflecting layer of Cu containing carbon was formed on a stainless substrate, as in Example 3-3, and a light reflection multiplying layer, an n-type layer, an i-type layer, a p-type layer, a transparent electrode, and a collector electrode were formed thereon, as in Example 25, whereby a photovoltaic element was fabricated (Element Example 27).

COMPARATIVE EXAMPLE 8

A light reflecting layer was formed in the same way as in Comparative Example 3, and subsequently a light reflection multiplying layer, a semiconductor layer, a transparent electrode, and a collector electrode were formed as in Example 25, whereby a conventional photovoltaic element was fabricated (Element Comparative Example 8).

To demonstrate the effect of the present invention on the solar cell characteristics of the photovoltaic elements as above fabricated in Examples 25 to 27 and Comparative Example 8, the same evaluation tests as in Example 1 were conducted. The results are listed in Table 21.

As is clear from Table 21, the photovoltaic elements of Examples 25 to 27 are more greatly improved in the initial characteristics, as well as in durability and environmental resistance that those of Comparative Example 8.

TABLE 21

|  | Additive element | Initial characteristic | After adherence test | After environmental test |
| --- | --- | --- | --- | --- |
| Element example 25 | O | 1.02 | 1.04 | 1.05 |
| Element example 26 | N | 1.05 | 1.07 | 1.07 |
| Element example 27 | C | 1.03 | 1.05 | 1.06 |
| Element comparative example 8 | None | 1.00 | 1.00 | 1.00 |

EXAMPLE 28

As in Example 22, using a DC magnetron sputtering apparatus as shown in FIG. 8, 300 nm thick light reflecting layers of Cu containing different amounts of oxygen were formed on substrates by varying the flow of oxygen gas introduced into the deposition chamber 801, as in Example 22. In this example, the oxygen $O_2$/Ar gas cylinders contained $O_2$ gas diluted to 100 m and 1% by Ar gas.

Subsequently, for the substrates with the light reflecting layer deposited thereon, secondary ion mass spectrometry (SIMS) was conducted on a part of each of the substrates to measure the amount of oxygen in the light reflecting layer of Cu.

The amounts of oxygen in the light reflecting layers thus fabricated are listed in Table 22.

TABLE 22

|  | Oxygen content ppm | Initial characteristic | After adherence test | After environmental test |
| --- | --- | --- | --- | --- |
| Element example 28-1 | 0.05 | 1.00 | 1.00 | 1.00 |
| Element example 28-2 | 0.1 | 1.03 | 1.04 | 1.03 |
| Element example 28-3 | 0.5 | 1.03 | 1.03 | 1.04 |
| Element example 28-4 | 10 | 1.04 | 1.04 | 1.04 |
| Element example 28-5 | 100 | 1.05 | 1.05 | 1.06 |
| Element example 28-6 | 500 | 1.04 | 1.05 | 1.05 |
| Element example 28-7 | 1000 | 1.04 | 1.05 | 1.05 |
| Element example 28-8 | 1200 | 0.99 | 0.99 | 1.00 |
| Element example 28-9 | 1500 | 0.99 | 0.99 | 0.98 |

Next, using a DC magnetron sputtering apparatus as shown in FIG. 8, a 1 μm thick light reflection multiplying layer was deposited on the light reflecting layer containing respective amounts of oxygen in the same way as in Example 1, and further, using the μW glow discharge decomposition apparatus as shown in FIG. 13, a non-single crystal silicon type semiconductor layer, a transparent electrode, and a collector electrode were laminated on the light reflection multiplying layer, whereby photovoltaic elements were fabricated (Element Examples 28-1 to 28-9). To determine the solar cell characteristic of the photovoltaic element, the same evaluation tests as in Example 1 were conducted. The results are listed in Table 22.

As is clear from Table 22, the photovoltaic elements wherein the amount of oxygen in the light reflecting layer is in a range from 0.1 ppm to 1000 ppm have better initial photoelectric conversion characteristics and the characteristics after the adherence test and the environmental test than the photovoltaic element wherein the amount of oxygen is less than 0.1 ppm or more than 1000 ppm, whereby the use of a light reflecting layer containing oxygen in the range from 0.1 ppm to 1000 ppm can provide a further beneficial effect.

EXAMPLE 29

As in Example 23, using a DC magnetron sputtering apparatus as shown in FIG. 8, 300 nm thick light reflecting layers of Cu containing different amounts of nitrogen were formed on substrates by varying the flow of nitrogen gas introduced into the deposition chamber 801, as in Example 23. In this example, the nitrogen N₂/Ar gas cylinders used contained N₂ gas diluted to 1 ppm and 1% by Ar gas.

Subsequently, for the substrates with respective light reflecting layers deposited thereon, secondary ion mass spectrometry (SIMS) was conducted on a part of each of the substrates to measure the amount of nitrogen in the light reflecting layer of Cu. The amount of nitrogen contained in the light reflecting layers is listed in Table 23.

TABLE 23

| | Nitrogen content ppm | Initial characteristic | After adherence test | After environmental test |
|---|---|---|---|---|
| Element example 29-1 | 0.05 | 1.00 | 1.00 | 1.00 |
| Element example 29-2 | 0.1 | 1.05 | 1.05 | 1.06 |
| Element example 29-3 | 0.5 | 1.05 | 1.06 | 1.07 |
| Element example 29-4 | 10 | 1.06 | 1.05 | 1.06 |
| Element example 29-5 | 100 | 1.05 | 1.05 | 1.06 |
| Element example 29-6 | 500 | 1.05 | 1.05 | 1.07 |
| Element example 29-7 | 1000 | 1.05 | 1.05 | 1.06 |
| Element example 29-8 | 1200 | 0.99 | 0.99 | 1.00 |
| Element example 29-9 | 1500 | 0.99 | 0.99 | 0.98 |

Next, using a DC magnetron sputtering apparatus as shown in FIG. 8, 1 μm thick light reflection multiplying layer was deposited on light reflecting layers containing respective amounts of nitrogen as in Example 22, and further, using the μW glow discharge decomposition apparatus as shown in FIG. 13, a non-single crystal silicon type semiconductor layer, a transparent electrode and a collector electrode were laminated on the light reflection multiplying layer, whereby a photovoltaic element was fabricated (Element Examples 291 to 29-9). For determining the solar cell characteristics of the photovoltaic elements, the same evaluation tests as in Example 1 were conducted. The results are listed in Table 23.

As is clear from Table 23, the photovoltaic elements wherein the amount of nitrogen in the light reflecting layer is in a range from 0.1 ppm to 1000 ppm have a greater initial photoelectric conversion efficiency characteristic and the characteristic after the adherence test and the environmental test than the photovoltaic elements wherein the content of nitrogen atoms is less than 0.1 ppm or more than 1000 ppm, whereby the use of a light reflecting layer containing nitrogen from 0.1 ppm to 1000 ppm can provide a further beneficial effect.

EXAMPLE 30

As in Example 24, using a DC magnetron sputtering apparatus as shown in FIG. 8, 300 nm thick light reflecting layers of Cu containing different amounts of carbon were formed on the substrate by varying the flow of methane gas introduced into the deposition chamber 801, as in Example 24. In this example, the methane CH₄/Ar gas cylinders used contained CH₄ gas diluted to 1 ppm and diluted to 1% by Ar gas.

Subsequently, for the substrates with respective light reflecting layers deposited, secondary ion mass spectrometry (SIMS) was conducted for a part of each of the substrates to measure the amount of carbon in the light reflecting layer of Cu. The amount of carbon atoms in the light reflecting layer as fabricated is listed in Table 24.

TABLE 24

| | Carbon content ppm | Initial characteristic | After adherence test | After environmental test |
|---|---|---|---|---|
| Element example 30-1 | 0.05 | 1.00 | 1.00 | 1.00 |
| Element example 30-2 | 0.1 | 1.05 | 1.05 | 1.06 |
| Element example 30-3 | 0.5 | 1.05 | 1.06 | 1.07 |
| Element example 30-4 | 10 | 1.06 | 1.05 | 1.06 |
| Element example 30-5 | 100 | 1.05 | 1.05 | 1.06 |
| Element example 30-6 | 500 | 1.05 | 1.05 | 1.07 |
| Element example 30-7 | 1000 | 1.05 | 1.05 | 1.06 |
| Element example 30-8 | 1200 | 0.99 | 0.99 | 1.00 |
| Element example 30-9 | 1500 | 0.99 | 0.99 | 0.98 |

Next, using the DC magnetron sputtering apparatus as shown in FIG. 8, a 1 μm thick light reflection multiplying layer was deposited on the light reflecting layers containing respective amounts of carbon, as in Example 22, and further, using the μW glow discharge decomposition apparatus as shown in FIG. 13, a non-single crystal silicon type semiconductor layer, a transparent electrode and a collector electrode were laminated on the light reflection multiplying layer, whereby a plurality of photovoltaic elements were fabricated (Element Examples 30-1 to 30-9). For measuring the solar cell characteristics of the photovoltaic elements, the same evaluation tests as in Example 1 were conducted. The results are listed in Table 24.

As is clear from Table 24, the photovoltaic elements wherein the amount of carbon in the light reflecting layer is in a range from 0.1 ppm to 1000 ppm have greater photoelectric conversion initial characteristics and the characteristics after the adherence test and environmental test than the photovoltaic elements wherein the amount of carbon is less than 0.1 ppm or more than 1000 ppm or more, whereby the use of a light reflecting layer containing carbon from 0.1 ppm to 1000 ppm can provide a further beneficial effect.

EXAMPLE 31

Using a substrate of barium borosilicate glass (7059 made by Corning), 50 mm square and 1 mm thick, after an 80 nm thick transparent electrode of ITO was formed thereon, a first p-type layer, a first i-type layer, a first n-type layer, a second p-type layer, a second i-type layer, and a second n-type layer were formed under the conditions of Table 25, and a light reflection multiplying layer and a light reflecting layer of Cu containing oxygen were formed thereon under the conditions of Example 22, whereby a photovoltaic element as shown in FIG. 2 was fabricated (Element Example 31).

a first n-type layer, a second p-type layer, a second i-type layer, and a second n-type layer were formed under the conditions of Table 25, and a light reflection multiplying layer and a light reflecting layer of Cu containing carbon were formed thereon under the conditions of Example 24, whereby a photovoltaic element as shown in FIG. 2 was fabricated (Element Example 33).

COMPARATIVE EXAMPLE 9

After an 80 nm thick transparent electrode of ITO was formed on a substrate, as in Example 31, a first p-type layer, a first i-type layer, a first n-type layer, and a second p-type layer, a second i-type layer, and a second n-type layer were formed under the conditions of Table 25, and a light reflection multiplying layer and a light reflecting layers not containing an additive element were formed thereon under the same conditions as those of Comparative Experiment Example 3, whereby a photovoltaic element was fabricated (Element Comparative Example 9).

To demonstrate the effect of the present invention on the solar cell characteristics of the photovoltaic elements as above fabricated in Examples 31 to 33 and Comparative Example 9, the same evaluation tests as in Example 1 were conducted. The results are listed in

TABLE 25

| | $SiH_4$ flow (sccm) | $GeH_4$ flow (sccm) | $H_2$ flow (sccm) | $B_2H_6/H_2$ flow (sccm) | $PH_3/H_2$ flow (sccm) | Internal pressure (Torr) | Temperature (°C.) | μW power (mW/cm$^3$) | DC bias (V) | RF bias (mW/cm$^3$) | Layer thickness (nm) |
|---|---|---|---|---|---|---|---|---|---|---|---|
| 1st n-type layer | 30 | | 100 | | 6 | 10 | 350 | 750 | — | — | 10 |
| 1st i-type layer | 150 | 50 | 100 | | | 5 | 350 | 100 | 75 | 200 | 250 |
| 1st p-type layer | 10 | | 100 | 5 | | 10 | 325 | 400 | — | — | 5 |
| 2nd n-type layer | 30 | | 100 | | 6 | 10 | 300 | 50 | — | — | 10 |
| 2nd i-type layer | 200 | | 100 | | | 5 | 300 | 100 | — | 200 | 150 |
| 2nd p-type layer | 10 | | 100 | 5 | | 10 | 275 | 400 | — | — | 5 |

EXAMPLE 32

Using a substrate of barium borosilicate glass (7059 made by Corning), 50 mm square and 1 mm thick, after an 80 nm thick transparent electrode of ITO was formed thereon, a first p-type layer, a first i-type layer, a first n-type layer, a second p-type layer, a second i-type layer, and a second n-type layer were formed under the conditions of Table 25, and a light reflection multiplying layer and a light reflecting layer of Cu containing nitrogen were formed thereon under the conditions of Example 23, whereby a photovoltaic element as shown in FIG. 2 was fabricated (Element Example 32).

EXAMPLE 33

Using a substrate of barium borosilicate glass (7059 made by Corning), 50 mm square and 1 mm thick, after an 80 nm thick transparent electrode of ITO was formed thereon, a first p-type layer, a first i-type layer, Table 26.

TABLE 26

| | Additive element | Initial characteristic | After adherence test | After environmental test |
|---|---|---|---|---|
| Element example 31 | O | 1.04 | 1.04 | 1.05 |
| Element example 32 | N | 1.07 | 1.08 | 1.07 |
| Element example 33 | C | 1.06 | 1.06 | 1.07 |
| Element comparative example 9 | None | 1.00 | 1.00 | 1.00 |

As is clear from Table 26, the photovoltaic elements in Examples 31 to 33 are more improved in the initial characteristics, as well as in the durability and the environmental resistance than that of Comparative Example 9.

EXAMPLE 34

A photovoltaic element of the present invention was fabricated by electron beam (EB) vacuum vapor deposition, DC magnetron sputtering, and μW glow discharge decomposition.

Using an apparatus as shown in FIG. 12, a 300 nm thick light reflecting layer of Cu containing oxygen was formed on a stainless substrate by electron beam (EB) vacuum vapor deposition, as in Experiment Example 10 and a light reflection multiplying layer composed of zinc oxide (ZnO) was formed thereon by DC sputtering. Then, under the conditions of Table 27, on the light reflection multiplying layer there were laminated a non-single crystal silicon type semiconductor layer, a transparent electrode, and a collector electrode, whereby a photovoltaic element was fabricated (Element Example 34).

TABLE 27

| | SiH$_4$ flow (sccm) | GeH$_4$ flow (sccm) | H$_2$ flow (sccm) | B$_2$H$_6$/H$_2$ flow (sccm) | PH$_3$/H$_2$ flow (sccm) | Internal pressure (Torr) | Temperature (°C.) | μW power (mW/cm$^3$) | DC bias (V) | RF bias (mW/cm$^3$) | Layer thickness (nm) |
|---|---|---|---|---|---|---|---|---|---|---|---|
| 1st n-type layer | 30 | | 100 | | 6 | 10 | 350 | 50 | — | — | 10 |
| 1st i-type layer | 150 | 50 | 100 | | | 5 | 350 | 100 | 75 | 2100 | 250 |
| 1st p-type layer | 10 | | 100 | 5 | | 10 | 325 | 400 | — | — | 5 |
| 2nd n-type layer | 30 | | 100 | | 6 | 10 | 300 | 50 | — | — | 10 |
| 2nd i-type layer | 200 | | 100 | | | 5 | 300 | 100 | — | 200 | 400 |
| 2nd p-type layer | 10 | | 100 | 5 | | 10 | 275 | 400 | — | — | 5 |
| 3nd n-type layer | 30 | | 100 | | 6 | 10 | 250 | 50 | — | — | 10 |
| 3nd i-type layer | 200 | | 100 | | | 5 | 250 | 100 | — | 200 | 100 |
| 3nd p-type layer | 10 | | 100 | 5 | | 10 | 200 | 400 | — | — | 5 |

EXAMPLE 35

A photovoltaic element of the present invention was fabricated by electron beam (EB) vacuum vapor deposition, DC magnetron sputtering, and μW glow discharge decomposition.

Using an apparatus as shown in FIG. 12, a 300 nm thick light reflecting layer of Cu containing nitrogen was formed on a stainless substrate by electron beam (EB) vacuum vapor deposition, as in Experiment Example 4-2, and a light reflection multiplying layer composed of zinc oxide (ZnO) was formed thereon by DC sputtering. Then, as in Example 34, on the light reflection multiplying layer there were laminated a non-single crystal silicon type semiconductor layer, a transparent electrode, and a collector electrode, whereby a photovoltaic element was fabricated (Element Example 35).

EXAMPLE 36

A photovoltaic element of the present invention was fabricated by electron beam (EB) vacuum vapor deposition, DC magnetron sputtering, and μW glow discharge decomposition.

Using an apparatus as shown in FIG. 12, a 300 nm thick light reflecting layer of Cu containing carbon was formed on a stainless substrate by electron beam (EB) vacuum vapor deposition, as in Experiment Example 4-3, and a light reflection multiplying layer composed of zinc oxide (ZnO) was formed thereon by DC sputtering. Then, as in Example 34, on the light reflection multiplying layer there were laminated a non-single crystal silicon type semiconductor layer, a transparent electrode, and a collector electrode, whereby a photovoltaic element was fabricated (Element Example 36).

COMPARATIVE EXAMPLE 10

Using an apparatus of FIG. 12, a 300 nm thick light reflecting layer of Cu not-containing an additive element and a 1 μm thick light reflection multiplying layer composed of zinc oxide (ZnO) over it were formed on a stainless substrate, as in Comparative Experiment Example 4. A photovoltaic element was fabricated in the same way as for the other layers in Example 34 (Element Comparative Example 10).

To demonstrate the effect of the present invention on the solar cell characteristics of the photovoltaic elements as above fabricated in Examples 34 to 36 and Comparative Example 10, the same evaluation tests as in Example 1 were conducted. The results are listed in Table 28.

As is clear from Table 28, the photovoltaic elements in Examples 34 to 36 are more improved in the initial characteristic, as well in as the durability and environmental resistance than that of Comparative Example 10.

TABLE 28

| | Additive element | Initial characteristic | After adherence test | After environmental test |
|---|---|---|---|---|
| Element example 34 | O | 1.03 | 1.04 | 1.05 |
| Element example 35 | N | 1.06 | 1.06 | 1.07 |
| Element example 36 | C | 1.05 | 1.06 | 1.07 |
| Element comparative example 10 | None | 1.00 | 1.00 | 1.00 |

EXAMPLE 37

A photovoltaic element of the present invention was fabricated by the DC magnetron sputtering method and the μW glow discharge decomposition method.

Using a DC magnetron sputtering apparatus as shown in FIG. 8, a 300 nm thick light reflecting layer of Cu containing oxygen and a light reflection multiplying layer were formed on a stainless substrate, as in Example 22, and then in the same way as in Example 34, on the light reflecting layer there were laminated a non-single crystal silicon type semiconductor layer composed of a first n-type layer, a first i-type layer, a first p-type layer, a second n-type layer, a second i-type layer, a second p-type layer, a third n-type layer, a third i-type layer, and a third p-type layer, further followed by a transparent electrode and a collector electrode, whereby a tandem photovoltaic element of the triple cell type was fabricated (Element Example 37).

EXAMPLE 38

A photovoltaic element of the present invention was fabricated by the DC magnetron sputtering method and the μW glow discharge decomposition method.

Using a DC magnetron sputtering apparatus as shown in FIG. 8, a 300 nm thick light reflecting layer of Cu containing nitrogen and a light reflection multiplying layer were formed on a stainless substrate, as in Example 23, and then in the same way as in Example 34, on the light reflecting layer there were laminated a non-single crystal silicon type semiconductor layer composed of a first n-type layer, a first i-type layer, a first p-type layer, a second n-type layer, a second i-type layer, a second p-type layer, a third n-type layer, a third i-type layer, and a third p-type layer, further followed by a transparent electrode and a collector electrode, whereby a tandem photovoltaic element of the triple cell type was fabricated (Element Example 38).

EXAMPLE 39

A photovoltaic element of the present invention was fabricated by the DC magnetron sputtering method and the μW glow discharge decomposition method.

Using a DC magnetron sputtering apparatus as shown in FIG. 8, a 300 nm thick light reflecting layer of Cu containing carbon and a light reflection multiplying layer were formed on a stainless substrate, as in Example 24, and then in the same way as in Example 34, on the light reflecting layer there were laminated a non-single crystal silicon type semiconductor layer composed of a first n-type layer, a first i-type layer, a first p-type layer, a second n-type layer, a second i-type layer, a second p-type layer, a third n-type layer, a third i-type layer, and a third p-type layer, further followed by a transparent electrode and a collector electrode, whereby a tandem photovoltaic element of the triple cell type was fabricated (Element Example 39).

COMPARATIVE EXAMPLE 11

As in Comparative Experiment Example 3, a light reflecting layer not containing an additive element and a light reflection multiplying layer were formed on a stainless substrate, and then using a μW glow discharge decomposition apparatus, a non-single crystal silicon type semiconductor layer was laminated on the light reflecting layer, as in Example 34, and further a transparent electrode and a collector electrode were laminated in the same way and under the same conditions as in Example 17, whereby a photovoltaic element was fabricated (Element Comparative Example 11).

To demonstrate the effect of the present invention on the solar cell characteristics of the photovoltaic elements as above fabricated in Examples 37 to 39 and Comparative Example 11, the same evaluation tests as in Example 1 were conducted. The results are listed in Table 29.

TABLE 29

| | Additive element | Initial characteristic | After adherence test | After environmental test |
|---|---|---|---|---|
| Element example 37 | O | 1.04 | 1.04 | 1.05 |
| Element example 38 | N | 1.08 | 1.08 | 1.09 |
| Element example 39 | C | 1.07 | 1.07 | 1.08 |
| Element comparative example 11 | None | 1.00 | 1.00 | 1.00 |

As is clear from Table 29, the photovoltaic elements in Examples 37 to 39 are more improved in the initial characteristic, durability and environmental resistance than that of Comparative Example 11.

EXAMPLE 40

A photovoltaic element of the present invention was fabricated by DC magnetron sputtering and μW glow discharge decomposition.

Using a DC magnetron sputtering apparatus as shown in FIG. 8, a 300 nm thick light reflecting layer of textured structure containing oxygen was formed on a substrate 802 under the same conditions as in Example 22, except that the temperature of the substrate 802 was held at 350° C. by heater 803.

Then, as in Example 22, on the light reflecting layer there was deposited a 1 μm thick light reflection multiplying layer (ZnO), on which were further laminated a non-single crystal silicon type semiconductor layer, a transparent electrode, and a collector electrode by using the μW glow discharge decomposition apparatus as shown in FIG. 13, whereby a photovoltaic element was fabricated (Element Example 40).

EXAMPLE 41

A photovoltaic element of the present invention was fabricated by DC magnetron sputtering and μW glow discharge decomposition.

Using a DC magnetron sputtering apparatus as shown in FIG. 8, a 300 nm thick light reflecting layer of textured structure containing nitrogen was formed on a substrate 802 under the same conditions as those of Example 23, except that the temperature of the substrate 802 was held at 350° C. by heater 803.

Then, as in Example 23, on the light reflecting layer there was deposited a 1 μm thick light reflection multiplying layer (ZnO), on which were further laminated a non-single crystal silicon type semiconductor layer, a transparent electrode, and a collector electrode by using a μW glow discharge decomposition apparatus as shown in FIG. 13, whereby a photovoltaic element was fabricated (Element Example 41).

EXAMPLE 42

A photovoltaic element of the present invention was fabricated by DC magnetron sputtering and μW glow discharge decomposition.

Using a DC magnetron sputtering apparatus as shown in FIG. 8, a 300 nm thick light reflecting layer of textured structure containing carbon was formed on a substrate 802 under the same conditions as those of Example 24, except that the temperature of the substrate 802 was held at 350° C. by heater 803. Then, as in Example 24, on the light reflecting layer there was deposited a 1 μm thick light reflection multiplying layer (ZnO), on which were further laminated a non-single crystal silicon type semiconductor layer, a transparent electrode, and a collector electrode by using the μW glow discharge decomposition apparatus as shown in FIG. 13, whereby a photovoltaic element was fabricated (Element Example 42).

COMPARATIVE EXAMPLE 12

A 300 nm thick light reflecting layer of textured structure not containing an additive element was formed on a substrate 802 under the same conditions as those of Example 40, except that Ar gas was introduced into the deposition chamber 802, instead of $O_2$/Ar gas. Thereafter, a photovoltaic element was fabricated in the same way as in Example 22 (Element Comparative Example 12).

To demonstrate the effect of the present invention on the solar sell characteristics of the photovoltaic elements as above fabricated in Examples 40 to 42 and Comparative Example 12, the same evaluation tests as in Example 1 were conducted. The results are listed in Table 30.

TABLE 30

|  | Additive element | Initial characteristic | After adherence test | After environmental test |
|---|---|---|---|---|
| Element example 40 | O | 1.05 | 1.05 | 1.07 |
| Element example 41 | N | 1.09 | 1.09 | 1.11 |
| Element example 42 | C | 1.07 | 1.07 | 1.10 |
| Element comparative example 12 | None | 1.00 | 1.00 | 1.00 |

As is clear from Table 30, the photovoltaic elements of Examples 40 to 42 are more improved in the initial characteristics, durability and environmental resistance than that of Comparative Example 12.

EXAMPLE 43

A photovoltaic element of the present invention was fabricated by electron beam (EB) vacuum vapor deposition, DC magnetron sputtering, and μW glow discharge decomposition.

Using an apparatus as shown in FIG. 12, a 300 nm thick light reflecting layer of Cu containing oxygen and nitrogen was formed on a stainless substrate by electron beam (EB) vacuum vapor deposition, as in Experiment Example 4-2, except that $O_2$/Ar gas of 50 ppm was supplied at 5 sccm in addition to the $N_2$ gas in Experiment Example 4-2. Further, a light reflection multiplying layer composed of zinc oxide (ZnO) was formed thereon by DC sputtering.

Then, under the conditions of Table 27, on the light reflecting layer there were laminated a non-single crystal silicon type semiconductor layer composed of a first n-type layer, a first i-type layer, a first p-type layer, a second n-type layer, a second i-type layer, a second p-type layer, a third n-type layer, a third i-type layer, and a third p-type layer, followed by a transparent electrode and a collector electrode, whereby a tandem photovoltaic element of the triple cell type was fabricated (Element Example 43).

EXAMPLE 44

A photovoltaic element of the present invention was fabricated by electron beam (EB) vacuum vapor deposition, DC magnetron sputtering, and μW glow discharge decomposition.

Using an apparatus as shown in FIG. 12, a 300 nm thick light reflecting layer of Cu containing oxygen and nitrogen was formed on a stainless substrate by electron beam (EB) vacuum vapor deposition, as in Experiment Example 4-3, except that $O_2$/Ar gas of 50 ppm was supplied at 5 sccm in addition to the $CH_4$/Ar gas in Experiment Example 4-3. Further, a light reflection multiplying layer composed of zinc oxide (ZnO) was formed thereon by DC sputtering.

Then, under the conditions of Table 27, on the light reflecting layer there were laminated a non-single crystal silicon type semiconductor layer composed of a first n-type layer, a first i-type layer, a first p-type layer, a second n-type layer, a second i-type layer, a second p-type layer, a third n-type layer, a third i-type layer, and a third p-type layer, followed by a transparent electrode and a collector electrode, whereby a tandem photovoltaic element of the triple cell type was fabricated (Element Example 44).

EXAMPLE 45

A photovoltaic element of the present invention was fabricated by electron beam (EB) vacuum vapor deposition, DC magnetron sputtering, and μW glow discharge decomposition.

Using an apparatus as shown in FIG. 12, a 300 nm thick light reflecting layer of Cu containing oxygen, carbon, and nitrogen was formed on a stainless substrate by electron beam (EB) vacuum vapor deposition, as in Experiment Example 4-2, except that $O_2$/Ar gas of 50 ppm was supplied at 5 sccm and $CH_4$/Ar gas of 50 ppm was supplied at 10 sccm, in addition to the $N_2$ gas in Experiment Example 4-2. Further, a light reflection multiplying layer composed of zinc oxide (ZnO) was formed thereon by DC sputtering.

Then, under the conditions of Table 27, on the light reflecting layer there were laminated a non-single crystal silicon type semiconductor layer composed of a first n-type layer, a first i-type layer, a first p-type layer, a second n-type layer, a second i-type layer, a second p-type layer, a third n-type layer, a third i-type layer, and a third p-type layer, followed by a transparent electrode and a collector electrode, whereby a tandem photovoltaic element of the triple cell type was fabricated (Element Example 45).

COMPARATIVE EXAMPLE 13

As in Comparative Experiment Example 4, a light reflecting layer not containing an additive element and a light reflection multiplying layer were formed on a stainless substrate. Then, under the conditions of Table 27, on the light reflecting layer there were laminated a non-single crystal silicon type semiconductor layer composed of a first n-type layer, a first i-type layer, a first p-type layer, a second n-type layer, a second i-type layer, a second p-type layer, a third n-type layer, a third i-type layer, and a third p-type layer, followed by a transparent electrode and a collector electrode, whereby a tandem photovoltaic element of the triple cell type was fabricated (Element Comparative Example 13).

To demonstrate the effect of the present invention on the solar cell characteristics of the photovoltaic elements as above fabricated in Examples 43 to 45 and Comparative Example 13, the same evaluation tests as in Example 1 were conducted. The results are listed in Table 31.

TABLE 31

|  | Additive element | Initial characteristic | After adherence test | After environmental test |
|---|---|---|---|---|
| Element example 43 | N, O | 1.10 | 1.10 | 1.11 |
| Element example 44 | C, O | 1.09 | 1.10 | 1.11 |
| Element example 45 | N, C, O | 1.12 | 1.11 | 1.12 |
| Element comparative example 13 | None | 1.00 | 1.00 | 1.00 |

As is clear from Table 31, the photovoltaic elements of Examples 43 to 45 are more improved in the initial characteristics, as well as durability and environmental resistance than that of Comparative Example 13.

EXAMPLE 46

With the DC magnetron sputtering method and the microwave ($\mu$W) glow discharge decomposition method, photovoltaic element having the constitution of FIG. 1 was fabricated.

Using a DC magnetron sputtering apparatus as shown in FIG. 8, a 300 nm thick light reflecting layer of Ag containing lead and a 1 mm thick light reflection multiplying layer of ZnO were fabricated on a 50 mm square and 0.2 mm thick substrate made of stainless (SUS430) and having a specularly polished surface, in the same way as in Experiment Example 5-1.

Subsequently, using $\mu$W glow discharge decomposition apparatus comprised of a source gas supply unit 1320 and a deposition unit 1300 as shown in FIG. 13, a non-single crystal silicon type semiconductor layer composed of n-type layer, i-type layer, and p-type layer was fabricated on the light reflection multiplying layer under the fabrication conditions as listed Table 5.

Finally, an 80 nm thick transparent electrode of ITO ($In_2O_3+SnO_2$) was vapor deposited, and a 1 $\mu$m thick collector electrode of Cr was vapor deposited in vacuum to fabricate a photovoltaic element (Element Example 46).

EXAMPLE 47

A 300 nm thick light reflecting layer of Ag containing lead and gold and a 1 $\mu$m thick light reflection multiplying layer of ZnO were formed on a stainless substrate, as in Experiment Example 5-2. Subsequently, as in Example 46, an n-type layer, an i-type layer, a p-type layer, a transparent electrode, and a collector electrode were formed, whereby a photovoltaic element of FIG. 1 type was fabricated (Element Example 47).

EXAMPLE 48

A 300 nm thick light reflecting layer of Ag containing lead and gold and a first transition group metal (iron, chromium, or nickel) and a 1 $\mu$m thick light reflection multiplying layer were formed on a stainless substrate, as in Experiment Example 5-3. Subsequently, as in Example 46, an n-type layer, an i-type layer, a p-type layer, a transparent electrode, and a collector electrode were formed, whereby a photovoltaic element of FIG. 1 type was fabricated (Element Examples 48-1 to 48-3).

COMPARATIVE EXAMPLE 14

A 300 nm thick light reflecting layer of Ag not containing an additive element was formed, as in Comparative Experiment Example 5, and then a light reflection multiplying layer, an n-type layer, an i-type layer, a p-type layer, a transparent electrode, and a collector electrode were formed thereon under the same forming conditions as those of Example 46, whereby a photovoltaic element was fabricated (Element Comparative Example 14).

To demonstrate the effects of the present invention on the photovoltaic elements as above fabricated in Examples 46 to 48 and Comparative Example 14, the same evaluation tests as in Example 1 were conducted.
(A) Initial Characteristics To investigate the initial characteristics of the photovoltaic elements as solar cells, the photovoltaic elements were illuminated with AM-1.5 (100 mW/cm$^2$) light to measure the V-I characteristics and thus evaluate the photoelectric conversion efficiency. The results are listed in Table 32.

As indicated by Table 32, the photovoltaic conversion efficiency of the photovoltaic elements of Examples 46 to 48 was greater than that of the photovoltaic element of Comparative Example 14, whereby it seen that the photovoltaic element using a Ag light reflecting layer of the present invention containing lead, lead and gold, or lead, gold, and a first transition group metal provides better characteristics than that using the conventional light reflecting layer.
(B) Adherence Dependency of the Characteristics To investigate the adherence dependency of the solar cell characteristics of the photovoltaic elements, a bend test for the stainless substrates 601 with the photovoltaic element deposited thereon was conducted using the bending tester of FIG. 6. Thereafter, the photoelectric conversion efficiency was measured under illumination of AM-1.5 light. The measured results are listed are listed in Table 32.

TABLE 32

| | Additive element(s) | Initial characteristic | After adherence test | After environmental test |
|---|---|---|---|---|
| Element example 46 | Pb | 1.03 | 1.04 | 1.07 |
| Element example 47 | Pb, Au | 1.04 | 1.06 | 1.07 |
| Element example 48-1 | Pb, Au, Ni | 1.06 | 1.08 | 1.10 |
| Element example 48-2 | Pb, Au, Cr | 1.07 | 1.10 | 1.09 |
| Element example 48-3 | Pb, Au, Fe | 1.09 | 1.10 | 1.13 |
| Element example 48-4 | None | 1.00 | 1.00 | 1.00 |

From these results, it is seen that the photovoltaic conversion efficiencies of the photovoltaic elements of Examples 46 to 48 are greater than that of the photovoltaic element of Comparative Example 14, whereby it is seen that the photovoltaic element using the Ag light reflecting layer of the present invention containing lead, lead and gold, or lead, gold and a first transition group metal exhibits better durability than the conventional photovoltaic element.

(C) Environmental Variation Dependency of Characteristic

The photovoltaic element was placed in the dark at a temperature of 85° C. and relative humidity of 85% for four hours and a temperature of −40° C. for forty minutes was repeated 30 times and the photoelectric conversion efficiency then examined. The results are listed in Table 32.

As is clear from the Table 32, the photovoltaic elements of Examples 46 to 48 have less reduction in photoelectric conversion efficiency with the heat cycling, and better environmental resistance that the photovoltaic element of Comparative Example 14.

From the above evaluation tests, it has been found that the photovoltaic elements using a Ag light reflecting layer of the present invention containing lead, lead and gold, or lead, gold, and a first transition group metal has better environmental resistance characteristics than the conventional photovoltaic element.

EXAMPLE 49

With the DC magnetron sputtering method and the RF glow discharge decomposition method, a photovoltaic element of the present invention was fabricated.

First, using a DC magnetron sputtering apparatus of FIG. 8, a 300 nm thick light reflecting layer of AG containing lead and a 1 μm thick light reflection multiplying layer were fabricated on a substrate under the same fabrication conditions as those of Experiment Example 5-1.

Subsequently, using RF glow discharge decomposition apparatus comprised of a source gas supply unit 1320 and a deposition unit 1400 as shown in FIG. 14, a non-single crystal silicon type semiconductor layer composed of an n-type layer, i-type layer, and p-type layer was fabricated on the light reflection multiplying layer under the fabrication conditions of Table 8.

Finally, an 80 nm thick transparent electrode of ITO ($In_2O_3 + SnO_2$) was vacuum vapor deposited on the p-type layer, and a 1 μm thick collector electrode of Cr was vacuum vapor deposited thereon to fabricate a photovoltaic element (Element Example 49).

EXAMPLE 50

A light reflecting layer of Ag containing lead and gold was formed on a stainless substrate, as in Experiment Example 5-2, and a light reflection multiplying layer, an n-type layer, an i-type layer, a p-type layer, a transparent electrode, and a collector electrode were formed thereon, as in Example 49, whereby a photovoltaic element was fabricated (Element Example 50).

EXAMPLE 51

A light reflecting layer of Cu containing lead, gold, and a first transition group metal (iron, chromium or nickel) was formed on a stainless substrate as in Experiment Example 5-3, and a light reflection multiplying layer, an n-type layer, and i-type layer, a p-type layer, a transparent electrode, and a collector electrode were formed thereon as in Example 49, whereby a photovoltaic element was fabricated (Element Examples 51-1 to 51-3).

COMPARATIVE EXAMPLE 15

A light reflecting layer was formed, as in Comparative Example 14, and subsequently a light reflection multiplying layer, a semiconductor layer, a transparent electrode, and a collector electrode were formed, as in Example 49, whereby a conventional photovoltaic element was fabricated (Element Comparative Example 15).

To demonstrate the effect of the present invention on the solar cell characteristics of the photovoltaic elements as above fabricated in Examples 49 to 51-3 and Comparative Example 15, the same evaluation tests as in Example 1 were conducted. The results are listed in Table 33.

TABLE 33

| | Additive element(s) | Initial characteristic | After adherence test | After environmental test |
|---|---|---|---|---|
| Element example 49 | Pb | 1.02 | 1.05 | 1.09 |
| Element example 50 | Pb, Au | 1.03 | 1.07 | 1.10 |
| Element example 51-1 | Pb, Au, Ni | 1.05 | 1.08 | 1.11 |
| Element example 51-2 | Pb, Au, Cr | 1.05 | 1.09 | 1.12 |
| Element comparative example 51-3 | Pb, Au, Fe | 1.08 | 1.11 | 1.14 |
| Element comparative example 15 | None | 1.00 | 1.00 | 1.00 |

As is clear from Table 33, the photovoltaic element in Examples 49 to 51 are more improved in the initial characteristics, as well as durability and environmental resistance than that of Comparative Example 15.

EXAMPLE 52

As in Example 46, using the DC magnetron sputtering apparatus as shown in FIG. 8, a 300 nm thick light reflecting layer of Ag containing different amounts of lead was formed on a substrate by using a plurality of targets containing 2 to 500 ppm of Pb in Ag of a purity of 99.999%.

Subsequently, for each substrate with a light reflecting layer deposited thereon, secondary ion mass spectrometry (SIMS) was conducted on a part of each of the substrates to measure the amount of lead in the light reflecting layer of Ag.

The amount of lead atoms in each light reflecting layer as fabricated is listed in Table 34.

TABLE 34

| | Lead content ppm | Initial characteristic | After adherence test | After environmental test |
|---|---|---|---|---|
| Element example 52-1 | 1.5 | 1.00 | 1.00 | 1.00 |
| Element example 52-2 | 2.0 | 1.04 | 1.04 | 1.05 |
| Element example 52-3 | 5.0 | 1.05 | 1.04 | 1.05 |
| Element example 52-4 | 10 | 1.06 | 1.05 | 1.06 |
| Element example 52-5 | 20 | 1.06 | 1.07 | 1.08 |
| Element example 52-6 | 50 | 1.05 | 1.06 | 1.06 |
| Element example 52-7 | 100 | 1.04 | 1.04 | 1.05 |
| Element example 52-8 | 200 | 1.00 | 0.99 | 1.00 |
| Element example 52-9 | 500 | 0.99 | 0.99 | 0.98 |

Next, using the DC magnetron sputtering apparatus as shown in FIG. 8, a 1 μm thick light reflection multiplying layer was deposited on the light reflecting layer containing respective amounts of lead in the same way as in Example 46, and further, using the μW glow discharge decomposition apparatus as shown in FIG. 13, there were laminated on the light reflection multiplying layer, a non-single crystal silicon type semiconductor layer, a transparent electrode, and a collector electrode, whereby a plurality of photovoltaic elements were fabricated (Element Examples 52-1 to 52-9). For determining the solar cell characteristics of the photovoltaic elements, the same evaluation tests as in Example 1 were conducted.

The results are listed in Table 34.

As is clear from Table 34, the photovoltaic elements wherein the amount of lead in the light reflecting layer is in a range from 2 ppm to 100 ppm has a greater initial photoelectric conversion characteristic and the characteristic after the adherence test and the environmental test is greater than for the photovoltaic elements wherein the amount of lead atoms is less than 2 ppm or more than 100 ppm, whereby the use of a light reflecting layer containing lead from 2 ppm to 100 ppm can provide a further beneficial effect.

EXAMPLE 53

As in Example 47, using the DC magnetron sputtering apparatus as shown in FIG. 8, a 300 nm thick light reflecting layer of Ag containing different amounts of lead and gold was formed on the substrate by using a plurality of targets containing 2 to 500 ppm of Pb and Au in Ag having a purity of 99.999%, as in Example 47.

Subsequently, for each substrate with respective light reflecting layers deposited, secondary ion mass spectrometry (SIMS) was conducted on a part of the substrate to measure the amount of lead and gold in the light reflecting layer of Ag.

The amount of lead and gold in the light reflecting layer as fabricated is listed in Table 35.

Next, using the DC magnetron sputtering apparatus as shown in FIG. 8, a 1 μm thick light reflection multiplying layer was deposited on the light reflecting layer containing respective amounts of lead and gold, as in Example 46, and further, using μW glow discharge decomposition apparatus as shown in FIG. 13, there were laminated on the light reflection multiplying layer, a non-single crystal silicon type semiconductor layer, a transparent electrode and a collector electrode, whereby a plurality of photovoltaic elements were fabricated (Element Examples 53-1 to 53-9). For the solar cell characteristics of the photovoltaic elements, the same evaluation tests as in Example 1 were conducted. The results are listed in Table 35.

TABLE 35

| | Lead/gold content ppm | Initial characteristic | After adherence test | After environmental test |
|---|---|---|---|---|
| Element example 53-1 | 1.5 | 1.00 | 1.00 | 1.00 |
| Element example 53-2 | 2.0 | 1.05 | 1.05 | 1.06 |
| Element example 53-3 | 5.0 | 1.07 | 1.06 | 1.07 |
| Element example 53-4 | 10 | 1.08 | 1.06 | 1.08 |
| Element example 53-5 | 20 | 1.09 | 1.07 | 1.07 |
| Element example 53-6 | 50 | 1.07 | 1.07 | 1.06 |
| Element example 53-7 | 100 | 1.05 | 1.05 | 1.06 |
| Element example 53-8 | 200 | 1.00 | 1.00 | 1.00 |
| Element example 53-9 | 500 | 0.99 | 0.97 | 1.00 |

As is clear from Table 35, the photovoltaic elements wherein the amount of lead and gold in the light reflecting layer is in a range from 2 ppm to 100 ppm have a greater photoelectric conversion initial characteristics and the characteristics after the adherence test and the environment test are higher than the photovoltaic element wherein the amount of lead and gold is less than 2 ppm or more than 100 ppm, whereby the use of light reflecting layer containing lead and gold atoms from 2 ppm to 100 ppm can provide a further beneficial effect.

EXAMPLE 54

As in Example 48, using the DC magnetron sputtering apparatus as shown in FIG. 8, 300 nm thick light reflecting layers of Ag containing different amounts of lead, gold and a first transition group metal was formed on a plurality of substrates by using a plurality of targets containing Pb, Au, and a first transition group metal (Ni, Cr, Fe) in Ag having a purity of 99.999%.

Subsequently, for each of the substrates with respective light reflecting layers deposited, secondary ion mass spectrometry (SIMS) was conducted on a part of each substrate to measure the amounts of lead, gold, and a first transition group metal in the light reflecting layer of Ag.

The amounts of lead, gold, and a first transition group metal in the light reflecting layer as fabricated are listed in Table 36.

Next, using the DC magnetron sputtering apparatus as shown in FIG. 8, a 1 μm thick light reflection multiplying layer was deposited on the light reflecting layer containing respective amounts of lead, gold, and a first transition group metal, as in Example 46, and further, using the μW glow discharge decomposition apparatus as shown in FIG. 13, there were laminated on the light reflection multiplying layer, a non-single crystal silicon type semiconductor layer, a transparent electrode, and a collector electrode, whereby a plurality of photovoltaic elements were fabricated (Element Examples 54-1-1 to 54-3-9). For the solar cell characteristics of the photovoltaic elements, the same evaluation tests as in Example 1 were conducted. The results are listed in Table 36.

TABLE 36

| | Lead/gold/Ni content ppm | Initial characteristic | After adherence test | After environmental test |
|---|---|---|---|---|
| Element example 54-1-1 | 1.5 | 1.00 | 1.00 | 1.00 |
| Element example 54-1-2 | 2.0 | 1.06 | 1.07 | 1.06 |
| Element example 54-1-3 | 5.0 | 1.09 | 1.09 | 1.08 |
| Element example 54-1-4 | 10 | 1.11 | 1.10 | 1.09 |
| Element example 54-1-5 | 20 | 1.13 | 1.11 | 1.12 |
| Element example 54-1-6 | 50 | 1.12 | 1.10 | 1.09 |
| Element example 54-1-7 | 100 | 1.07 | 1.08 | 1.01 |
| Element example 54-1-8 | 200 | 1.02 | 1.03 | 0.99 |
| Element example 54-1-9 | 500 | 1.00 | 1.00 | 1.00 |
| Element example 54-2-1 | 1.5 | 1.00 | 1.00 | 1.00 |
| Element example 54-2-2 | 2.0 | 1.06 | 1.08 | 1.07 |
| Element example 54-2-3 | 5.0 | 1.09 | 1.10 | 1.08 |
| Element example 54-2-4 | 10 | 1.12 | 1.11 | 1.10 |
| Element example 54-2-5 | 20 | 1.14 | 1.12 | 1.13 |
| Element example 54-2-6 | 50 | 1.13 | 1.10 | 1.14 |
| Element example 54-2-7 | 100 | 1.08 | 1.07 | 1.09 |
| Element example 54-2-8 | 200 | 1.02 | 1.02 | 1.00 |
| Element example 54-2-9 | 500 | 0.99 | 0.97 | 1.00 |

| | Lead/gold/Fe content ppm | Initial characteristic | After adherence test | After environmental test |
|---|---|---|---|---|
| Element example 54-3-1 | 1.5 | 1.00 | 1.00 | 1.00 |
| Element example 54-3-2 | 2.0 | 1.06 | 1.07 | 1.08 |
| Element example 54-3-3 | 5.0 | 1.08 | 1.10 | 1.09 |
| Element example 54-3-4 | 10 | 1.12 | 1.12 | 1.10 |
| Element example 54-3-5 | 20 | 1.15 | 1.13 | 1.14 |
| Element example 54-3-6 | 50 | 1.13 | 1.12 | 1.13 |
| Element example 54-3-7 | 100 | 1.09 | 1.08 | 1.10 |
| Element example 54-3-8 | 200 | 1.03 | 1.01 | 1.02 |
| Element example 54-3-9 | 500 | 0.99 | 0.97 | 1.00 |

As is clear from Table 36, the photovoltaic elements wherein the amount of lead, gold, and a first transition group metal in the light reflecting layer is in a range from 2 ppm to 100 ppm has greater photoelectric conversion efficiency initial characteristics and the characteristics after the adherence test and the environmental test are greater than for the photovoltaic elements wherein the amounts of lead, gold, and a first transition group metal is less than 2 ppm or more than 100 ppm, whereby it has been found that the use of a light reflecting layer containing lead, gold, and a first transition group metal from 2 ppm to 100 ppm can provide a further beneficial effect.

EXAMPLE 55

Using a substrate of barium borosilicate glass (7059 made by Corning), 50 mm square and 1 mm thick, after an 80 nm thick transparent electrode of ITO was formed on the substrate, a first p-type layer, a first i-type layer, a first n-type layer, a second p-type layer, a second i-type layer, and a second n-type layer were formed under the conditions of Table 13, and a light reflection multiplying layer and a light reflecting layer of Ag containing lead were formed under the conditions of Example 46, whereby a photovoltaic element as shown in FIG. 2 was fabricated (Element Example 55).

EXAMPLE 56

Using a substrate of barium borosilicate glass (7059 made by Corning), 50 mm square and 1 mm thick, after an 80 nm thick transparent electrode of ITO was formed on the substrate, a first p-type layer, a first i-type layer, a first n-type layer, a second p-type layer, a second i-type layer, and a second n-type layer were formed under the conditions of Table 13, and a light reflection multiplying layer and a light reflecting layer of Ag containing lead and gold were formed under the conditions of Example 47, whereby a photovoltaic element as shown in FIG. 2 was fabricated (Element Example 56).

EXAMPLE 57

Using a substrate of barium borosilicate glass (7059 made by Corning), 50 mm square and 1 mm thick, after an 80 nm thick transparent electrode of ITO was formed on the substrate, a first p-type layer, a first i-type layer, a first n-type layer, a second p-type layer, a second i-type layer, and a second n-type layer were formed under the conditions of Table 13, and a light reflection multiplying layer and a light reflecting layer of Ag containing lead, gold, and a first transition group metal were formed under the conditions of Example 48, whereby a photovoltaic element as shown in FIG. 2 was fabricated (Element Examples 57-1 to 57-3).

COMPARATIVE EXAMPLE 16

After an 80 nm thick transparent electrode of ITO was formed on the substrate, as in Example 55, a first p-type layer, a first i-type layer, a first n-type layer, a second p-type layer, a second i-type layer, and a second n-type layer were formed under the conditions of Table 13, and a light reflection multiplying layer and a light reflecting layer of Ag not containing an additive element were formed under the conditions of Comparative Experiment Example 5, whereby a photovoltaic element was fabricated (Element Comparative Example 16).

To demonstrate the effect of the present invention on the solar cell characteristics of the photovoltaic elements as above fabricated in Examples 55 to 57-3 and Comparative Example 16, the same evaluation tests as in example 1 were conducted. The results are listed in Table 37.

TABLE 37

|  | Additive Element(s) | Initial Characteristic | After Adherence Test | After Environmental Test |
|---|---|---|---|---|
| Element Example 55 | Pb | 1.02 | 1.09 | 1.10 |
| Element Example 56 | Pb, Au | 1.04 | 1.10 | 1.13 |
| Element Example 57-1 | Pb, Au, Ni | 1.07 | 1.13 | 1.14 |
| Element Example 57-2 | Pb, Au, Cr | 1.08 | 1.14 | 1..15 |
| Element Example 57-3 | Pb, Au, Fe | 1.10 | 1.16 | 1.17 |
| Element Comparative Example 16 | None | 1.00 | 1.00 | 1.00 |

As is clear from Table 37, the photovoltaic elements of Examples 55 to 57 are more improved in the initial characteristics, as well as in the durability and the environment resistance than that of Comparative Example 16.

EXAMPLE 58

A photovoltaic element of the present invention was fabricated by the DC magnetron sputtering method and the μW glow discharge decomposition method.

Using a DC magnetron sputtering apparatus as shown in FIG. 8, a 300 nm thick light reflecting layer of Ag containing lead and a light reflection multiplying layer were formed on a stainless substrate, as in Example 46, and then under the fabrication conditions of Table 15, on the light reflection multiplying layer there were laminated a non-single crystal silicon type semiconductor layer composed of a first n-type layer, a first i-type layer, a first p-type layer, a second n-type layer, a second i-type layer, a second p-type layer, a third n-type layer, a third i-type layer, and a third p-type layer, further followed by a transparent electrode and a collector electrode, whereby a tandem photovoltaic element of the triple cell type was fabricated (Element Example 58).

EXAMPLE 59

A photovoltaic element of the present invention was fabricated by the DC magnetron sputtering method and the μW glow discharge decomposition method.

Using a DC magnetron sputtering apparatus as shown in FIG. 8, a 300 nm thick light reflecting layer of Ag containing lead and gold and a light reflection multiplying layer were formed on a stainless substrate, as in Example 47, and then, as in Example 58, on the light reflection multiplying layer there were laminated a non-single crystal silicon type semiconductor layer composed of a first n-type layer, a first i-type layer, a first p-type layer, a second n-type layer, a second i-type layer, a second p-type layer, a third n-type layer, a third i-type layer, and a third p-type layer, further followed by a transparent electrode and a collector electrode, whereby a tandem photovoltaic element of the triple cell type was fabricated (Element Example 59).

EXAMPLE 60

A photovoltaic element of the present invention was fabricated by the DC magnetron sputtering method and the μW glow discharge decomposition method.

Using a DC magnetron sputtering apparatus as shown in FIG. 8, a 300 nm thick light reflecting layer of Ag containing lead, gold, and first transition group metal and a light reflection multiplying layer were formed on a stainless substrate, as in Example 48, and then, as in Example 58, on the light reflection multiplying layer there were laminated a non-single crystal silicon type semiconductor layer composed of a first n-type layer, a first i-type layer, a first p-type layer, a second n-type layer, a second i-type layer, a second p-type layer, a third n-type layer, a third i-type layer and a third p-type layer, further followed by a transparent electrode and a collector electrode, wherein a tandem photovoltaic element of the triple cell type was fabricated (Element Example 60).

COMPARATIVE EXAMPLE 17

As in Comparative Experiment Example 5, a light reflecting layer not containing additive elements and a light reflection multiplying layer were formed on a stainless substrate, and then using a μW glow discharge decomposition apparatus, a non-single crystal silicon type semiconductor layer was laminated on the light reflecting layer, as in Example 58, and further a transparent electrode and a collector electrode were laminated in the same way and under the same conditions as in Example 58, whereby a tandem photovoltaic element was fabricated (Element Comparative Example 17).

To demonstrate the effect of the present invention on the solar cell characteristics of the photovoltaic elements as above fabricated in Examples 58 to 60 and Comparative Example 17, the same evaluation tests as in Example 1 were conducted. The results are listed in Table 38.

TABLE 38

| | Additive Element(s) | Initial Characteristic | After Adherence Test | After Environmental Test |
|---|---|---|---|---|
| Element Example 58 | Pb | 1.03 | 1.06 | 1.09 |
| Element Example 59 | Pb, Au | 1.06 | 1.09 | 1.09 |
| Element Example 60-1 | Pb, Au, Ni | 1.08 | 1.09 | 1.11 |
| Element Example 60-2 | Pb, Au, Cr | 1.09 | 1.11 | 1.13 |
| Element Example 60-3 | Pb, Au, Fe | 1.13 | 1.17 | 1.19 |
| Element Comparative Example 17 | None | 1.00 | 1.00 | 1.00 |

As is clear from Table 38, the photovoltaic elements of Examples 58 to 60 are more improved in the initial characteristics, the durability and the environment resistance than that of Comparative Example 17.

EXAMPLE 61

A photovoltaic element of the present invention was fabricated by electron beam (EB) vacuum vapor deposition, DC magnetron sputtering, and μW glow discharge decomposition.

Using an apparatus as shown in FIG. 12, a 300 nm thick light reflecting layer of Ag containing lead was formed on a stainless substrate by electron beam (EB) vacuum vapor deposition, as in Experiment Example 6-1, and a light reflection multiplying layer composed of zinc oxide (ZnO) was formed thereon by DC sputtering. Then, as in Example 58, on the light reflection multiplying layer there were laminated a non-single crystal silicon type semiconductor layer, a transparent electrode, and a collector electrode, whereby a photovoltaic element was fabricated (Element Example 61).

EXAMPLE 62

A photovoltaic element of the present invention was fabricated by electron beam (EB) vacuum vapor deposition, DC magnetron sputtering, and μW glow discharge decomposition.

Using an apparatus as shown in FIG. 12, a 300 nm thick light reflecting layer of Ag containing lead and gold was formed on a stainless substrate by electron beam (EB) vacuum vapor deposition, as in Experiment Example 6-2, and a light reflection multiplying layer composed of zinc oxide (ZnO) was formed thereon by DC sputtering.

Then, as in Example 58, on the light reflection multiplying layer there were laminated a non-single crystal silicon type semiconductor layer, a transparent electrode, and a collector electrode, whereby a photovoltaic element was fabricated (Element Example 62).

EXAMPLE 63

A photovoltaic element of the present invention was fabricated by electron beam (EB) vacuum vapor deposition, DC magnetron sputtering, and μW glow discharge decomposition.

Using an apparatus as shown in FIG. 12, a 300 nm thick light reflecting layer of Ag containing lead, gold, and a first transition group metal was formed on a stainless substrate by electron beam (EB) vacuum vapor deposition, as in Experiment Example 6-3, and a light reflection multiplying layer composed of zinc oxide (ZnO) was formed thereon by DC sputtering. Then, as in Example 58, on the light reflection multiplying layer there were laminated a non-single crystal silicon type semiconductor layer, a transparent electrode, and a collector electrode, whereby a photovoltaic element was fabricated (Element Example 63).

COMPARATIVE EXAMPLE 18

Using the apparatus of FIG. 12, a 300 nm thick light reflecting layer of Ag not containing additive elements and a 1 μm thick light reflection multiplying layer of zinc oxide (ZnO) were formed on a stainless substrate, as in Comparative Experiment Example 6. A photovoltaic element was fabricated in the same way for the other layers as in Example 58 (Element Comparative Example 18).

To demonstrate the effect of the present invention on the solar cell characteristics of the photovoltaic element as above fabricated in Examples 61 to 63 and Comparative Example 18, the same evaluation tests as in Example 1 were conducted. The results are listed in Table 39.

TABLE 38

| | Additive Element(s) | Initial Characteristic | After Adherence Test | After Environmental Test |
|---|---|---|---|---|
| Element Example 61 | Pb | 1.04 | 1.08 | 1.09 |
| Element Example 62 | Pb, Au | 1.05 | 1.11 | 1.13 |
| Element Example 63-1 | Pb, Au, Ni | 1.09 | 1.12 | 1.15 |
| Element Example 63-2 | Pb, Au, Cr | 1.10 | 1.14 | 1.16 |
| Element Example 63-3 | Pb, Au, Fe | 1.13 | 1.17 | 1.19 |
| Element Comparative Example 18 | None | 1.00 | 1.00 | 1.00 |

As is clear from Table 39, the photovoltaic elements of Examples 61 to 63 are more improved in the initial characteristic, as well as the durability and the environment resistance than that of Comparative Example 18.

EXAMPLE 64

A photovoltaic element of the present invention was fabricated by DC magnetron sputtering and μW glow discharge decomposition.

Using the DC magnetron sputtering apparatus as shown in FIG. 8, a 300 nm thick Ag light reflecting layer of textured structure containing lead was formed on a substrate 802 under the same conditions as those of Example 46, except that the temperature of the substrate 802 was held at 350° C. by heater 803. Then, as in Example 46, on the light reflecting layer there was deposited a 1 μm thick light reflection multiplying layer (ZnO), on which were further laminated a non-single crystal silicon type semiconductor layer, a transparent electrode, and a collector electrode by using the μW glow discharge apparatus as shown in FIG. 13, whereby a photovoltaic element was fabricated (Element Example 64).

EXAMPLE 65

A photovoltaic element of the present invention was fabricated by DC magnetron sputtering and μW glow discharge decomposition.

Using the DC magnetron sputtering apparatus as shown in FIG. 8, a 300 nm thick Ag light reflecting layer of textured structure containing lead and gold was formed on a substrate 802 under the same conditions as those of Example 47, except that the temperature of the substrate 802 was held at 350° C. by heater 803.

Then, as in Example 47, on the light reflecting layer there was deposited a 1 μm thick light reflection multiplying layer (ZnO), on which were further laminated a non-single crystal silicon type semiconductor layer, a transparent electrode, and a collector electrode by using the μW glow discharge decomposition apparatus as shown in FIG. 13, whereby a photovoltaic element was fabricated (Element Example 65).

EXAMPLE 66

A photovoltaic element of the present invention was fabricated by DC magnetron sputtering and μW glow discharge decomposition.

Using the DC magnetron sputtering apparatus as shown in FIG. 8, a 300 nm thick Ag light reflecting layer of textured structure containing lead, gold and a first transition group metal was formed on a substrate 802 under the same conditions as those of Example 48, except that the temperature of the substrate 802 was held at 350° C. by heater 803.

Then, as in Example 48, on the light reflecting layer there was deposited a 1 μm thick light reflection multiplying layer (ZnO), on which were further laminated a non-single crystal silicon type semiconductor layer, a transparent electrode, and a collector electrode by using the μW glow discharge decomposition apparatus as shown in FIG. 13, whereby a photovoltaic element was fabricated (Element Example 66).

COMPARATIVE EXAMPLE 19

A photovoltaic element of the present invention was fabricated by DC magnetron sputtering and μW glow discharge decomposition.

Using the DC magnetron sputtering apparatus as shown in FIG. 8, a 300 nm thick Ag light reflecting layer of textured structure not containing additive elements was formed on a substrate 802, as in Comparative Experiment Example 5, except that the temperature of the substrate 802 was held at 350° C. by heater 803. Thereafter, a photovoltaic element was fabricated in the same way as in Example 64 (Element Comparative Example 19).

To demonstrate the effect of the present invention on the solar cell characteristics of the photovoltaic elements as above fabricated in Examples 64 to 66 and Comparative Example 19, the same evaluation tests as in Example 1 were conducted. The results are listed in Table 40.

TABLE 40

| | Additive Element(s) | Initial Characteristic | After Adherence Test | After Environmental Test |
|---|---|---|---|---|
| Element Example 64 | Pb | 1.03 | 1.03 | 1.05 |
| Element Example 65 | Pb, Au | 1.05 | 1.06 | 1.09 |
| Element Example 66-1 | Pb, Au, Ni | 1.07 | 1.09 | 1.11 |
| Element Example 66-2 | Pb, Au, Cr | 1.09 | 1.11 | 1.13 |
| Element Example 66-3 | Pb, Au, Fe | 1.10 | 1.14 | 1.16 |
| Element Comparative Example 19 | None | 1.00 | 1.00 | 1.00 |

As is clear from Table 40, the photovoltaic elements of Examples 64 to 66 are more improved in the initial characteristics, the durability, and the environment resistance than that of Comparative Example 19.

According to the present invention, it is possible to provide a photovoltaic element with improved conversion efficiency by virtue of increased short-circuit current and decreased series resistance.

Also according to the present invention, it is possible to provide a photovoltaic element with better environmental resistance and durability because of the improved adherence between the conductive substrate and the light reflecting layer, and between the light reflecting layer and the light reflection multiplying layer.

Further, according to the present invention, it is possible to provide a photovoltaic element with enhanced durability due to less diffusion of metal of the light reflecting layer into the light reflection multiplying layer and the non-single crystal semiconductor layer.

In addition, according to the present invention, it is possible to provide a photovoltaic element having stable characteristics over time due to fewer changes in the substrate temperature when depositing the light reflecting layer and the non-single semiconductor layer, or due to reduced progress of crystal growth caused by the use of the photovoltaic element under environments of repeated high temperatures and humidities, after the light reflecting layer is deposited.

Further, according to the present invention, it is possible to provide a photovoltaic element which can be mass-produced with high yield.

What is claimed is:

1. A photovoltaic element comprising, in order, a light reflecting layer, a light reflection multiplying layer, a photoactive semiconductor layer comprising a laminate of a first conductivity type layer composed of a non-single crystal semiconductor material comprising at least silicon, an i-type layer, a second conductivity type layer opposite to the first conductivity type, and a transparent electrode, characterized in that said light reflecting layer comprises silver as the main constituent, and further contains at least one of oxygen, nitrogen, and carbon.

2. A photovoltaic element according to claim 1, characterized in that the total amount of oxygen, nitrogen, and carbon is from 0.1 to 1000 ppm.

3. A photovoltaic element according to claim 1, formed on a conductive substrate.

4. A photovoltaic element according to claim 1, characterized in that said first conductivity type layer has an n-type conductivity.

5. A photovoltaic element according to claim 1, characterized in that said photoactive semiconductor layer is a dual tandem structure composed of two said laminates of said first conductivity type layer composed of said non-single crystal semiconductor material comprising at least silicon, said i-type layer, and said second conductivity type layer opposite to the first conductivity type.

6. A photovoltaic element according to claim 1, characterized in that said photoactive semiconductor layer is a triple tandem structure composed of three said laminates of said first conductivity type layer composed on said non-single crystal semiconductor material comprising at least silicon, said i-type layer, and said second conductivity type layer opposite to the first conductivity type.

7. A photovoltaic element according to claim 1, characterized in that said light reflecting layer has a textured structure.

8. A photovoltaic element according to claim 1, characterized in that the thickness of said light reflecting layer is from 500 Å to 3 μm.

9. A photovoltaic element according to claim 1, characterized in that the crystal diameters of silver particles of said light reflecting layer are from 100 Å to 10 μm.

10. A photovoltaic element according to claim 1, characterized in that the material of said light reflection multiplying layer comprises ZnO, $SnO_2$, $In_2O_3$, ITO, $TiO_2$, CdO, $Cd_2SnO_4$, $Bi_2O_3$, $MoO_3$, or $Na_xWO_3$ (x=2 to 3).

11. A photovoltaic element according to claim 1, characterized in that the thickness of said light reflection multiplying layer is from 500 Å to 10 μm.

12. A photovoltaic element according to claim 1, characterized in that said non-crystal semiconductor material comprising at least silicon is an amorphous material.

13. A photovoltaic element according to claim 1, characterized in that said non-single crystal semiconductor material comprising at least silicon is a microcrystalline material.

14. A photovoltaic element according to claim 1, characterized in that said transparent electrode is composed of a tin oxide, an indium oxide, or an indium-tin oxide.

15. A photovoltaic element according to claim 1, characterized in that said transparent electrode is composed of (i) a tin oxide containing at least one of nitrogen and carbon, (ii) an indium oxide containing at least one of nitrogen and carbon, or (iii) an indium-tin oxide containing at least one nitrogen and carbon.

16. A photovoltaic element according to claim 1, characterized in that the thickness of said transparent electrode is from 500 to 3000 Å.

17. A photovoltaic element comprising, in order, a light reflecting layer, a light reflection multiplying layer, a photoactive semiconductor layer comprising a laminate of a first conductivity type layer composed of a non-single crystal semiconductor material comprising at least silicon, an i-type layer, a second conductivity type layer opposite to the first conductivity type, and a transparent electrode, characterized in that said light reflecting layer comprises copper as the main constituent, and further contains at least one of oxygen, nitrogen, and carbon.

18. A photovoltaic element according to claim 17, characterized in that the total amount of oxygen, nitrogen, and carbon is from 0.1 to 1000 ppm.

19. A photovoltaic element according to claim 17, formed on a conductive substrate.

20. A photovoltaic element according to claim 17, characterized in that said first conductivity type layer has an n-type conductivity.

21. A photovoltaic element according to claim 17, characterized in that said photoactive semiconductor layer is a dual tandem structure composed of two said laminates of said first conductivity type layer composed of said non-single crystal semiconductor material comprising at least silicon, said i-type layer, and said second conductivity type layer opposite to the first conductivity type.

22. A photovoltaic element according to claim 17, characterized in that said photoactive semiconductor layer is a triple tandem structure composed of three said laminates of said first conductivity type layer composed of said non-single crystal semiconductor material comprising at least silicon, said i-type layer, and said second conductivity type layer opposite to the first conductivity type.

23. A photovoltaic element according to claim 17, characterized in that said light reflecting layer has a textured structure.

24. A photovoltaic element according to claim 17, characterized in that the thickness of said light reflecting layer is from 500 Å to 3 μm.

25. A photovoltaic element according to claim 17, characterized in that the crystal diameters of silver particles of said light reflecting layer are from 100 Å to 10 μm.

26. A photovoltaic element according to claim 17, characterized in that the material of said light reflection multiplying layer comprises ZnO, $SnO_2$, $In_2O_3$, ITC, $TiO_2$, CdO, $Cd_2SnO_4$, $Bi_2O_3$, $MoO_3$, or $Na_xWO_3$ (x=2 to 3).

27. A photovoltaic element according to claim 17, characterized in that the thickness of said light reflection multiplying layer is from 500 Å to 10 μm.

28. A photovoltaic element according to claim 17, characterized in that said non-crystal semiconductor material comprising at least silicon is an amorphous material.

29. A photovoltaic element according to claim 17, characterized in that said non-single crystal semiconductor material comprising at least silicon is a microcrystalline material.

30. A photovoltaic element according to claim 17, characterized in that said transparent electrode is composed of a tin oxide, an indium oxide, or an indium-tin oxide.

31. A photovoltaic element according to claim 17, characterized in that said transparent electrode is composed of (i) a tin oxide containing at least one of nitrogen and carbon, (ii) an indium oxide containing at least one of nitrogen and carbon, or (iii) an indium-tin oxide containing at least one of nitrogen and carbon.

32. A photovoltaic element according to claim 17, characterized in that the thickness of said transparent electrode is from 500 to 3000 Å.

33. A photovoltaic element comprising, in order, a light reflecting layer, a light reflection multiplying layer, a photoactive semiconductor layer comprising a laminate of a first conductivity type layer composed of a non-single crystal semiconductor material comprising at least silicon, an i-type layer, a second conductivity type layer opposite to the first conductivity type, and a transparent electrode, characterized in that said light reflecting layer comprises silver as the main constituent, and further contains lead, lead and gold, or lead, gold, and a first transition group metal in an amount of 2 to 100 ppm.

34. A photovoltaic element according to claim 33, characterized in that said first transition group metal is one of iron, nickel and chromium.

35. A photovoltaic element according to claim 33, formed on a conductive substrate.

36. A photovoltaic element according to claim 33, characterized in that said first conductivity type layer has an n-type conductivity.

37. A photovoltaic element according to claim 33, characterized in that said photoactive semiconductor layer is a dual tandem structure composed of two said laminates of said first conductivity type layer composed of said non-single crystal semiconductor material comprising at least silicon, said i-type layer, and said second conductivity type layer opposite to the first conductivity type.

38. A photovoltaic element according to claim 33, characterized in that said photoactive semiconductor layer is a triple tandem structure composed of three said laminates of said first conductivity type layer composed of said non-single crystal semiconductor material comprising at least silicon, said i-type layer, and said second conductivity type layer opposite to the first conductivity type.

39. A photovoltaic element according to claim 33, characterized in that said light reflecting layer has a textured structure.

40. A photovoltaic element according to claim 33, characterized in that the thickness of said light reflecting layer is from 500 Å to 3 $\mu$m.

41. A photovoltaic element according to claim 33, characterized in that the crystal diameters of silver particles of said light reflecting layer are from 100 Å to 10 $\mu$m.

42. A photovoltaic element according to claim 33, characterized in that the material of said light reflection multiplying layer comprises ZnO, $SnO_2$, $In_2O_3$, ITO, $TiO_2$, CdO, $Cd_2SnO_4$, $Bi_2O_3$, $MoO_3$, or $Na_xWO_3 (x=2$ to 3).

43. A photovoltaic element according to claim 33, characterized in that the thickness of said light reflection multiplying layer is from 500 Å to 10 $\mu$m.

44. A photovoltaic element according to claim 33, characterized in that said non-crystal semiconductor material comprising at least silicon is an amorphous material.

45. A photovoltaic element according to claim 33, characterized in that said non-single crystal semiconductor material comprising at least silicon is a microcrystalline material.

46. A photovoltaic element according to claim 33, characterized in that said transparent electrode is composed of a tin oxide, an indium oxide, or an indium-tin oxide.

47. A photovoltaic element according to claim 33, characterized in that said transparent electrode is composed of (i) a tin oxide containing at least one of nitrogen and carbon, (ii) an indium oxide containing at least one of nitrogen and carbon, or (iii) an indium-tin oxide containing at least one of nitrogen and carbon.

48. A photovoltaic element according to claim 33, characterized in that the thickness of said transparent electrode is from 500 to 3000 Å.

* * * * *

UNITED STATES PATENT AND TRADEMARK OFFICE
CERTIFICATE OF CORRECTION

PATENT NO. : 5,401,330
DATED : March 28, 1995
INVENTOR(S) : KEISHI SAITO, ET AL.

It is certified that error appears in the above-identified patent and that said Letters Patent is hereby corrected as shown below:

ON THE TITLE PAGE

In [56] References Cited, "SOlar" in "Hirasaka et al.," should read --Solar--.

COLUMN 1

Line 28, "Also" should read --Also,--.

COLUMN 6

Line 35, "deposition-chamber" should read --deposition chamber--.

COLUMN 12

Line 67, "it" should read --if--.

COLUMN 16

Line 30, "the" (second occurrence) should be deleted.

COLUMN 17

Line 27, "polycarbonate," should read --polycarbonate toner,--.

UNITED STATES PATENT AND TRADEMARK OFFICE
CERTIFICATE OF CORRECTION

PATENT NO. : 5,401,330
DATED : March 28, 1995
INVENTOR(S) : KEISHI SAITO, ET AL.

It is certified that error appears in the above-identified patent and that said Letters Patent is hereby corrected as shown below:

COLUMN 31

Line 24, "Thereafter" should read --Thereafter,--.

COLUMN 32

Line 51, "a" should be deleted.

COLUMN 33

Line 35, "that" should read --than--.

COLUMN 34

Line 15, "magetron" should read --magnetron--.

COLUMN 35

Line 34, "there" should read --they--.

COLUMN 43

Line 57, "effect-of" should read --effect of--.

COLUMN 54

Line 17, "layers" should read --layer--.

UNITED STATES PATENT AND TRADEMARK OFFICE
CERTIFICATE OF CORRECTION

PATENT NO. : 5,401,330

DATED : March 28, 1995

INVENTOR(S) : KEISHI SAITO, ET AL.

Page 3 of 4

It is certified that error appears in the above-identified patent and that said Letters Patent is hereby corrected as shown below:

COLUMN 55

Line 10, "Example" should read --Example 4-1,--.

COLUMN 56

Line 66, "in as" should read --as in--.

COLUMN 62

Line 53, "it" should read --it is--.
Line 67, "are" (second occurrece) should be deleted.
Line 68, "listed" should be deleted.

COLUMN 63

Line 40, "that" should read --than--.
Line 43, "a" should read --an--.

COLUMN 69

Line 9, "cl" should be deleted.

COLUMN 75

Line 15, "on" should read --of--.

UNITED STATES PATENT AND TRADEMARK OFFICE
CERTIFICATE OF CORRECTION

PATENT NO. : 5,401,330
DATED : March 28, 1995
INVENTOR(S) : KEISHI SAITO, ET AL.

It is certified that error appears in the above-identified patent and that said Letters Patent is hereby corrected as shown below:

<u>COLUMN 76</u>

Line 37, "ITC," should read --ITO,--.

<u>COLUMN 77</u>

Line 10, "nickel" should read --nickel,--.

Signed and Sealed this

Eleventh Day of July, 1995

Attest:

BRUCE LEHMAN

Attesting Officer

Commissioner of Patents and Trademarks